United States Patent
Yang et al.

(10) Patent No.: US 6,982,793 B1
(45) Date of Patent: Jan. 3, 2006

(54) METHOD AND APPARATUS FOR USING AN ALIGNMENT TARGET WITH DESIGNED IN OFFSET

(75) Inventors: Weidong Yang, Milpitas, CA (US); Roger R. Lowe-Webb, Sunnyvale, CA (US); John D. Heaton, Fremont, CA (US); Guoguang Li, Fremont, CA (US)

(73) Assignee: Nanometrics Incorporated, Milpitas, CA (US)

( * ) Notice: Subject to any disclaimer, the term of this patent is extended or adjusted under 35 U.S.C. 154(b) by 434 days.

(21) Appl. No.: 10/116,863

(22) Filed: Apr. 4, 2002

(51) Int. Cl.
*G01B 11/27* (2006.01)

(52) U.S. Cl. .................................................. 356/401
(58) Field of Classification Search ......... 356/399–401, 356/614, 620; 250/548; 355/53, 55; 430/5, 430/22, 30
See application file for complete search history.

(56) References Cited

U.S. PATENT DOCUMENTS

| | | | |
|---|---|---|---|
| 4,141,780 A | 2/1979 | Kleinknecht et al. ........ | 156/626 |
| 4,172,664 A | 10/1979 | Charsky et al. ............. | 356/356 |
| 4,408,884 A | 10/1983 | Kleinknecht et al. ........ | 356/355 |
| 4,555,767 A | 11/1985 | Case et al. .................. | 364/563 |
| 4,593,368 A | 6/1986 | Fridge et al. ................ | 364/525 |
| 4,672,196 A | 6/1987 | Canino ....................... | 250/225 |
| 4,707,610 A | 11/1987 | Lindow et al. .............. | 250/560 |
| 4,748,335 A | 5/1988 | Lindow et al. .............. | 250/572 |
| 5,007,708 A | 4/1991 | Gaylord et al. ........... | 350/162.2 |
| 5,035,770 A | 7/1991 | Braun ......................... | 156/643 |

(Continued)

FOREIGN PATENT DOCUMENTS

| | | |
|---|---|---|
| EP | 0 402 191 A1 | 12/1990 |
| EP | 0 402 191 B1 | 12/1990 |
| EP | 0 601 580 A1 | 6/1994 |
| EP | 1 037 012 A1 | 9/2000 |
| JP | 0225038 | 12/1984 |

(Continued)

OTHER PUBLICATIONS

Bischoff, J. et al., "Light Diffraction Based Overlay Measurement" *Proceedings of SPIE*, vol. 4344 (2001) pp. 222–233.

(Continued)

*Primary Examiner*—Zandra V Smith
*Assistant Examiner*—Gordon J. Stock, Jr.
(74) *Attorney, Agent, or Firm*—Silicom Valley Patent Group LLP

(57) ABSTRACT

An alignment target includes periodic patterns on two elements. The alignment target includes two locations, at least one of which has a designed in offset. In one embodiment, both measurement locations have a designed in offset of the same magnitude but opposite directions. For example, two separate overlay patterns that are mirror images of each other may be used. Alternatively, the magnitudes and/or directions may vary between the measurement locations. The radiation that interacts with the measurement locations is compared. The calculated difference is extremely sensitive to any alignment error. If the difference between the patterns is approximately zero, the elements are properly aligned. When an alignment error is introduced, however, calculated difference can be used to determine the error. In one embodiment, the alignment target is modeled to determine the alignment error. In another embodiment, additional overlay patterns with additional reference offsets are used to determine the alignment error.

49 Claims, 26 Drawing Sheets

U.S. PATENT DOCUMENTS

| | | | |
|---|---|---|---|
| 5,042,949 A | 8/1991 | Greenberg et al. | 356/345 |
| 5,042,951 A | 8/1991 | Gold et al. | 356/369 |
| 5,045,704 A | 9/1991 | Coates | 250/372 |
| 5,164,790 A | 11/1992 | McNeil et al. | 356/355 |
| 5,191,216 A | 3/1993 | Henderson et al. | 257/28 |
| 5,214,492 A | 5/1993 | LoBianco et al. | 356/400 |
| 5,216,257 A | 6/1993 | Brueck et al. | 250/548 |
| 5,216,680 A | 6/1993 | Magnusson et al. | 372/20 |
| 5,307,152 A | 4/1994 | Boehnlein et al. | 356/376 |
| 5,337,146 A | 8/1994 | Azzam | 356/367 |
| 5,349,440 A | 9/1994 | DeGroot | 356/349 |
| RE34,783 E | 11/1994 | Coates | 250/372 |
| 5,363,171 A | 11/1994 | Mack | 355/68 |
| 5,555,474 A | 9/1996 | Ledger | 356/381 |
| 5,559,601 A | 9/1996 | Gallatin et al. | 356/363 |
| 5,596,406 A | 1/1997 | Rosenewaig et al. | 356/327 |
| 5,607,800 A | 3/1997 | Ziger | 430/8 |
| 5,646,730 A | 7/1997 | Mitchell et al. | 356/356 |
| 5,739,909 A | 4/1998 | Blayo et al. | 356/369 |
| 5,747,813 A | 5/1998 | Norton et al. | 250/372 |
| 5,805,290 A | 9/1998 | Ausschnitt et al. | 356/401 |
| 5,808,742 A * | 9/1998 | Everett et al. | 356/509 |
| 5,841,139 A | 11/1998 | Sostek et al. | 250/339.12 |
| 5,867,276 A | 2/1999 | McNeil et al. | 356/445 |
| 5,880,838 A | 3/1999 | Marx et al. | 356/351 |
| 5,889,593 A | 3/1999 | Bareket | 356/445 |
| 5,900,633 A | 5/1999 | Solomon et al. | 250/339.08 |
| 5,963,329 A | 10/1999 | Conrad et al. | 356/372 |
| 5,969,819 A | 10/1999 | Wang | 356/371 |
| 6,031,614 A | 2/2000 | Michaelis et al. | 356/369 |
| 6,077,756 A | 6/2000 | Lin et al. | 438/401 |
| 6,084,712 A | 7/2000 | Harding | 359/618 |
| 6,097,488 A | 8/2000 | Grek et al. | 356/364 |
| 6,100,985 A | 8/2000 | Scheiner et al. | 356/381 |
| 6,130,750 A | 10/2000 | Ausschnitt et al. | 356/401 |
| 6,281,974 B1 | 8/2001 | Scheiner et al. | 356/381 |
| 6,366,861 B1 | 4/2002 | Waldhauer et al. | 702/35 |
| 6,407,396 B1 | 6/2002 | Mih et al. | 250/491.1 |
| 6,429,930 B1 | 8/2002 | Littau et al. | 356/124 |
| 6,429,943 B1 | 8/2002 | Opsal et al. | 356/625 |
| 6,433,878 B1 | 8/2002 | Niu et al. | 356/603 |
| 6,458,605 B1 | 10/2002 | Stirton | 438/7 |
| 6,476,920 B1 | 11/2002 | Scheiner et al. | 356/630 |
| 6,483,580 B1 | 11/2002 | Xu et al. | 356/300 |
| 6,556,947 B1 | 4/2003 | Scheiner et al. | 702/172 |
| 6,710,876 B1 * | 3/2004 | Nikoonahad et al. | 356/401 |
| 2002/0018217 A1 | 2/2002 | Weber-Grabau et al. | 356/601 |
| 2002/0024669 A1 | 2/2002 | Danner et al. | 356/369 |
| 2002/0033945 A1 | 3/2002 | Xu et al. | 356/369 |
| 2002/0033954 A1 | 3/2002 | Niu et al. | 356/601 |
| 2002/0035455 A1 | 3/2002 | Niu et al. | 703/4 |
| 2002/0038196 A1 | 3/2002 | Johnson et al. | 702/179 |
| 2002/0051564 A1 | 5/2002 | Benesh et al. | 382/145 |
| 2002/0105646 A1 | 8/2002 | Zhao et al. | 356/369 |
| 2002/0113966 A1 | 8/2002 | Shchegrov et al. | 356/369 |
| 2002/0135875 A1 | 9/2002 | Niu et al. | 359/564 |
| 2002/0149782 A1 | 10/2002 | Raymond | 356/616 |
| 2002/0158193 A1 | 10/2002 | Sezginer et al. | 250/237 |
| 2003/0002043 A1 | 1/2003 | Abdulhalim et al. | 356/400 |
| 2003/0020912 A1 | 1/2003 | Norton et al. | 356/369 |
| 2003/0042579 A1 | 3/2003 | Schulz | 257/629 |
| 2003/0043372 A1 | 3/2003 | Schulz | 356/369 |
| 2003/0043375 A1 | 3/2003 | Opsal | 356/369 |
| 2003/0044702 A1 | 3/2003 | Schulz | 430/30 |
| 2003/0160163 A1 | 8/2003 | Wong et al. | 250/237 |
| 2003/0169423 A1 | 9/2003 | Finarov et al. | 250/237 |
| 2003/0212525 A1 * | 11/2003 | Bischoff et al. | 702/127 |
| 2003/0223630 A1 | 12/2003 | Adel et al. | 382/145 |

FOREIGN PATENT DOCUMENTS

| | | |
|---|---|---|
| JP | 11-211421 | 8/1999 |
| JP | 11-211422 | 8/1999 |
| SU | 1747877 A1 | 7/1992 |
| WO | WO 99/45340 | 9/1999 |
| WO | WO 01/84382 A1 | 11/2001 |
| WO | WO 02/25723 A2 | 3/2002 |
| WO | WO 02/27288 A1 | 4/2002 |
| WO | WO 02/50501 A1 | 6/2002 |
| WO | WO 02/065545 A2 | 8/2002 |
| WO | WO 02/069390 A2 | 9/2002 |
| WO | WO 02/079760 A2 | 10/2002 |
| WO | WO 02/084213 A1 | 10/2002 |
| WO | WO 03/071471 A1 | 8/2003 |
| WO | WO 04/008068 A1 | 7/2004 |

OTHER PUBLICATIONS

Michaelis, A. et al., "Spectroscopic Anistropy Micro–Ellipsometry (SAME) for determiation of lateral and vertical dimensions of sub–micron lithographic structures" IEEE Catalog No. 99TH8453 (1999) pp. 131–134.

NanoWave:Technology/development tools, http://www.nanowave.com/technology_applications/tech_devtoolsPR.html, 2 pages, downloaded Apr. 9, 2002.

NanoWave:Technology/how it works, http://www.nanowave.com/technology_applications/tech_HIWPR.html, 3 pages, downloaded Apr. 9, 2002.

NanoWave:Technology/product design, http://www.nanowave.com/technology_applications/tech_designPR.html, 4 pages, downloaded Apr. 9, 2002.

"A Diffraction Grating Analysis Tool" downloaded May 7, 2001 from <http://www.gsolver.com/gsprod.html>, Grating Solve Development Co. (1999).

Ahmed, S., et al., "Comparison of beam propagation method and rigorous coupled–wave analysis for single and multiplexed volume gratings", Applied Optics, vol. 35, No. 22, Aug. 1, 1996, pp. 4426–4435.

Allgair, J. et al., "Implementation of Spectroscopic Critical Dimension (SCDTM) for the Gate CD Control and Stepper Characterization", *Proceedings of SPIE,* vol. 4344 (2001), pp. 462–471.

Azzam, R. et al., "Ellipsometry And Polarized Light" *Elsevier Science Publishers* (1977, 1987) pp. 476–481.

Bao, G. et al., "Mathematical studies in rigorous grating theory", *J. Opt. Soc. Am. A,* vol. 12, No. 5 (1995), pp. 1029–1042.

Bao, G. et al., "Modeling and Optimal Design of Diffractive Optical Structures", pp. 1–27. (The correct site is Survey on Industrial Math. 8 (1988), 37–62).

Benson, T. et al., "In–situ Spectroscopic Reflectometry for Polycrystalline Silicon Thin Film Etch Rate Determination During Reactive Ion Etching", Dept. of Electrical Engineering & Computer Science an the Center for Display Technology & Manfuacturing, University of Michigan, pp. 1–34.

Bischoff J. et al., "Modeling of optical scatterometry with finite–number–of–periods gratings", *SPIE* vol. 3743 (1999) pp. 41–46.

Bischoff, J. et al., "Single feature metrology by means of light scatter analysis", *SPIE* vol. 3050 (1997) pp. 574–589.

Bishop, K. P. et al., "Grating line shape characterization using scatterometry", *SPIE,* vol. 1545 (1991) pp. 64–73.

Bishop, K. P. et al., "Use of scatterometry for resist process control", *Proc. SPIE—Int. Soc. Opt. Eng.,* vol. 1673 (1992) pp. 441–452.

Bosenberg, W. et al., "Linewidth Measurement on IC Wafers by Diffraction from Grating Test Patterns", *Solid State Technology*, vol. 26, No. 7 (1983) pp. 79–85.

Brauer, R. et al., "Electromagnetic diffraction analysis of two-dimensional gratings", Optics Communications, vol. 100 (1993) pp. 1–5.

Chang, N. Y., et al., "Algorithm based on rigorous coupled-wave analysis for diffractive optical element design", J. Opt. Soc. Am. A, Opt. Image Sci. Vis. (USA), vol. 18, No. 10, Oct. 2001, pp. 2491–2501.

Chateau, N. et al., "Algorithm for the rigorous coupled-wave analysis of grating diffraction," *J. Opt. Soc. Am.* A, vol. 11 (1994), pp. 1321–1331.

Corle, T., et al., "Polarization–enhanced imaging of photoresist gratings in the real–time scanning optical microscope", *Applied Optics*, vol. 33, No. 4 (1994) pp. 670–677.

Coulombe, S. A. et al., "Modal characteristics of short–pitch photoresist gratings exhibiting zero–order diffraction anomalies", *J. Opt. Soc. Am. A*, vol. 16, No. 12 (Dec. 1999), pp. 2904–2913.

Coulombe, S. A. et al., "Scatterometry measurement of sub-0.1 $\mu$m linewidth gratings", *J. Vac. Sci. Technol.. B*, vol. 16, No. 1 (1998) pp. 80–87.

Coulombe, S. et al., "Ellipsometric–Scatterometry for sub–01. mm CD measurements" *SPIE* vol. 3332 (1988) pp. 282–292.

Damar, H. et al., "Diffraction Characterization for Process Monitoring, Linewidth Measurement and Alignment" *SPIE* vol. 470 (1984) pp. 157–163.

Davidson, M. et al., "A comparison between rigorous light scattering methods", SPIE vol. 3051 (1997) pp. 606–619.

Dong Hoon Lee, et al., "Analysis of topological effects of phase–shifting mask by boundary element method", J. Inst. Electron. Eng. Korea D (South Korea), vol. 36–D, No. 11, Nov. 1999, pp. 33–44.

Galarza, C. et al., "Real–time Estimation of Patterned Wafer Parameters Using In Situ Spectroscopic Ellipsometry", *Proceedings of the IEEE* (1999) pp. 773–778.

Gaspar, S. M. et al., "Laser scatterometry for process characterization", *AIP Conference Proceedings*, vol. 227, No. 1, (1991) pp. 54–55.

Gaylord, T. et al., "Analysis and Applications of Optical Diffraction by Gratings," *Proceedings of the IEEE*, vol. 73, (1984), pp. 894–937 (1985).

Glytsis, E. et al., "Rigorous Coupled–Wave Analysis And Applications Of Gratings Diffraction", *Critical Reviews Of Optical Science and Technology*, vol. CR49 (1993), pp. 1–31.

Glytsis, E. et al., "Three–dimensional (vector) rigorous coupled–wave analysis of anisotropic grating diffraction", *J. Opt. Soc. Am. A*, vol. 7, No. 8 (1990), pp. 1399–1420.

Glytsis, E. N. et al., "Review of rigorous coupled–wave analysis and of homogeneous effective medium approximations for high spatial–frequency surface–relief", In NASA. Marshall Space Flight Center, Conference on Binary Optics: An Opportunity for Technical Exchange Feb. 23–15, 1993, p 61–76.

Han, Chang–Wook, et al., "Rigorous coupled–wave analysis of antireflective surface–relief gratings" J. Opt. Soc. Korea (South Korea) vol. 1, No. 1, Mar. 1997, pp. 26–35.

Han, S. et al., "Electromagnetic scattering of two–dimensional surface–relief dielectric grating", *Applied Optics*, vol. 31 (1992) pp. 2343–2352.

Hatab, Ziad R. et al., "Sixteen–megabit dynamic random access memory trench depth characterization using two–dimensional diffraction analysis", *J. Vac. Sci. Technol. B*, vol. 13, No. 2 (1995) pp. 174–182.

Hauge, P., "Recent Developments in Instrumentation in Ellipsometry", Surface Science 96, (1980) pp. 108–140.

Haverlag, M. et al., "In situ ellipsometry and reflectometry during etching of patterned surfaces: Experiments and simulations", *Journal of Vacuum Science & Technology B*, vol. 10, No 6 (1992) pp. 2412–2418.

Heimann, P. et al., "Optical Etch–Rate Monitoring: Computer Simulation of Reflectance", *Journal Electrochem. Soc.*, vol. 131, No. 4 (1984) pp. 881–885.

Henderson, G. N., "Semiconductor quantum electron wave transport, diffraction, and interference: analysis, device, and measurement", Dissertation Georgia Institute Of Technology, vol. 54–10B, 1993, pp. 5312 209 page(s).

Hickman, K. C. et al., "Use of diffracted light from latent images to improve lithography control", *J. Vac. Sci. & Tech. B*, vol. 10, No. 5 (1992) pp. 2259–2266.

Huang, H. et al., "Normal–incidence spectroscopic ellipsometry for critical dimension monitoring", *Applied Physics Letters*, vol. 78 (2001) pp. 3983–3985.

Jarem, J. M., "Rigorous coupled wave analysis of radially and azimuthally–inhom– ogeneous, elliptical, cylindrical systems" (Abstract), J. Electromagn. Waves Appl. (Netherlands), vol. 15, No. 10, 2001, pp. 1367–1368.

Jarem, J. M., et al., "Rigorous coupled–wave analysis of photorefractive reflection gratings", J. Opt. Soc. Am. B, Opt. Phys. (USA) vol. 15, No. 7, Jul. 1998, pp. 2099–2106.

Jarem, J.M. "A rigorous coupled–wave analysis and crossed–diffraction grating analysis of radiation and scattering from three–dimensional inhomogeneous objects" IEEE Transactions on Antennas and Propagation, vol. 46, No. 5, May 1998, p. 740, 741.

Jiang Yongyuan, et al., Rigorous coupled wave analysis of dynamic diffraction properties of photorefractive phase grating Acta Photonica Sin. (China) vol. 29, No. 3, Mar. 2000, pp. 216–222.

Jiang Yongyuan, et al., "Rigorous coupled wave analysis of dynamic property of photorefractive anisotropic self–diffraction" Acta Photonica Sin. (China), vol. 29, No. 9, Sep. 2000, pp. 787–790.

Kamiya, N., "Rigorous coupled–wave analysis for practical planar dielectric gratings. 2. Diffraction by a surface–eroded hologram layer" Appl. Opt. (USA) vol. 37, No. 25, Sep. 1, 1998, pp. 5854–5863.

Kamiya, N., "Rigorous coupled–wave analysis for practical planar dielectric gratings. 3. Increase of higher–order lights owing to degenerated complex diffraction" Appl. Opt. (USA), vol. 37, No. 25, Sep. 1, 1998, pp. 5864–5878.

Kamiya, N., "Rigorous coupled–wave analysis for practical planar dielectric gratings. I. Thickness–changed holograms and some characteristics of diffraction efficiency", Appl. Opt. (USA) vol. 37, No. 25, Sep. 1, 1998, pp. 5843–5853.

Kleinknecht, H. et al., "Linewidth measurement on IC masks and wafers by grating test patterns", *Applied Optics*, vol. 19, No. 4 (1980) pp. 525–533.

Kong, W. et al., "A Hybrid Analysis Ellipsometry Data from Patterned Structures" *Characterization and Metrology for ULSI Technology: 2000 International Conference*, pp. 373–377 (2001).

Kong, W. et al., "Analysis of Time–Evolved Spectroscopic Ellipsometry Data from Patterned Structures for Etching Process Monitoring and Control", Dept. of Electrical Engineering and Computer Science, University of Michigan, Four pages.

Kong, W., "Analysis of Spectroscopic Ellipsometry from Patterned Structures for Etching Process Monitoring and Control", Dissertation University of Michigan, 2001, 141 page(s).

Konstastantinos P. et al., "Use of Light Scattering in Characterizing Reactively Ion Etched Profiles", ATT&T Bell Laboratories, Murray Hill, NJ 07974, Page No. and date unavailable; Also cited in NAN007 RX as Giapis, K. et al., "Use of Light Scattering in Characterizing Reactively Ion Etched Profiles", J. Vac. Sci. Technol. A, vol. 9 (1981), pp. 664–668.

Krukar, R. et al., Overlay and Grating Line Shape Metrology Using Optical Scatterometry (unclassifed) DARPA I 1993 Final Report, (Oct. 11, 1993) Thirty–six pages.

Krukar, R. et al., "Reactive ion etching profile and depth characterization using statistical and neural network analysis of light scattering data", *J. Appl. Phys.*, vol. 74, No 6 (1993) pp. 3698–3706.

Krukar, R. H. et al., "Analyzing simulated and measured optical scatter for semiconductor process verification", *Proc. SPIE—Int. Soc. Opt. Eng.*, vol. 1907 (1993) pp. 238–249.

Krukar, R. H. et al., "Using scattered light modeling for semiconductor critical dimension metrology and calibration", *Proc. SPIE—Int. Soc. Opt. Eng.*, vol. 1926 (1993) pp. 60–71.

Krukar, R. H. et al., "Wafer examination and critical dimension estimation using scattered light" *Proc. SPIE—Int. Soc. Opt. Eng.*, vol. 1661 (1992) pp. 323–332.

Lee, M. et al., "Analysis of Reflectometry and Ellipsometry Data from Patterned Structures", *Characterization and Metrology for ULSI Technology*, (1998) pp. 331–334.

Lee, S. G., et al., "More stable algorithm for rigorous coupled wave analysis applied to topography simulation in optical lithography and its numerical implementation", Proc. SPIE—Int. Soc. Opt. Eng. (USA), vol. 2726, 1996, pp. 288–298.

Lochbihler, H. et al., "Characterization of highly conducting wire gratings using an electromagnetic theory of diffraction" *Optics Communications* 100 (1993) pp. 231–239.

Lochbihler, H. et al., "Characterization of x–ray transmission gratings" *Applied Optics*, vol. 31 (1992) pp. 964–971.

Logofatu, P. C. et al. "Identity of the cross–reflection coefficients for symmetric surface–relief gratings", *J. Opt. Soc. Am. A, Opt.* vol. 16 No. 5 (May 1999) pp. 1108–1114.

Logofatu, P. C. et al. "Measurement precision of optical scatterometry", *Proceedings of SPIE*, vol. 4344 (2001), pp. 447–453.

Logofatu, P. C. et al. "Scatterometry: a metrology for subwavelength surface relief gratings", *Proceedings of SPIE*, vol. 4344 (2001), pp. 472–483.

Logofatu, P. C. et al., "Sensitivity analysis of fitting for scatterometry", *Proc. SPIE—Int. Soc. Opt. Eng.*, vol. 3677 (1999) pp. 177–183.

Logofatu, P.C., "Sensitivity–optimized scatterometry", Dissertation The University of New Mexico, vol. 61–11B, 2000, pp. 5942 181 page(s).

Lopez, A. G. "Reformulation of the rigorous coupled–wave analysis (RCWA) equations: Photonic crystals applications" Dissertation, Cornell University, vol. 61–04B, 2000, pp. 2113 136 pages.

Marx, D. et al., "Polarization quadrature measurement of subwavelength diffracting structures", *Applied Optics*, vol. 36, No. 25 (1997), pp. 6434–6440.

McNeil, J. R. "Application of optical scatterometry to microelectronics processing", *Technical Digest. Summaries of Papers Presented at the Conference on Lasers and Electro–Optics.*, vol. 6 (1998) pp. 348–349.

McNeil, J. R. et al., "Scatterometry applied to microelectronics processing", *Solid State Technol.*, vol. 36, No. 3 (1993) pp. 29–30.

McNeil, J. R., et al., "Scatterometry applied to microelectronics processing" *Solid State Technol.* vol. 36, No. 4 (1993) pp. 53–56.

McNeil, J. R., "Instrumentation to Enhance Optical Scatterometry for Semiconductor Metrology Development", Final Rept. Sep. 1, 1993–Feb. 28, 1998, Contract No. F49620–93–1–0512, Defense Technical Information Center (DTIC) order No.– AD–A354–189 (1998) (23 pages).

McNeill, J. et al., "Scatterometry Applied to Microelectronics Processing" *Microlithography World* (1992) pp. 16–22.

Mills, D. et al., "Spectral ellipsometry on patterned wafers," *SPIE*, vol. 2637 (1995) pp. 194–203.

Milner, L. M. et a., "Latent image exposure monitor using scatterometry", *SPIE Proceedings*, vol. 1673 (1992), 10 pages.

Milner, L. M. et al., "Lithography process monitor using light diffracted from a latent image", *Proc. SPIE—Int. Soc. Opt. Eng.*, vol. 1926 (1993) pp. 94–105.

Minhas, B. K. et al., "Ellipsometric scatterometry for the metrology of sub–0.1– $\mu$m–linewidth structures", *Applied Optics*, vol. 37 No. 22 (Aug., 1998) pp. 5112–5115.

Minhas, B. K. et al., "Towards sub–0.1 mu m CD measurement using scatterometry", *Proc. SPIE—Int. Soc. Opt. Eng.*, vol. 2725 (1996) pp. 729–739.

Moharam, M. et al., "Diffraction analysis of dielectric surface–relief gratings", *J. Opt. Soc. Am.*, vol. 72 (1982) pp. 1385–1392.

Moharam, M. et al., "Diffraction characteristics of photoresist surface–relief gratings" *Applied Optics*, vol. 23 (1984) pp. 3214–3220.

Moharam, M. et al., "Formulation for stable and efficient implementation of the rigorous coupled–wave analysis of binary gratings", *J. Opt. Soc. Am.*, vol. 12 (1995) pp. 1068–1076.

Moharam, M. et al., "Rigorous coupled–wave analysis of planar–grating diffraction", *J. Opt. Soc. Am.*, vol. 71, No. 7 (1981) pp. 811–818.

Moharam, M. et al., "Stable implementation of the rigorous coupled–wave analysis for surface–relief gratings: enhanced transmittance matrix approach", *J. Opt. Soc Am.*, vol. 12 (1995) pp. 1077–1086.

Moharam, M. et al., "Three–dimensional vector coupled–wave analysis of planar–grating diffraction", *J. Opt. Soc. Am.*, vol. 73, No. 9 (1983), pp. 1105–1112.

Moharam, M., "Coupled–Wave Analysis of Two–Dimensional Dielectric Gratings", *SPIE* vol. 883 (1988) pp. 8–11.

Moharam, M.G. et.al, "Rigorous Coupled–Wave Analysis of Grating Diffraction– E–mode polarization and losses", Jnl. of the Optical Society of America, vol. 73, No. 4, Apr. 83, p451–455.

Moharam, M.G. et.al, "Rigorous coupled–wave analysis of metallic surface–relief gratings" Optical Society of America, Journal, A: Optics and Image Science Optical Society of America, Journal, A: Optics and Image Science, vol. 3, Nov. 1986, p. 1780–1787.

Murnane, M. R. et al., "Scatterometry for 0.24–0.70 μm developed photoresist metrology", *SPIE*, vol. 2439 (1995) pp. 427–436.

Murnane, M. R. et al., "Subwavelength photoresist grating metrology using scatterometry", *Proc. SPIE—Int. Soc. Opt. Eng.*, vol. 2532 (1995) pp. 251–261.

Nakagawa, W., et al., "Analysis of near–field effects in artificial dielectric structures using rigorous coupled–wave analysis", Conference Proceedings—Lasers and Electro–Optics Society Annual Meeting–LEOS, vol. 2, 1999, p 495–496.

Nakagawa, W., et al., "Ultrashort pulse propagation in near–field periodic diffractive structures by use of rigorous coupled–wave analysis", J. Opt. Soc. Am. A, Opt. Image Sci. Vis. (USA), vol. 18, No. 5, May 2001, pp. 1072–1081.

Naqvi, S. S. H. et al., "Etch depth estimation of large–period silicon gratings with multivariate calibration of rigorously simulated diffraction profiles", *J. Opt. Soc. Am. A,* vol. 11, No. 9 (1994) pp. 2485–2493.

Naqvi, S. S. H., et al., "Optical scatterometry for process metrology", *Optical metrology; Proceedings of the Conference*, (Jul. 1999) pp. 129–144.

Niu, X., et al., "Specular Spectroscopic Scatterometry", IEEE Transactions on Semiconductor Manufacturing, vol. 14, No. 2, May 2001, pp. 97–111.

Peng, Song, et al., "Efficient and stable implementation of rigorous coupled–wave analysis for surface–relief gratings", Proc. SPIE—Int. Soc. Opt. Eng. (USA), vol. 2532, 1995, pp. 475–480.

Peng, Song, et al., "Efficient implementation of rigorous coupled–wave analysis for surface–relief gratings", Journal of the Optical Society of America A: Optics and Image Science, and Vision, vol. 12, No. 5, May 1996–1997 1996.

Press, W. et al., "Numerical Recipes: The Art of Scientific Computing,", *Cambridge University Press,* Section 14.4 (1986), pp. 521–528.

Prins, S. L. et al., "Scatterometric sensor for PEB process control", *Proc. SPIE—Int. Soc. Opt. Eng.*, vol. 2725 (1996) pp. 710–719.

Raymond, C. et al., "Metrology of subwavelength photoresist gratings using optical scatterometry" *J. Vac. Sci. Technology.* B 13 (1995) pp. 1484–1495.

Raymond, C. et al., "Resist and etched line profile characterization using scatterometry" SPIE vol. 3050 (1977) 476–486.

Raymond, C. et al., "Scatterometry for the measurement of metal features" *Proceedings of SPIE* vol. 2998 (2000) pp. 135–146.

Raymond, C. J. et al., "Multiparameter CD measurements using scatterometry", *Proc. SPIE—Int. Soc. Opt. Eng.*, vol. 2725 (1996) pp. 698–709.

Raymond, C. J. et al., "Multiparameter grating metrology using optical scatterometry" *J. of Vac. Sci. Tech. B,* vol. 15, No. 2 (1997) pp. 361–368.

Raymond, C. J. et al., "Multi–parameter process metrology using scatterometry", *Proc. SPIE—Int. Soc. Opt. Eng.*, vol. 2638 (1995) pp. 84–93.

Raymond, C. J. et al., "Resist and Etched line profile characterization using scatterometry", *Proc. SPIE—Int. Soc. Opt. Eng.*, vol. 3050 (1997) pp. 476–486.

Raymond, C. J. et al., "Scatterometry for CD measurements of etched structures", *Proc. SPIE—Int. Soc. Opt. Eng.*, vol. 2725 (1996) pp. 720–728.

Sohail, S. "A simple technique for linewidth measurement of gratings on photomasks", *Proc. SPIE—Int. Soc. Opt. Eng.*, vol. 1261 (1990) pp. 495–504.

Sohail, S. et al. "Grating parameter estimation using scatterometry" *Proc. SPIE—Int.Soc. Opt. Eng.*, vol. 1992 (1993) pp. 170–180.

Sohail, S. et al., "Diffractive techniques for lithographic process monitoring and control",*J. Vac. Sci. Technol. B,* vol. 12, No. 6 (1994) pp. 3600–3606.

Sohail, S. et al., "Linewidth measurement of gratings on photomasks: a simple technique", *Applied Optics,* vol. 31, No. 10 (1992) pp. 1377–1384.

Stover, J. C., et al., "Modeled and measured scatter from vias", SPIE Conf on Surface Characterization of Computer Disks, Wafers, and Flat Panel Displays, Jan. 1999, pp, 65–71.

Sun, J. et al., "Profile Measurement on IC Wafers by Holographic Interference", *SPIE* vol. 673 (1986) pp. 135–143.

Tadros, K., "Understanding metrology of polysilicon gates through reflectance measurements and simulation", *SPIE* vol. 1464 (1991) pp. 177–186.

Tu, K. et al., "Multiple–scattering theory of wave diffraction by superposed volume gratings",*J. Opt. Soc. Am. A.,* vol. 7, No. 8 (1990), pp. 1421–1435.

Wilson, S. M. G. et al., "Phase shift mask metrology using scatterometry", *Proc. SPIE—Int. Soc. Opt. Eng.*, vol. 2322 (1994) pp. 305–315.

Yeung, M., et al., "Electromagnetic Scatterometry Applied to In Situ Metrology", *Proceedings of SPIE,* vol. 4344 (2001), pp. 484–495.

Ziger, D. et al., "Linesize effects on ultraviolet reflectance spectra", *Society of Photo–Optical Instrumentation Engineers* (1997), Paper 37046.

Zylberberg, Z. et al., "Rigorous coupled–wave analysis of pure reflection gratings" Optical Society of America, Journal, vol. 73, Mar. 1983, p. 392–398.

* cited by examiner

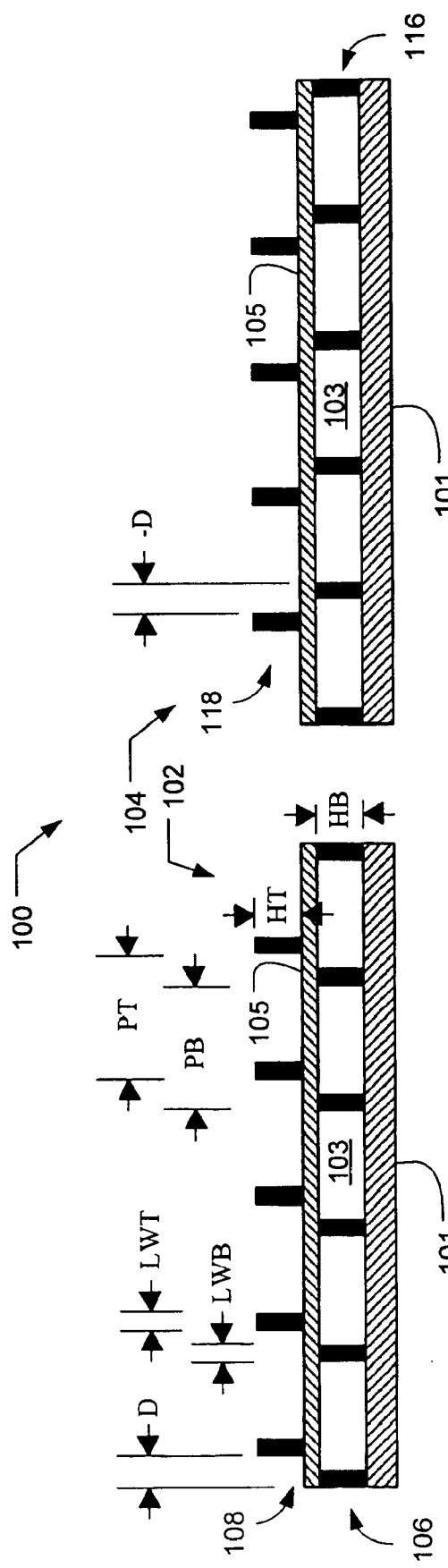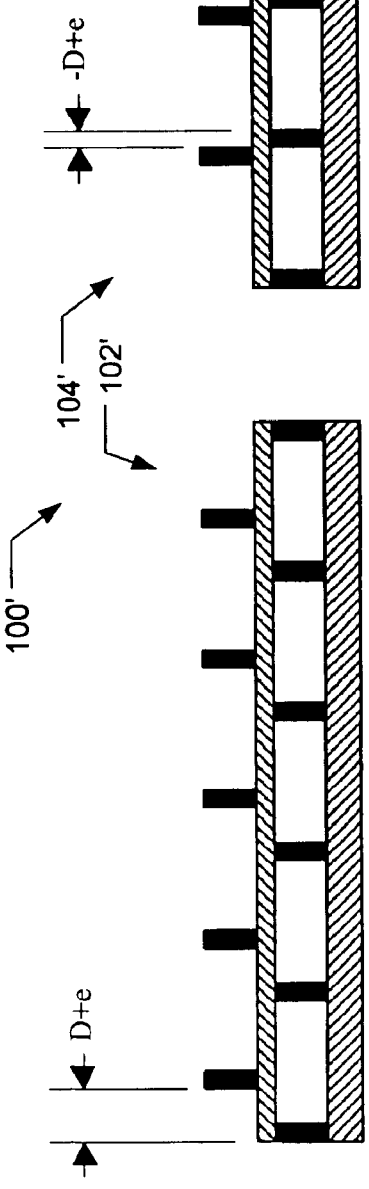

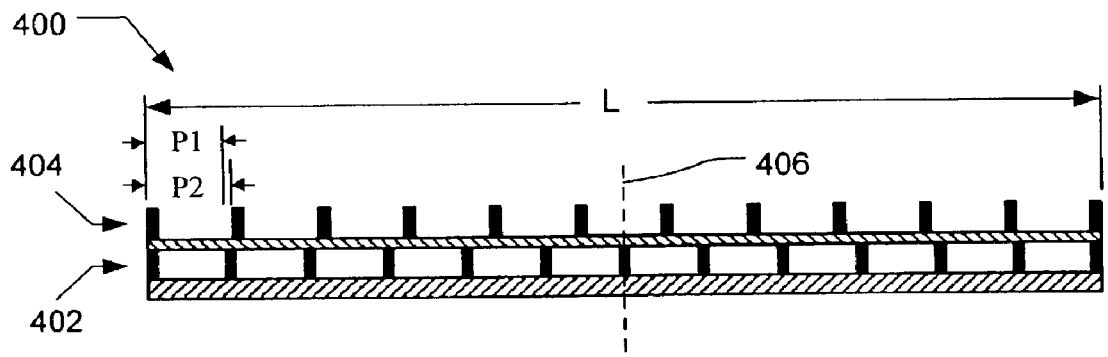
Fig.19
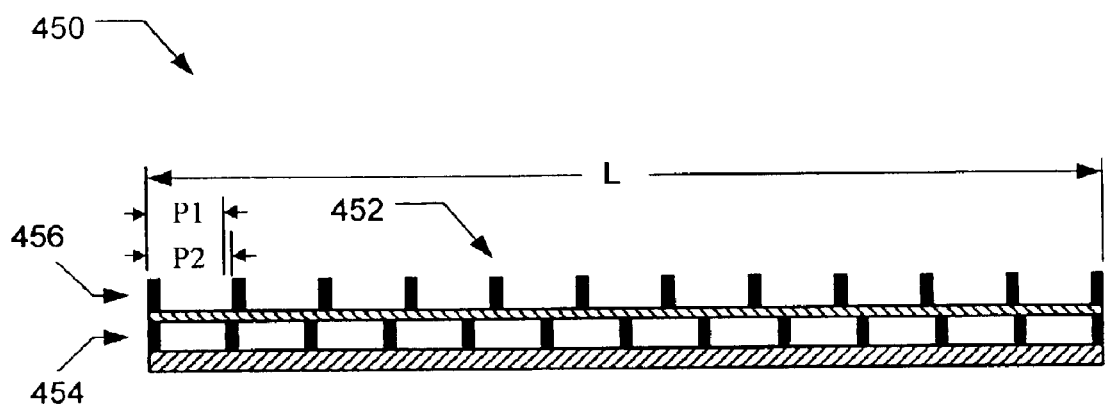
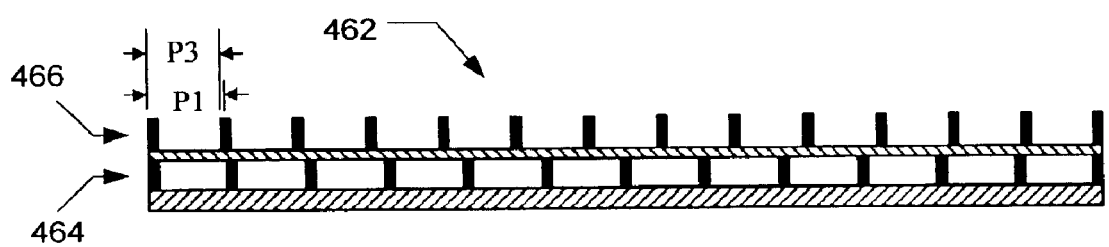
Fig. 20

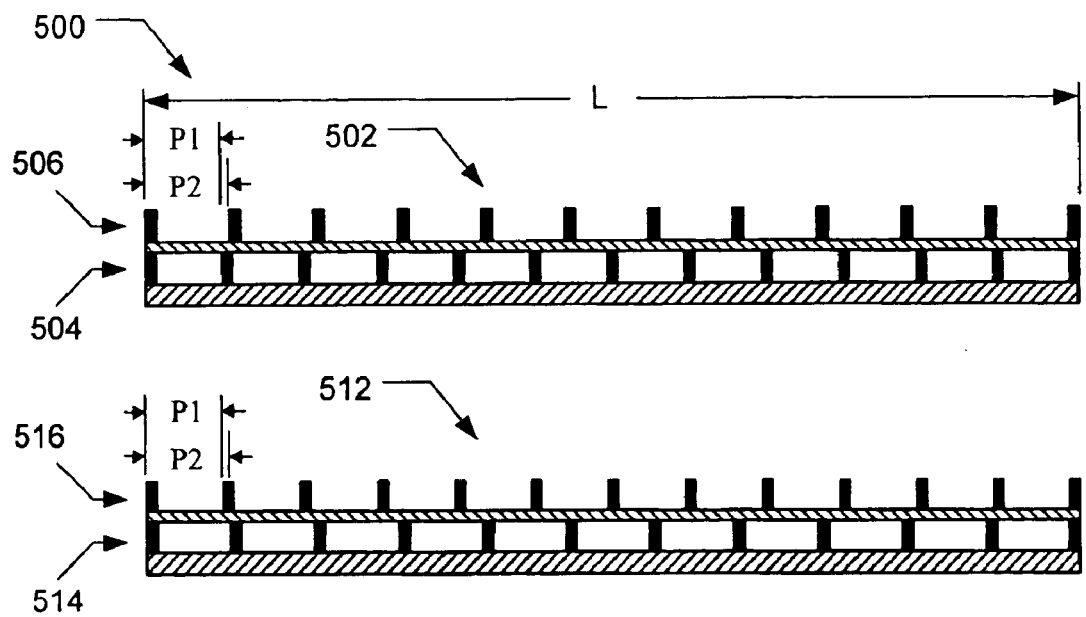
Fig. 21
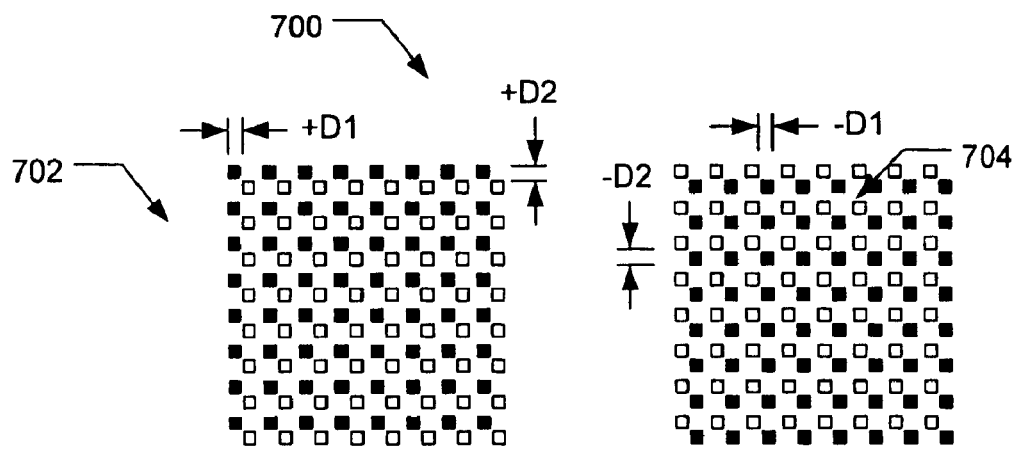
Fig. 24
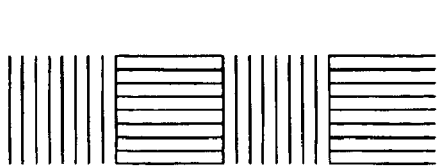 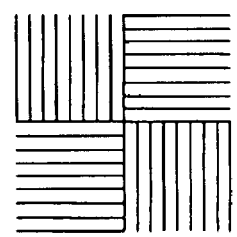
Fig. 25A          Fig. 25B

METHOD AND APPARATUS FOR USING AN ALIGNMENT TARGET WITH DESIGNED IN OFFSET

BACKGROUND OF THE INVENTION

1. Field of the Invention

The present invention relates to alignment metrology, and in particular to an alignment target and method of use that includes two locations with designed in offsets.

2. Discussion of the Related Art

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically the photomask has alignment targets or keys that are aligned to fiduciary marks formed in the previous layer on the substrate. However, as the integrated circuit feature sizes continue to decrease to provide increasing circuit density, it becomes increasingly difficult to measure the alignment accuracy of one masking level to the previous level. This overlay metrology problem becomes particularly difficult at submicrometer feature sizes where overlay alignment tolerances are reduced to provide reliable semiconductor devices.

FIGS. 1A and 1B show conventional overlay targets used with conventional imaging metrology methods. FIG. 1A shows a typical Box-in-Box overlay target 2. Target 2 is formed by producing an etched box 4 in a material layer 6 on a substrate. A corresponding smaller box 8 on the photomask or reticle is aligned to the larger box 4 so that the centers of the large and small boxes are aligned.

FIG. 1B shows a Bar-in-Bar overlay target 12, which is similar to target 2 shown in FIG. 1A. Target 12 is produced by etching bars 14 in a material layer 16 on a substrate. The bars 18 on the photomask are aligned to the overlay target alignment bars 14.

After the smaller box 8 or bars 18 are developed, i.e., exposed and etched, the overlay target is imaged to determine whether the photomask or reticle was properly aligned with the underlying layer. Conventionally, high magnification imaging is used to measure overlay alignment. Conventional imaging devices, unfortunately, suffer from disadvantages such as sensitivity to vibration and cost. Moreover, conventional imaging devices suffer from a trade-off between depth-of-focus and optical resolution. Additionally, edge-detection algorithms used to analyze images for the purpose of extracting overlay error are inaccurate when the imaged target is inherently low-contrast or when the target suffers from asymmetries due to wafer processing.

Thus, there is a need in the semiconductor industry for improved alignment target and associated metrology.

SUMMARY

In accordance with the present invention, an alignment target includes periodic patterns on two elements, such as layers on a substrate. The alignment target includes at least two locations at least one of which includes a designed in offset. In one embodiment, the two locations both have designed in offsets of equal magnitude and opposite directions. For example, two separate overlay patterns that are mirror images of each other may be used. Alternatively, a single overlay pattern that includes periodic patterns with different pitches may be used. In such an embodiment, the length of the pattern is sufficient to allow two locations that have a designed in offset of the same magnitude but opposite direction. To determine the alignment error between the two elements, the alignment target is illuminated at two locations and resulting radiation from the at least two locations is detected and compared. Advantageously, the calculated difference is extremely sensitive to any alignment error. If the difference between the patterns is approximately zero, the elements are properly aligned. However, a slight alignment error will produce a relatively large, and easily detected, calculated difference. In one embodiment, the alignment target can be modeled, e.g., using rigorous coupled wave analysis (RCWA), to determine the alignment error. In another embodiment, additional overlay patterns with additional reference offsets are used as a point of reference to determine the alignment error. In such an embodiment, there is no need to model the alignment target. The alignment target, in accordance with the present invention, may be used to assure alignment of layers on a substrate.

In one embodiment of the present invention, a method of determining the alignment of a first element with respect to a second element includes providing an alignment target on the first element and the second element, the alignment target has at least one periodic pattern on the first element and at least one periodic pattern on the second element. The alignment target has at least two locations, at least one of which has a designed in offset between the periodic pattern on the first element and the periodic pattern on the second element. In one embodiment, there is a designed in offset at the two locations having the same magnitude in opposite directions. In other embodiments, the two locations may have designed in offsets of different magnitudes and/or in different directions. The method includes illuminating the at least two locations on the alignment target with incident radiation that reacts with the alignment target and detecting the radiation from the at least two locations after it reacts with the alignment target. The detected radiation from the two locations is then compared to determine the alignment of the first element with respect to the second element.

In accordance with the present invention, the alignment error may be determined by measuring light diffracted by the at least two locations or imaging the moiré fringe patterns produced by the patterns. Thus, as an example, the difference between the light diffracted from one location and the light diffracted from a second location of the alignment target is calculated. In one embodiment, the method includes receiving the diffracted light by a two dimensional detector that receives the spectra dispersed along one dimension and the spectra associated with different overlay patterns separated along a direction perpendicular to the spectral dispersion.

The method may include modeling the two locations of the alignment target and calculating the difference in the diffracted light in the two modeled locations. The calculated modeled difference is compared to the calculated measured difference to determine if an adequate fit occurs. If the first is not adequate, the two locations are remodeled with a different offset, and the calculated difference and comparison is performed again. If desired, the modeled locations and calculated modeled difference may be stored in a library. In another embodiment, the light is imaged to form moiré fringes. The bands of the moiré fringes can then be compared to determine alignment. Alternatively, each location may be individually modeled and compared to the measured light from each location.

In another embodiment, the alignment target includes at least one additional location that has a reference offset. Thus, for example, the alignment target includes at least three locations, each location including a periodic pattern on the first element and a periodic pattern on the second element, a first location and a second location having a designed in offset of a first magnitude in a first and second direction, respectively, wherein the first and second directions are opposite directions, the third location having a designed in offset of a second magnitude in the same direction as the first location, the second magnitude being equal to the first magnitude plus a reference offset. The method then includes measuring the light diffracted from each location, i.e., from the first, second and third location. The difference between the diffracted light from the first location and diffracted light from the second location is calculated to produce a first measured difference. The method then includes calculating the difference between the diffracted light from the first location and the diffracted light from the third location to produce a second measured difference. The alignment error is then determined based on a ratio of the first measured difference and the second measured difference. The ratio may include the product of one half of the first magnitude.

The fourth location may have a designed in offset of the second magnitude that is in the second direction. The method then includes calculating the difference between the diffracted light from the first and third locations to produce a second measured difference; calculating the difference between the diffracted light from the third and fourth locations to produce a third measured difference; calculating the difference between the diffracted light from the fourth and second locations to produce a fourth measured difference; and determining the approximate alignment error based on the ratio of the sum of the first measured difference summed with the third measured difference and the sum of the second measured difference with the fourth measured difference multiplied, and multiplying the ratio by one half of the first magnitude.

The alignment target in accordance with the present invention includes a first location pattern having a first periodic pattern on the first element and a second periodic pattern on the second element, wherein the second periodic pattern has a designed in offset with a first magnitude in a first direction with the first periodic pattern such that when the first element and the second element are properly aligned the first periodic pattern and the second periodic pattern will be offset by the first magnitude in the first direction. The alignment target also includes a second location having a third periodic pattern on the first element and a fourth periodic pattern on the second element, wherein the fourth periodic pattern has a designed in offset with a second magnitude in a second direction with the third periodic pattern such that when the third element and the fourth element are properly aligned the third periodic pattern and the fourth periodic pattern will be offset by the second magnitude in the second direction. The first and second magnitude may be equal or different. Moreover, the first and second directions may be opposite or non-parallel. The periodic patterns may be either diffraction gratings with lines extending perpendicularly to the first direction or bi-gratings, which is a periodic pattern with periodicity in two directions. The magnitude of the offset may be, e.g., 5% to 40%, e.g., 25% of the pitch of the grating. The first and second periodic patterns may have different pitches, which produce the offset. The first element may be a first layer on a substrate and the second element may be a second layer on the substrate. Alternatively, the first element may be a first pattern produced on a first layer of a substrate and the second element is a second pattern produced on the same layer of the substrate. If desired, the alignment target may include additional locations having different offsets to be used as references.

Another embodiment of the present invention is an apparatus for determining the alignment of a first element with a second element by way of an alignment target having at least one periodic pattern on the first element and at least one periodic pattern on the second element, the alignment target including at least two locations, at least one of which has a designed in offset between the periodic patterns. The apparatus includes a source for producing radiation, e.g., light to be incident on the at least two locations of the alignment target and a detector for detecting the radiation that interacts with the two locations of the alignment target. The apparatus further includes a computer and a computer-usable medium having computer-readable program code embodied therein for causing the computer to calculate the difference between the detected radiation from the two locations and using the difference to determine if the first element and the second element are aligned. The apparatus may include a two dimensional detector that receives the spectra dispersed along one dimension and the spectra associated with different overlay patterns separated along a direction perpendicular to the spectral dispersion.

The computer-readable program code embodied in the computer-usable medium may use a model to determine the alignment error. Alternatively, additional locations on the alignment target may be used as a reference to determine the alignment error.

BRIEF DESCRIPTION OF THE DRAWINGS

FIG. 2 shows a cross-sectional view of an alignment target, in accordance with an embodiment of the present invention.

FIG. 3 shows a cross-sectional view of an alignment target, in accordance with an embodiment of the present invention with an introduced alignment error.

FIG. 19 is another alignment target, in accordance with another embodiment of the present invention.

FIG. 20 is another alignment target, similar to alignment target of FIG. 19, in accordance with an embodiment of the present invention.

FIG. 21 is another alignment target, similar to alignment target of FIG. 20, in accordance with an embodiment of the present invention.

FIG. 24 shows a top view of an overlay pattern that is a bi-grating that may be used in accordance with the present invention.

FIGS. 25A and 25B shows a top view of two exemplary arrangements of periodic patterns in an alignment target of the present invention.

DETAILED DESCRIPTION

Figure 1A:
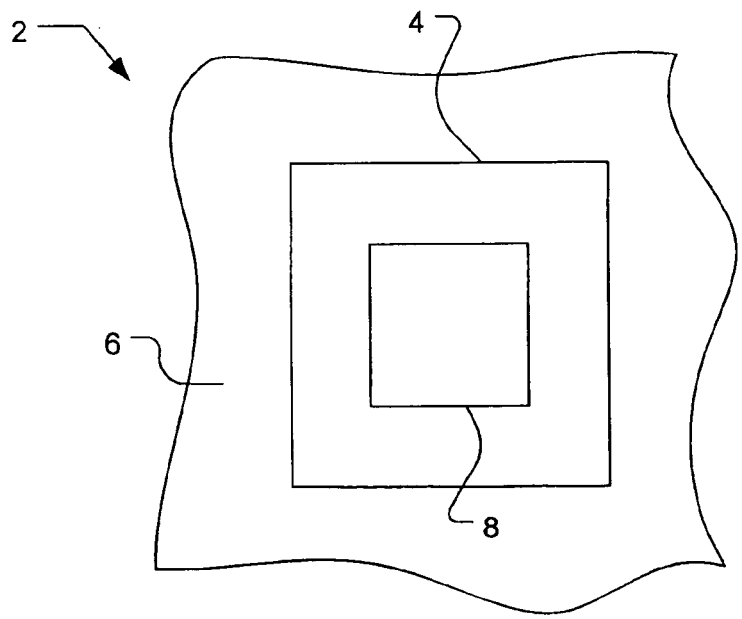
FIGS. 1A and 1B show conventional overlay targets used with conventional imaging metrology methods.

In accordance with an embodiment of the present invention, the alignment of two elements, e.g., two layers on a substrate or any other two elements, is measured using an alignment target having at least one periodic pattern on one element and at least one periodic pattern on the other element. The alignment of the two elements may be determined by measuring the alignment of the at least two periodic patterns. The alignment target includes at least two locations, at least one of which has a designed in offsets between the periodic patterns on each element. The designed in offset is an offset between the periodic pattern on the first element and the periodic pattern on the second element such that when the two elements are aligned, there will be an offset between the periodic patterns. In one embodiment, both measurement locations on the alignment target will have a designed in offset of equal magnitude and opposite direction. In other embodiments, the designed in offsets at the measurement locations do not have the same magnitude and/or may be at some angle with respect to one another. Advantageously, the alignment target of the present invention is relatively insensitive to unintentional rotation of the top element with respect to the bottom element.

The use of the designed in offset in the alignment target is advantageous because the difference in radiation that interacts with the measurement locations is extremely sensitive to any alignment error. Thus, for example, if the designed in offsets at the locations are equal and opposite and the alignment error is approximately zero, the difference between the radiation that interacts with the measurement location will be approximately zero. If, however, a slight alignment error is present, the difference will be relatively large. If the magnitudes of the designed in offsets are different, a correction factor may be used to determine the alignment.

The presence of a small alignment error may be easily and accurately measured using a modeling process, e.g., rigorous coupled wave analysis (RCWA). Alternatively, the alignment target may include additional locations that may be used to provide a reference offset. The use of the reference offset may then be used to calculate the alignment error with a high degree of accuracy.

The present invention may be used to measure the alignment error down to a fraction of a nanometer, while the current industry standard is approximately 15 nm. Thus, the present invention provides a large improvement compared to current technology.

Alignment target is used generally to mean a target that aids in the measurement of the alignment between two elements, e.g., the overlay error between two layers on a substrate. It should be understood that the use of the alignment target of the present invention is not limited to measuring an overlay error on a substrate, but may measure the alignment of any two elements. Moreover, the use of the alignment target is not limited to measuring the alignment, but may be used to assist in the alignment process of two elements, e.g., in an exposure tool or in any other desired device. The use of the alignment target to assist in the alignment process is described in more detail in U.S. Patent Application entitled "Positioning Two Elements Using an Alignment Target with a Designed in Offset" by Weidong Yang, Roger R. Lowe-Webb, and John D. Heaton, Ser. No. 10/116,964; in U.S. Patent Application entitled "Measuring An Alignment Target With Multiple Polarization States" by Weidong Yang, Roger R. Lowe-Webb, Ser. No. 10/116,798; in U.S. Patent Application entitled "Encoder with Alignment Target", by John D. Heaton, Weidong Yang, and Roger R. Lowe-Webb, Ser. No. 10/116,855, all of which are filed herewith and have the same assignee as the present application and are incorporated herein by reference.

FIG. 2 shows a cross-sectional view of an alignment target 100 in accordance with an embodiment of the present invention. Alignment target 100 includes two locations that have a designed in offset of equal magnitude and opposite directions. The two locations in alignment target 100 are referred to as overlay patterns 102 and 104, respectively. Each of the overlay patterns 102, 104 includes a bottom periodic pattern, referred to as diffraction gratings 106, 116, and a top periodic pattern, referred to as diffraction gratings 108, 118. Alignment target 100 is described as being produced on different layers on a substrate. It should be understood, however, the alignment target 100 may be used on any two elements.

Each overlay pattern 102, 104 is similar to the overlay pattern described in the U.S. Ser. No. 09/960,892 entitled "Spectroscopically Measured Overlay Target", filed Sep. 20, 2001, which has the same assignee as the present disclosure and which is incorporated herein in its entirety by reference. However, only one overlay target is described in U.S. Ser. No. 09/960,892, whereas two mirror imaged overlay patterns 102, 104 are used as the alignment target in accordance with the present invention. While it is possible to determine the overlay error by measuring the reflectance spectrum of one grating target and modeling the spectrum using, e.g., RCWA, as described in U.S. Ser. No. 09/960,892, the accuracy suffers from systematic errors such as imperfections in the model. The effect of systematic error on the absolute accuracy can be expressed as $shift_{measured} = shift_{real} + error_{systematic}$. The present invention, advantageously, increases the accuracy by canceling out the systematic error term.

The overlay patterns 102, 104 are produced on a substrate 101, which is e.g., a silicon substrate. The substrate may be a semiconductor wafer, flat panel display or any other structure in which accurate alignment of successive layers is important. Of course, there may be layers between substrate 101 and the bottom diffraction gratings 106, 116. It should be understood that while FIG. 2 shows overlay patterns 102 and 104 as separate patterns, overlay patterns 102 and 104 are included on the same substrate, preferably near to each other and together form alignment target 100.

The bottom diffraction gratings 106, 116 are produced, for example, by providing a layer of appropriate material, such as a 200 nm layer of polysilicon, followed by a layer of photoresist. The desired image including the diffraction gratings 106, 116 is exposed in the photoresist, which is then developed. The polysilicon is then etched away leaving diffraction gratings 106, 116. A layer 103, such as a dielectric layer, is then deposited over diffraction gratings 106, 116.

As shown in FIG. 2, an overlaying layer 105, which may be, e.g., a 1000 nm layer of silicon oxide, is deposited over the bottom diffraction gratings 106, 116. The top diffraction gratings 108, 118 are then produced using, e.g., photoresist, in a manner similar to the bottom diffraction grating 102, where the top diffraction gratings 108, 118 are separated from the bottom diffraction gratings 106, 116 by the thickness of layer 105, e.g., 1000 nm. For example, an 800 nm layer of the photoresist is deposited over layer 105. The desired image including the diffraction gratings 108, 118 is exposed in the photoresist layer. The photoresist is then developed, thereby leaving diffraction gratings 108, 118.

It should be understood that the processing steps used to produce overlay patterns 102 and 104 are exemplary. Different or additional layers may be included between the substrate 101 and the bottom diffraction gratings 106, 116 or between the bottom diffraction gratings 106, 116 and the top diffraction gratings 108, 118. Additionally, fewer layers may be included between the bottom diffraction gratings 106, 116 and the top diffraction gratings 108, 118, i.e., layer 105 may not be used. In fact, if desired, the top diffraction gratings 108, 118 may be on the same layer as the bottom diffraction gratings 106, 116, in which case, top and bottom refers to the order in which the gratings are produced, i.e., the bottom diffraction grating being first and the top diffraction grating being second. Thus, the alignment target 100 is used to ensure that a first pattern produced on a first layer on the substrate is aligned with a second pattern produced on the same layer on the substrate.

Alternatively, the alignment target may be used with two elements that are not connected. Thus, for example, the top diffraction gratings 108, 118, and the bottom diffraction gratings 106, 116 may be separated by a small distance, e.g., up to approximately 10 µm or more.

The dimensions of the gratings and the thicknesses of the layers may also be altered. For example, the bottom diffraction gratings 106, 116 need not extend to the top of layer 105.

Moreover, latent images may be used, and thus, the photoresist need not be developed to form diffraction gratings 108, 118, because the exposed photoresist has a different index of refraction than the exposed photoresist.

In addition, it should be understood that either diffraction gratings 108, 118 or 106, 116 may actually be a continuous diffraction grating. Thus, for example, bottom diffraction gratings 106 and 116 may be one long grating with top diffraction gratings 108 and 118 disposed over the top of it. Alternatively, top diffraction gratings 108 and 118 may be one continuous diffraction grating disposed over the top of bottom diffraction gratings 106, 116. Because the present invention uses separate locations on the alignment target, however, the use of a single or separate periodic patterns does not matter. Consequently, it should be understood that discussion of two diffraction patterns, e.g., patterns 106 and 116, is intended to include two separate areas of a single continuous diffraction pattern.

As can be seen in FIG. 2, overlay pattern 102 includes a designed in offset of +D between the top diffraction grating 108 and bottom diffraction grating 106. Thus, during processing, if the top diffraction grating 108 is produced over the bottom diffraction grating 106 with an offset exactly +D, the top diffraction grating 108 and the bottom diffraction grating 106 are perfectly aligned. If the top diffraction grating 108 is produced over the bottom diffraction grating 106 with some deviation from the offset +D, the deviation is the amount of the overlay error.

Overlay pattern 104 is similar to overlay pattern 102 but is mirror imaged, i.e., has an offset of −D. Because overlay patterns 102 and 104 are similar, the top diffraction gratings 108, 118 are designed to have the same line width (LWT), height (HT) and pitch (PT), while the bottom diffraction gratings 106, 116 are likewise designed to have the same line width (LWB), height (HB) and pitch (PB). In one exemplary embodiment, diffraction gratings 106, 116 may have a line width (LWB) of 200 nm, a line height (LHB) of 200 nm and a pitch (P) of 600 nm, while diffraction gratings 108, 118 may have a line width (LWT) of 200 nm, a line height (LHT) of 800 nm and a pitch (PT) of 600 nm. It should be understood that the alignment target 100 may be produced using various materials and the dimensions optimized for the materials used. Thus, the dimensions of the alignment target 100 may be altered to maximize sensitivity based on the types of materials used.

Because overlay pattern 102 and 104 are produced at the same time, during the same processing steps, any variation between the intended structure and the actual structure should be the same for both overlay pattern 102 and 104. Because overlay pattern 102 and overlay pattern 104 have the same amount of designed in offset D, but in opposite directions, the diffraction patterns produced by overlay patterns 102 and 104 will be the same. Consequently, if there is no overlay error, the detected light patterns from overlay pattern 102 and overlay pattern 104 will be the same.

However, because overlay pattern 102 has an offset of +D and overlay pattern 104 has an offset of −D, any overlay error will alter the offset in the two patterns differently, i.e., the symmetry between overlay pattern 102 and overlay pattern 104 is broken. For example, an overlay error of +e will increase the magnitude of the offset for overlay pattern 102 while decreasing the offset for overlay pattern 104.

FIG. 3 shows an alignment target 100', which is similar to alignment target 100 in FIG. 2, except that an overlay error or +e is introduced into the alignment target 100'. The overlay error of +e results in overlay pattern 102' having an offset with an absolute magnitude of |D+e|, and overlay pattern 104' having an offset with an absolute magnitude of |D−e|.

Accordingly, by calculating the difference between the measurements of diffracted light from overlay pattern 102 and overlay pattern 104, the amount of overlay error e can be accurately determined. For example, if there is no overlay error, the difference between the measurements will be zero (plus any system noise) due to the symmetry between overlay pattern 102 and overlay pattern 104. However, if there is an overlay error e, by calculating the difference in the diffraction measurements, the magnitude of the overlay error is functionally doubled i.e., |D+e|−|−D+e|=2e. Moveover, because the diffraction measurements from one overlay pattern is subtracted from the diffraction measurements from the other overlay pattern, systematic errors will be cancelled.

Figure 4:
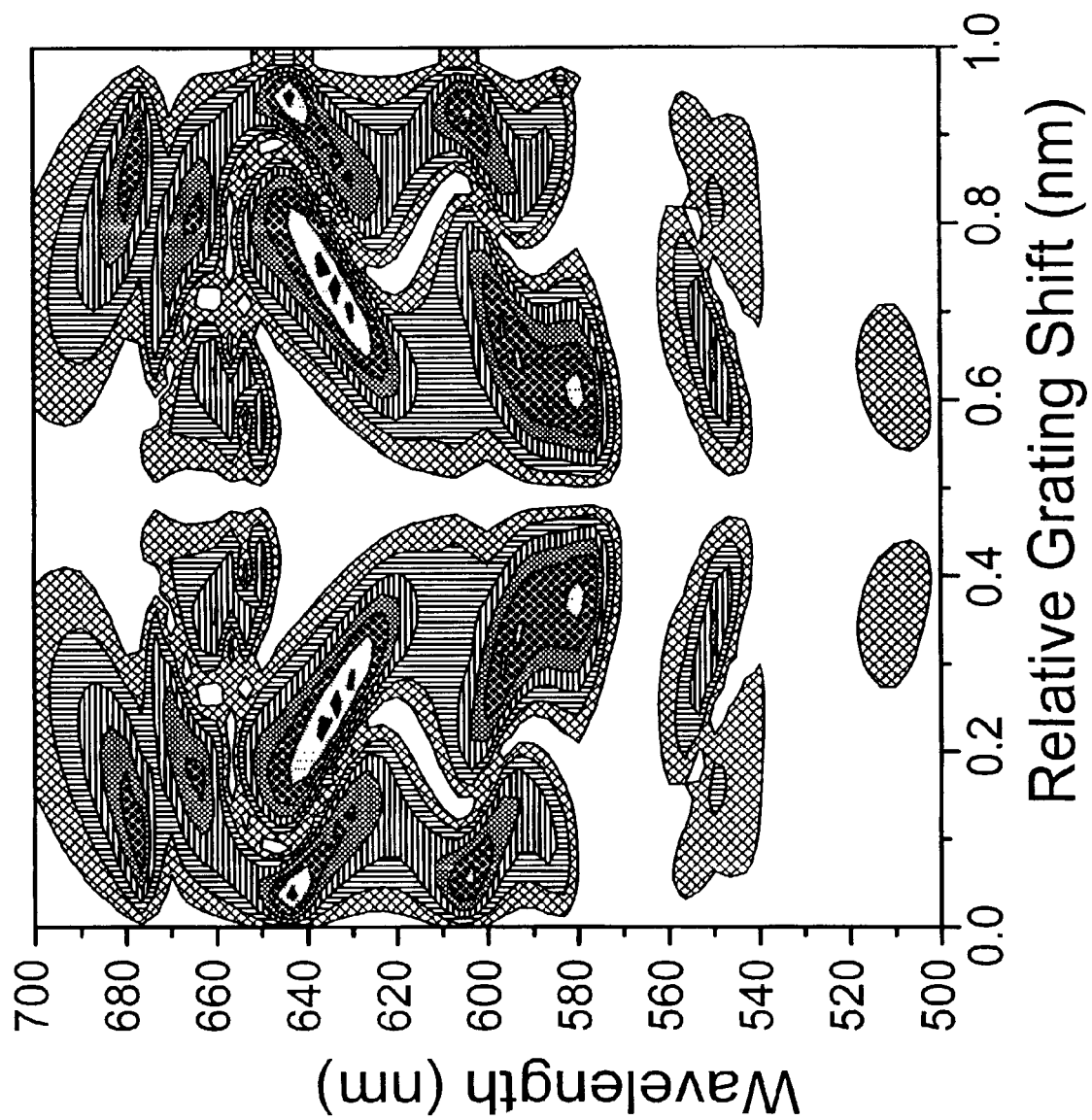
FIG. 4 is a sensitivity map for a diffraction pattern caused by a pattern similar to that shown in FIG. 2.

To understand why the accuracy of the alignment target 100 is improved, reference is made to FIG. 4, which is a sensitivity map for a diffraction pattern produced by a pattern similar to overlay pattern 102, but with no designed in offset. The sensitivity map of FIG. 4 shows the sensitivity of each wavelength to a relative grating shift, i.e., the top grating moves relative to the bottom grating, where the x axis shows the relative normalized grating shift of the diffraction gratings from 0 to 1, and the y axis is the wavelength of light from 500 nm to 700 nm. The sensitivity of each wavelength of light for each relative grating shift was calculated using the following equation:

$$S(\lambda_i, \varphi_j) = \frac{|R(\lambda_i, \varphi_j) - R(\lambda_i, \varphi_{j-1})|}{\varphi_j - \varphi_{j-1}} = \left|\frac{\partial R}{\partial \varphi}\right| \qquad \text{eq. 1}$$

where $R(\lambda_i, \varphi_j)$ is the calculated reflectance at a particular relative grating shift for a particular wavelength and $R(\lambda_i, \varphi_{j-1})$ is the calculated reflectance at the previous relative grating shift at the same wavelength, and the sensitivity $S(\lambda_i, \varphi_j)$ is in arbitrary units ranging from 0 to 14.

As can be seen in FIG. 4, the sensitivity of an overlay pattern 102 is symmetrical about 0 and about 0.5, which correspond to perfect alignment between the top diffraction grating 106 and bottom diffraction grating 104 and a shift of 50% of the pitch, respectively.

Figure 5:
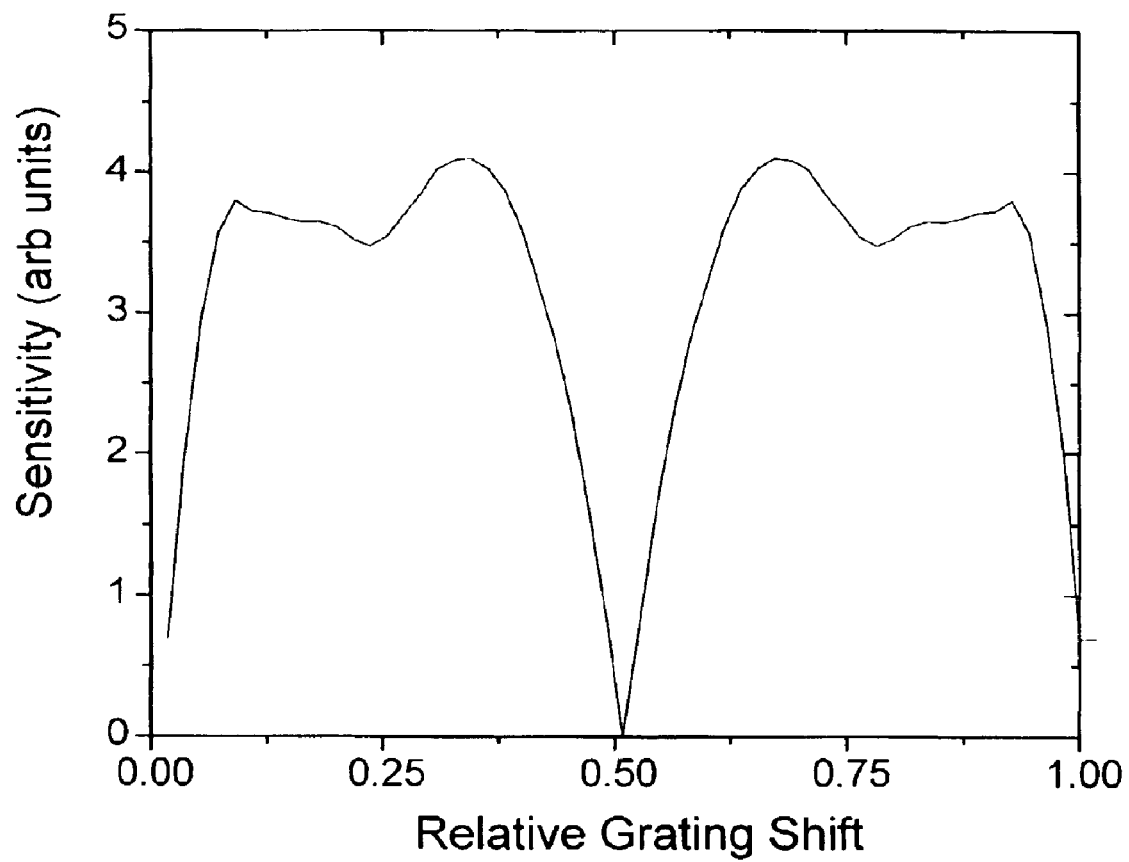
FIG. 5 is a graph showing the overlay sensitivity of a diffraction grating, where the x-axis is the relative grating shift and the y-axis is the sensitivity in arbitrary units.

FIG. 5 is a graph showing the overlay sensitivity of a diffraction grating, such as overlay pattern 102, where the x-axis is the relative grating shift and the y-axis is the sensitivity in arbitrary units. The sensitivity for each grating shift was averaged over the wavelength variable according to the following equation:

$$\langle S(\varphi) \rangle_\lambda = \frac{1}{N} \sum_{i=1}^{N} S(\lambda_i, \varphi) \qquad \text{eq. 2}$$

where N is the number of discrete wavelengths comprising the sensitivity spectrum. The slight shift of the curves in FIG. 5 to the right on the x axis is due the comparison of the reflectance for a current grating shift with the previous grating shift in equation 1. As can be seen in FIG. 5, maximum sensitivity lies between approximately 5% to 40% (and 60% and 95%) of the pitch P. While the maximum of the curves appears at approximately 34% and 66% of the pitch, there is a roll off between approximately 40% and 60%. Moreover, from inspection of the sensitivity map of FIG. 4 it can be seen that the various wavelengths are less sensitive to change when the relative grating shift is close to 50%.

Thus, in one embodiment, the designed in offset D in overlay patterns 102, 104 lies in the range of maximum sensitivity, as shown in FIG. 5. For example, the offset ±D may be approximately ±5% to 40% of the pitch, and more particularly ±25% of the pitch. Of course, the amount of offset may be altered to optimize sensitivity for the materials used and the dimensions of the patterns.

Figure 6:
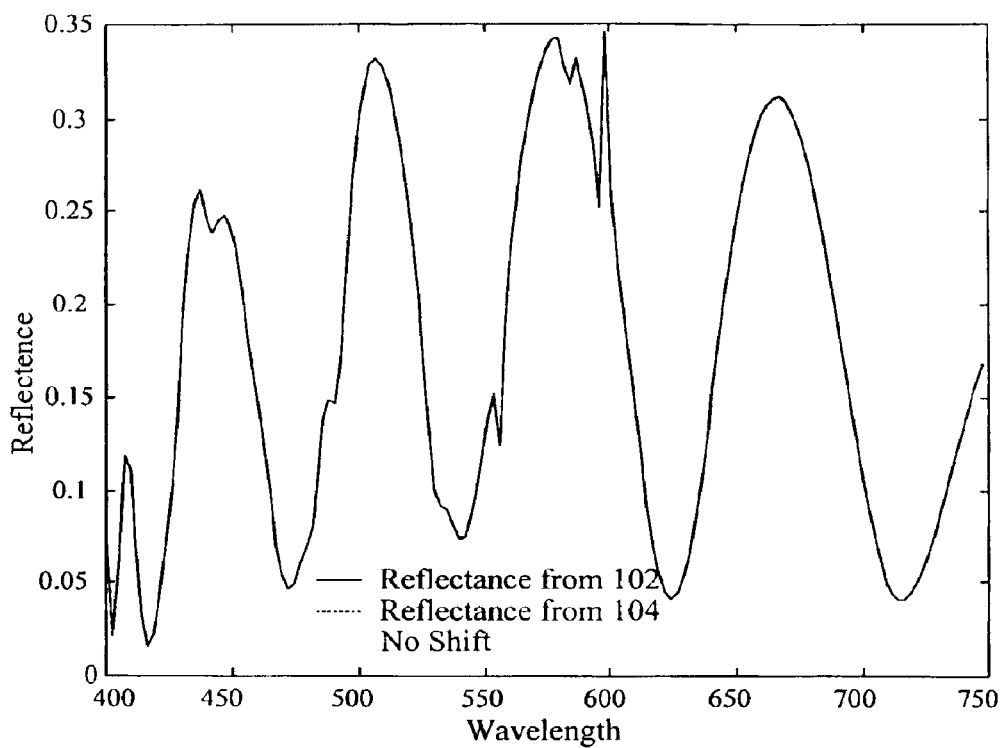
FIG. 6 shows the spectral reflectance from the alignment target in FIG. 2 when there is no overlay error.

FIG. 6 shows the spectral reflectance from alignment target 100 in FIG. 2 when there is no overlay error. The overlay pattern 102 has an offset of +D, while the overlay pattern 104 has an offset of −D. As can be seen in FIG. 6, as well as in FIGS. 4 and 5, when the same magnitude but different direction offset D is used, the resulting diffraction measurement from the two overlay patterns will be the same. It should be understood, that while FIG. 6 shows the spectral reflectance, any diffraction measurement, i.e., a measurement of any one or more of the diffractive orders, including the $0^{th}$ order, may be used. Moreover, the measurement may be made using a single wavelength, a plurality of discrete wavelengths, or a continuum of wavelengths.

Figure 7:
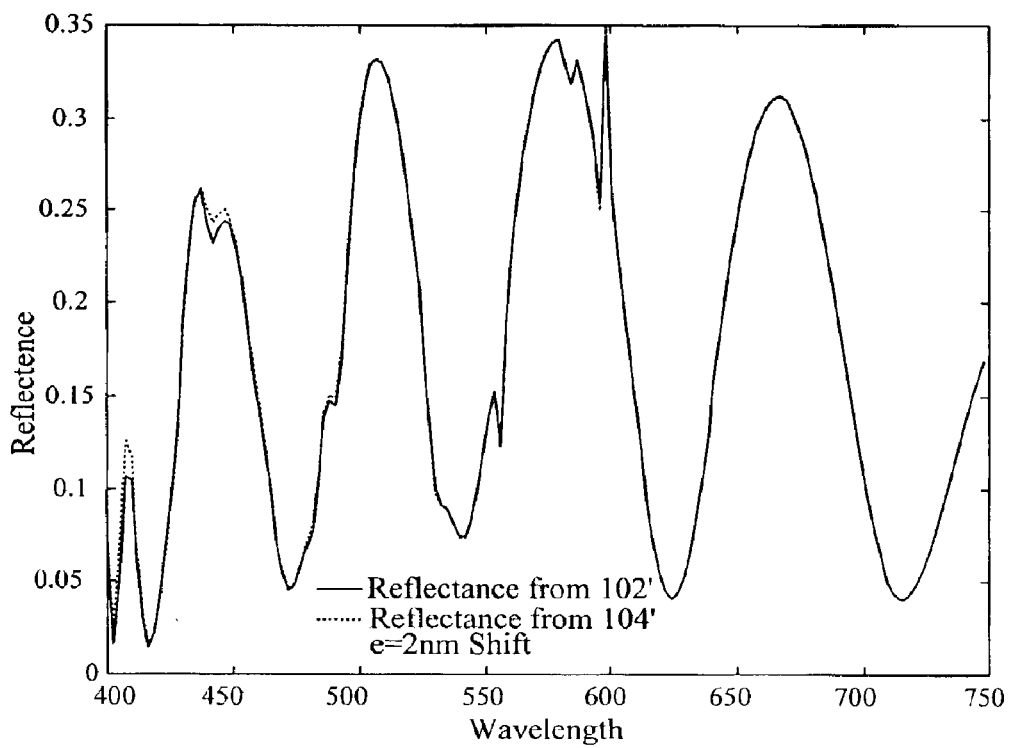
FIG. 7 shows the spectral reflectance from alignment target in FIG. 3, i.e., when a non-zero alignment error is present.

FIG. 7 shows the spectral reflectance from alignment target 100' in FIG. 3, i.e., when the alignment target includes a non-zero alignment error. For the purpose of FIG. 7, the overlay error is 2 nm, whereas the pitch is 400 nm, top line width is 100 nm, bottom line width 100 nm, the height HB is 200 nm and the height HT is 500 nm. As can be seen FIG. 7, when there is an overlay error, the spectral reflectance from overlay pattern 102' is different than that for overlay pattern 104'.

Figure 8:
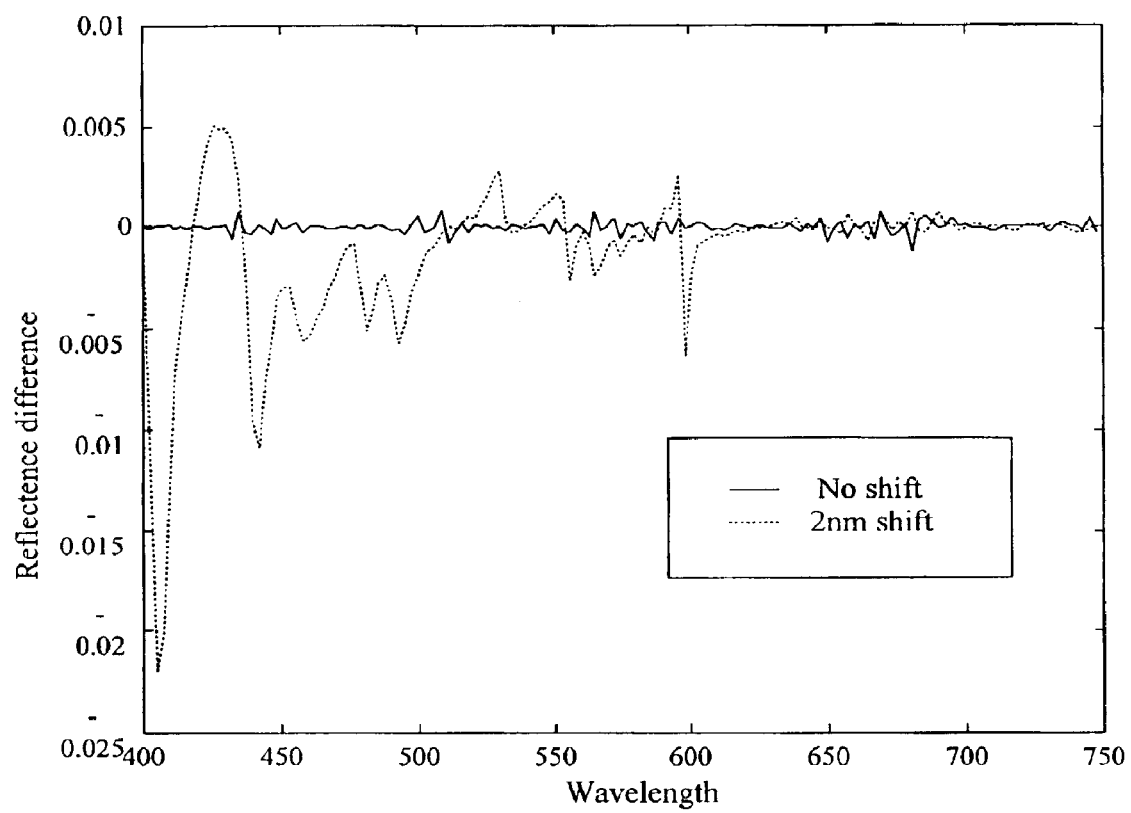
FIG. 8 shows the difference in the reflectances shown in FIGS. 6 and 7, i.e., when there is a zero and a non-zero alignment error.

FIG. 8 shows the difference in the reflectances shown in FIGS. 6 and 7, i.e., the reflectances for overlay patterns when there is no overlay error and when there is a 2 nm overlay error. As can be seen in FIG. 8, the difference in spectral reflectance between the overlay patterns 102 and 104 when there is no overlay error, is equal to approximately zero (except for a slight amount of noise that can be seen). However, there is a large difference in spectral reflectance between the overlay patterns 102' and 104', when there is small overlay error of 2 nm, particularly within wavelengths 400 to 600 nm. Thus, by calculating the difference between the measured diffraction of the two overlay patterns, small overlay errors may be observed.

Figure 9:
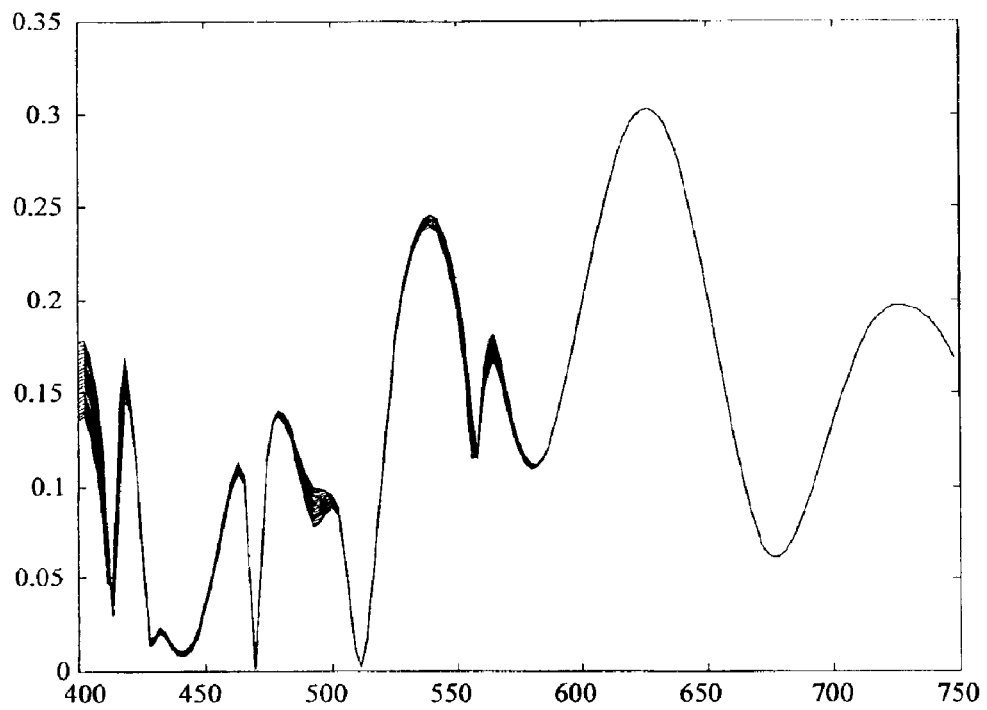
FIG. 9 is a graph showing the spectral reflectances from an overlay pattern, such as the overlay pattern shown in FIG. 2, with different offsets.

FIG. 9 is a graph showing the spectral reflectances from an overlay pattern, such as overlay pattern 102 in FIG. 2, with different offsets. The overlay pattern used to generate the data for FIG. 9 has a bottom diffraction grating height of 200 nm and line width of 100 nm and a top diffraction grating height of 500 nm and line width of 100 nm. The separation between the top and bottom diffraction gratings is 500 nm and the pitch of diffraction gratings is 400 nm. FIG. 9 shows the spectral reflectance for an offset of between 80 nm to 120 nm in 2 nm increments.

Figure 10:
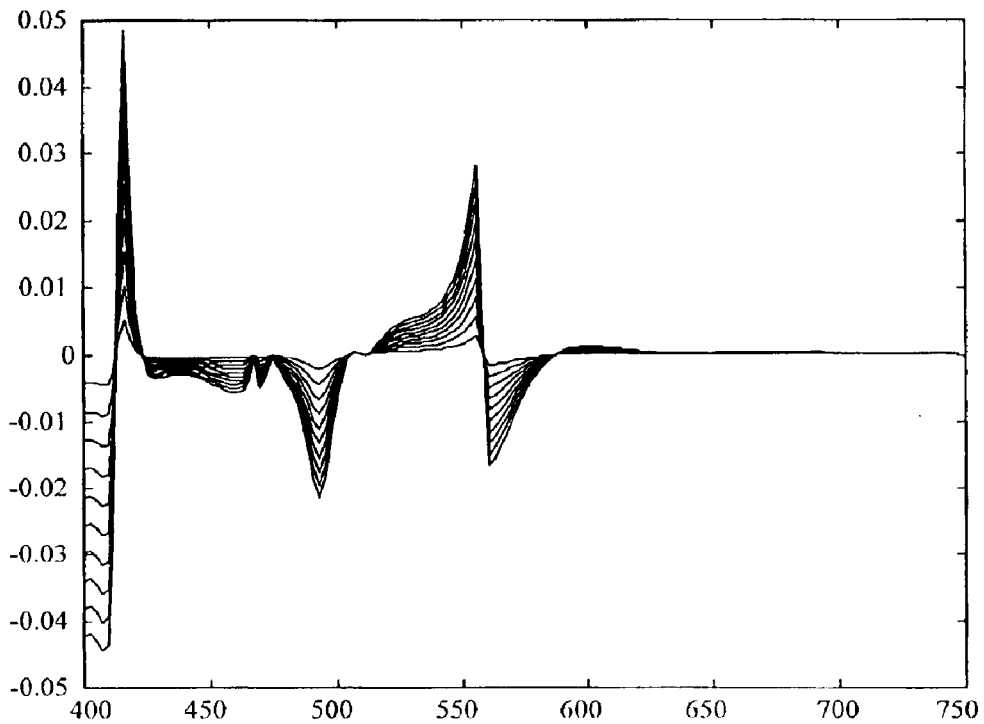
FIG. 10 is a graph showing the delta shift from 4 nm to 40 nm in spectral reflectances of FIG. 9.

FIG. 10 is a graph showing the delta shift from 4 nm to 40 nm in spectral reflectances of FIG. 9. In other words, FIG. 10 shows the difference between each spectral reflectance in FIG. 9 and the spectral reflectance for 80 nm. Thus, FIG. 10 shows the difference between the spectral reflectances for offsets of 80 nm and 84 nm, 80 nm and 88 nm, and 80 nm and 92 nm, etc. . . . Because FIG. 9 shows the spectral reflectances for offsets of 80 nm to 120 nm at every 4 nm, the delta shift shown in FIG. 10 is from 4 nm (84 nm−80 nm) to 40 nm (120 nm−80 nm). As can be seen in FIG. 10, as the delta shift increases, the resulting difference in spectral reflectance increases.

Figure 11:
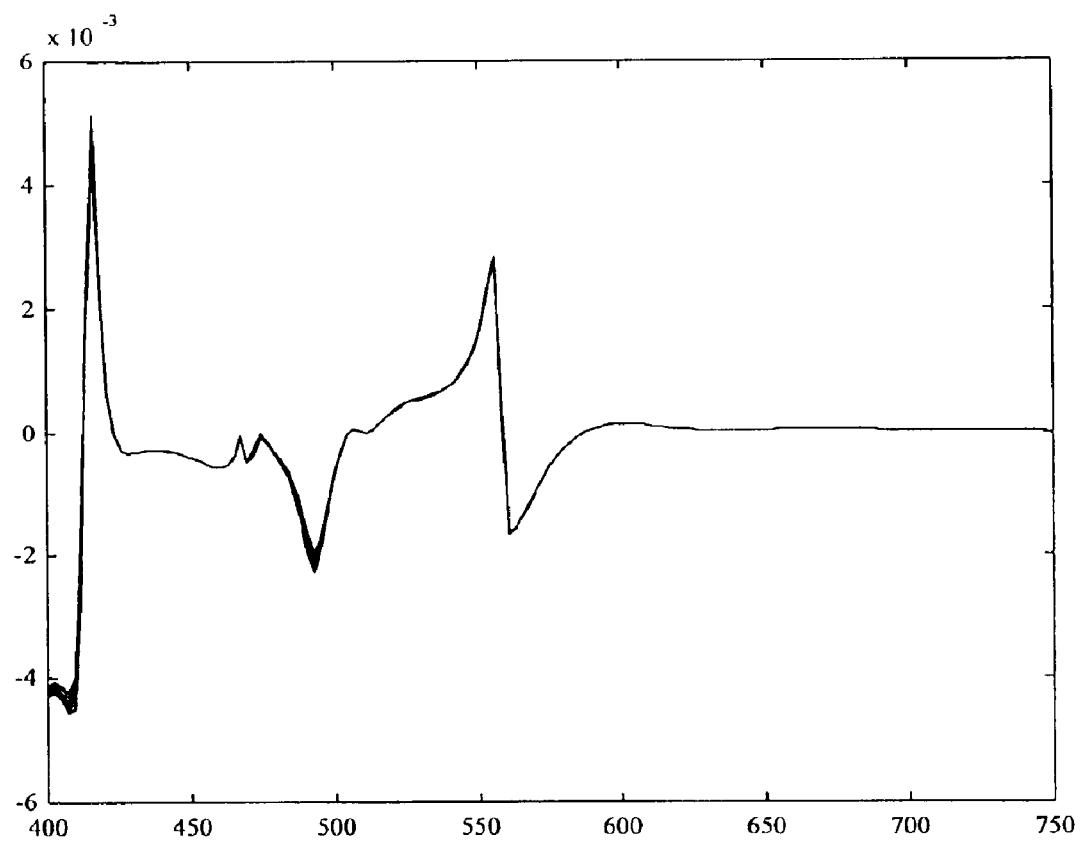
FIG. 11 is a graph showing the difference in spectral reflectances for neighboring offsets of FIG. 9, i.e., 84 nm–80 nm; 88 nm–84 nm, 92 nm–88 nm, etc. . . .

FIG. 11 is a graph showing the difference in spectral reflectances for neighboring offsets of FIG. 9, i.e., 84 nm−80 nm; 88 nm−84 nm, 92 nm−88 nm, etc. . . . Thus, FIG. 11 shows the difference between spectral reflectances for offsets ranging from 80 nm to 120 nm, where each difference is based on a difference in offset of 4 nm. As can be seen in FIG. 11, the differences in spectral reflectances are nearly identical, which indicates that the difference in the spectral reflectances is highly linear.

In general, the alignment target 100 may be measured by producing radiation that is incident on at least two locations of the alignment target and reacts with the alignment target. The radiation from the two locations is detected after reacting with the alignment target. The detected radiation from the two locations may then be compared to determine the alignment error.

Figure 12A:
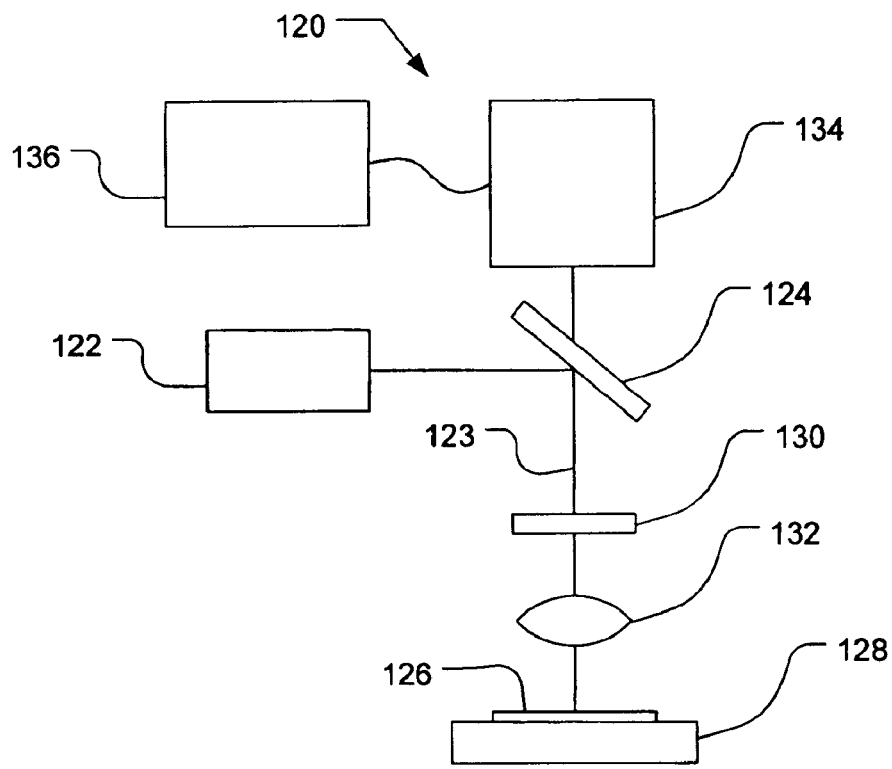
FIGS. 12A, 12B, 12C show metrology devices that may be used to measure the diffraction from an alignment target in accordance with the present invention.

Alignment target 100 may be measured using several types of metrology devices, such as a normal incidence reflectometer, a non-normal incidence reflectometer, ellipsometer, scatterometer or other such device. FIG. 12A, for example, shows a block diagram of a normal incidence polarized reflectance spectrometer that may be used to measure alignment target 100. Spectrometer 120 is discussed in detail in the U.S. Patent Application entitled "Apparatus and Method for the Measurement of Diffracting Structures," filed Sep. 25, 2000, having Ser. No. 09/670,000, and the U.S. Patent Application entitled "Measurement Of Diffracting Structure Using One-Half Of The Non-Zero Diffracted Orders" filed Apr. 27, 2000, having Ser. No. 09/844,559, both of which have the same assignee as the present disclosure and are incorporated herein by reference. Spectrometer 120 may use rigorous coupled wave analysis (RCWA) as described in Ser. No. 09/670,000, or folded rigorous coupled wave analysis as described in Ser. No. 09/844,559 to measure overlay target 100.

As shown in FIG. 12A, spectrometer 120 is similar to a reflectometer, which is well known in the art. Spectrometer 120 includes a polychromatic light source 122 that generates a light beam that is partially reflected by beam splitter 124 along the optical axis 123. The light beam is directed towards a sample 126 having an overlay target, such as target 100, to be measured. Sample 126 may be, e.g., a semiconductor wafer or flat panel display or any other substrate, and is supported by a stage 128, which may be a polar coordinate, i.e., R-θ, stage or an x-y translation stage. Spectrometer 120 includes a rotatable polarizer 130 and a lens 132 (or series of lenses) to polarize and focus the light beam onto the sample 126 at normal incidence. The beam is reflected off sample 126 and the reflected light is transmitted through lens 132 and polarizer 130. A portion of the reflected light is transmitted through beam splitter 124 and is received by a spectrophotometer 134. Spectrophotometer 134 is coupled to processor 136, which analyzes the data provided by spectrophotometer 134. Processor 136 is e.g., a computer with a computer and a computer-usable medium having computer-readable program code embodied therein for causing the computer to determine the overlay error based on the light that is diffracted from the alignment target. Thus, the computer-readable program code causes the computer to calculate the difference between the diffracted light from the two locations and use the difference to determine if the alignment target is aligned. One of ordinary skill in the art can program code necessary to determine alignment in accordance with the present invention in view of the present disclosure. For more information on the general operation of a normal incidence polarized reflectance spectrometer, the reader is referred to Ser. Nos. 09/670,000 and 09/844,559, which are incorporated herein by reference.

Figures 12B, 12C:
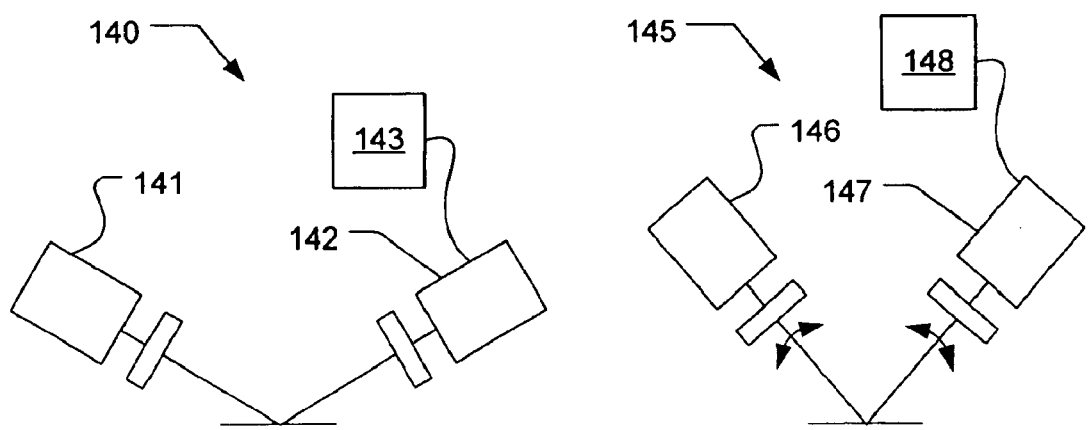

If desired, other measurement devices may be used to measure overlay target 100 including ellipsometry and scatterometry. FIGS. 12B and 12C show block diagrams of a spectroscopic ellipsometer 140 and spectroscopic scatterometer 145. Ellipsometer 140 includes a broadband radiation source 141 and a spectrophotometer 142, which is connected to a processor 143. Spectroscopic scatterometer 145 includes a broadband radiation source 146 and a spectrophotometer 147, which is connected to a processor 148. As indicated by the arrows in FIG. 12C, one or both of broadband radiation source 146 and spectrophotometer 147 are adjustable to alter the angle of incidence. If a non-normal metrology device, such as an ellipsometer or scatterometer is used with the alignment target of the present invention, the azimuthal angle is preferably perpendicular to the lines of the diffraction grating. Alternatively, the azimuthal angle may be oriented at an arbitrary angle with respect to the grating lines. The same azimuthal angle should be used for the measurement at both locations. If desired, different azimuthal angles may be used for the measurement of each location on the alignment target if the angles are perpendicular or anti-parallel to each other. The operation of an ellipsometer 140 and spectroscopic scatterometer 145 is well known to those skilled in the art. Processor 143 and 148 may be similar to processor 136 shown in FIG. 12A.

It should also be understood, that the present invention may use a single wavelength, a plurality of discrete wavelengths, or a continuum of wavelengths. For example, referring to FIG. 8, it can be seen that the measurement is extremely sensitive at wavelengths of approximately 410 nm. Thus, single wavelengths measurements at, e.g., 410 nm may be particularly useful.

Figure 26A:
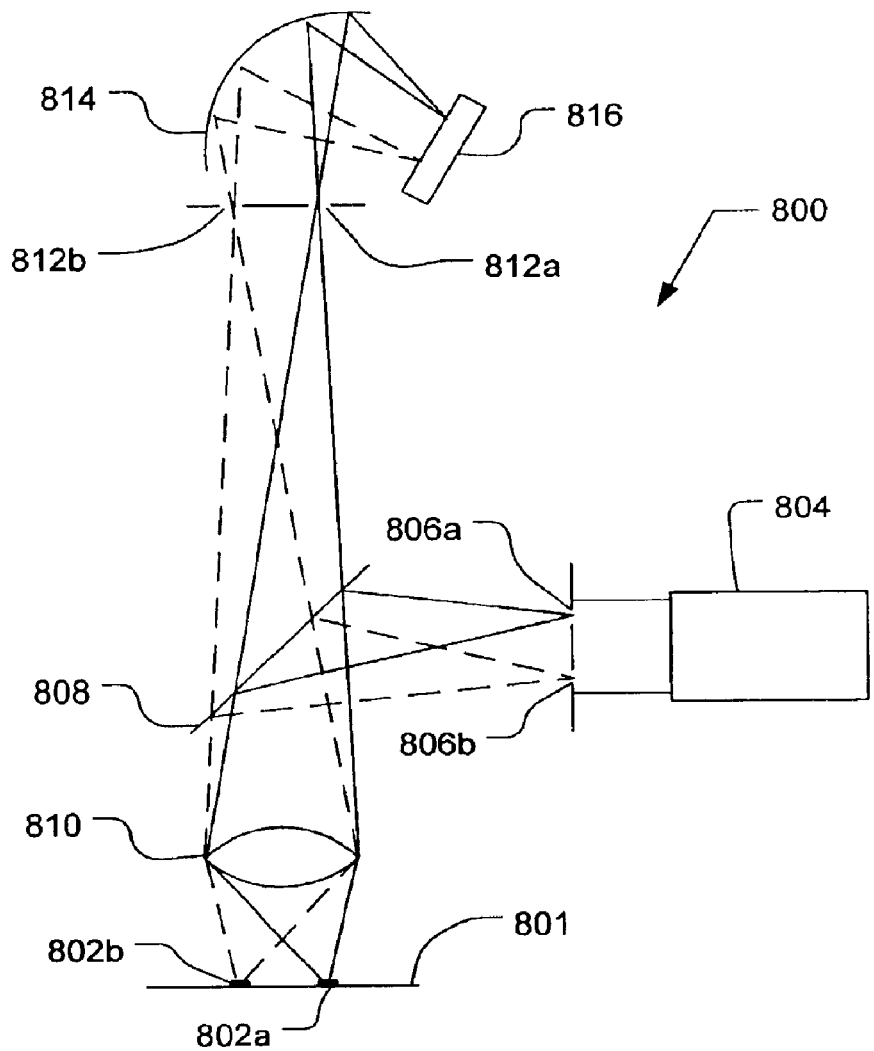
FIGS. 26A and 26B shows a spectrometer in which multiple targets on a sample are illuminated and measured simultaneously.

In one embodiment, the spectrometer apparatus detects the spectra from multiple targets at the same time. For example, as shown in FIG. 26A, a spectrometer 800 in which multiple targets 802a and 802b on a sample 801 are illuminated simultaneously. The spectrometer 800 includes a broadband illumination source 804 that produces light through a number of circular apertures 806a, 806b. As shown in FIG. 26A, two beams are produced that reflect off a beam splitter 808 and are focused by an objective lens 810 to selectively illuminate desired locations, i.e., the two targets 802a, 802b, on the sample 801. The two targets are, e.g., the overlay patterns 102 and 104 shown in FIG. 2.

The light diffracted from the targets 802a, 802b is focused by objective lens 810 onto the spectrometer entrance apertures 812a and 812b after passing through beam splitter 808. The light is incident on an imaging spectrometer grating 814 and is collected by a two-dimensional array detector 816, such as a CCD detector. Thus, the light scattered by targets 802a and 802b is selectively collected. The spectra for each target are dispersed along one dimension of the detector 816. If additional overlay patterns are used, additional beams may be produced with additional circular apertures 806 and with additional spectrometer entrance apertures 812.

Figure 26B:
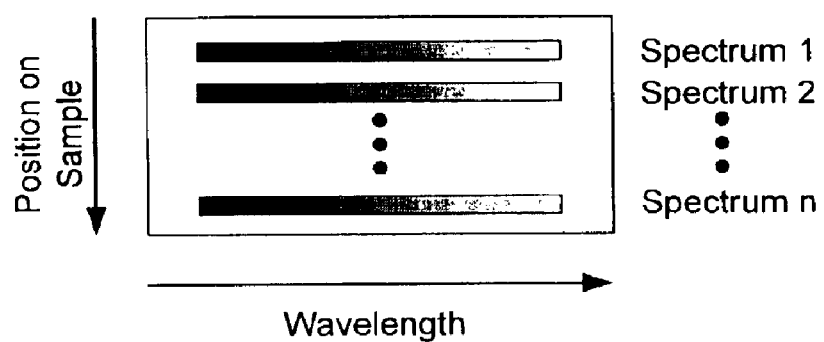

FIG. 26B shows a front view of the detector 816, where the X-axis is wavelength of the spectra and the Y-axis is the position on the sample for each spectrum, i.e., the spectra produced by the first, second, to n targets. The spectra associated with specified locations on the sample are separated along the direction perpendicular to the direction of the spectral dispersion by sufficient distance that light from one location does not leak into the spectrum of another location.

As shown in FIG. 26A, spectrometer 800 works well with an X-Y stage. If an R-θ stage, additional optics such as an image rotator, e.g., a dove prism, may be inserted below the beamsplitter, allowing the image of the sample to be rotated to match the spectrometer and illumination apertures.

Figure 27A:
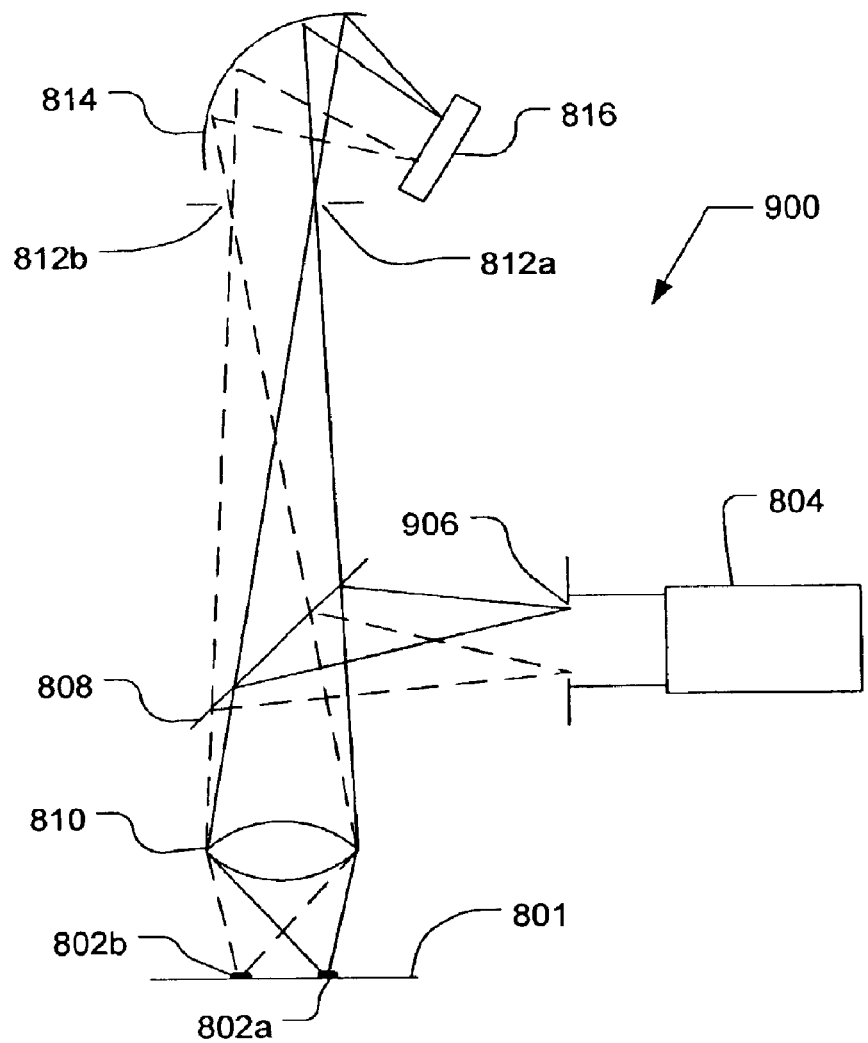
FIGS. 27A and 27B shows another embodiment of a spectrometer in which multiple targets on a sample are illuminated and measured simultaneously.
Figure 27B:
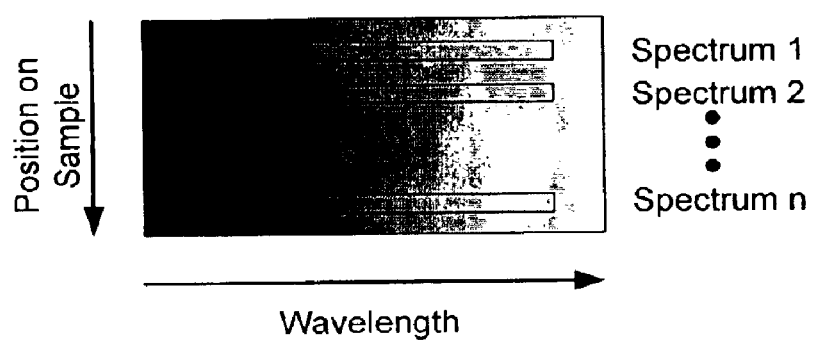

FIGS. 27A and 27B show another embodiment of a spectrometer 900 that may be used to detect the spectra from multiple targets at the same time. As shown in FIG. 27A, spectrometer 900 is similar to spectrometer 800, except that a large illumination slit 906 is used in place of a plurality of aperture slits 806a, 806b in FIG. 26A. Consequently, more area of sample 901 will be illuminated. Spectrum isolation is achieved, as shown in FIG. 27B, by electronically binding only the rows that correspond to each target on the sample. All other light collected is not used.

In general, to measure the alignment error e it is necessary to determine the change in the diffracted light with respect to the change in alignment error. This may be written as follows:

$$\varphi = \frac{\partial R}{\partial e} \quad \text{eq. 3}$$

where R is the measured light, e is the alignment error. The factor φ for an alignment target maybe determined using, e.g., modeling techniques or using additional measurement locations as reference locations. Once the factor φ is determined, the value of the overlay error can then be determined using the following equation.

$$R_1 - R_2 = 2e\varphi \quad \text{eq. 4}$$

where $R_1$ is the measured light from the first measurement location, and $R_2$ is the measured light from the second measurement location.

Figure 13:
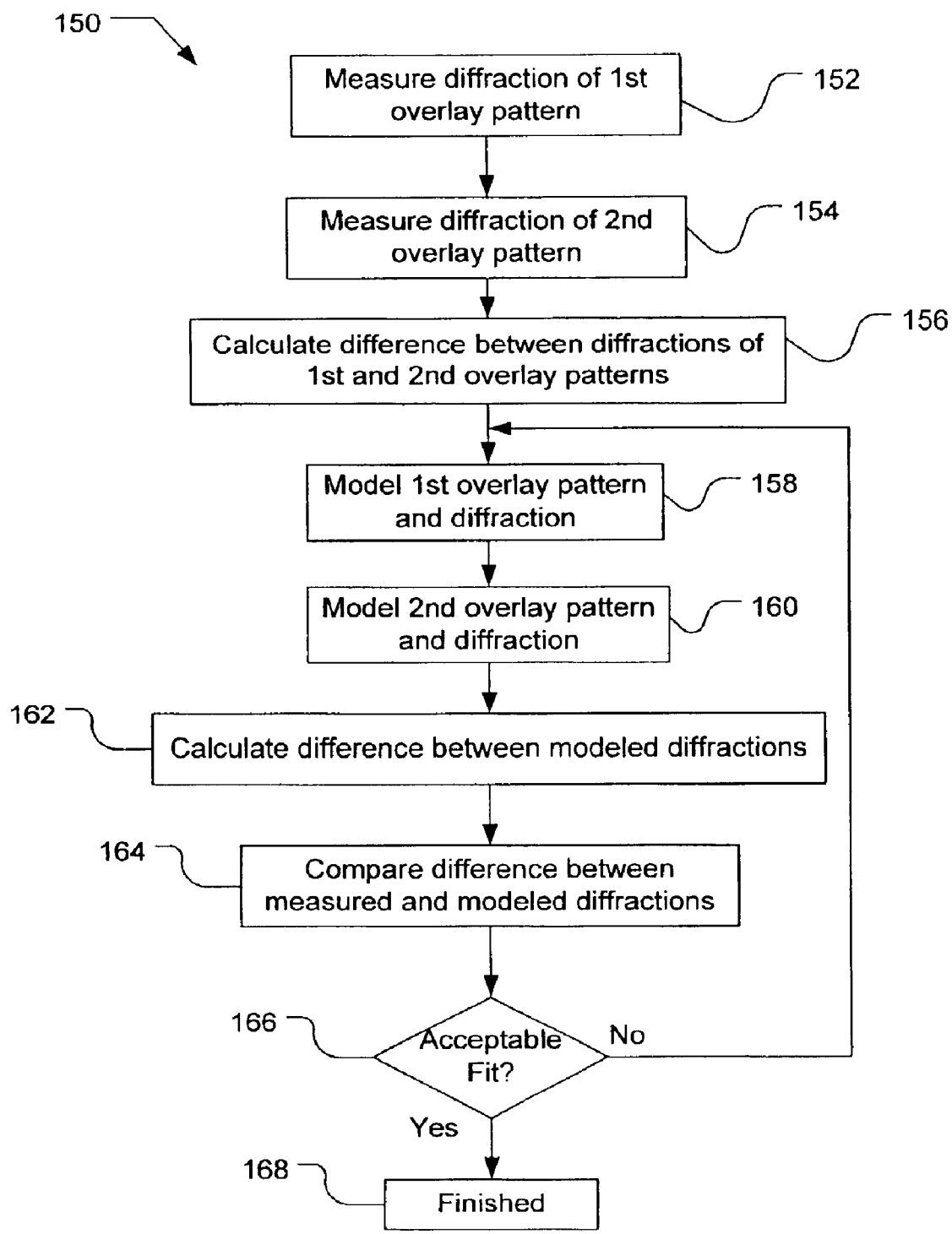
FIG. 13 is a flow chart of a process that may be used to measure alignment target.

FIG. 13 is a flow chart 150 of a modeling process that may be used to measure the alignment error e in alignment target 100, thereby functionally finding φ. Process 150 is similar to that described in Ser. Nos. 09/670,000, 09/844,559, and 09/960,892, which are incorporated herein by reference. The diffraction of the first overlay pattern 102 and the second overlay pattern 104 of alignment target 100 are measured using e.g., a metrology instrument such as that discussed in FIGS. 12A–12C (blocks 152, 154). It should be understood that the term diffraction includes one or more diffractive orders, including the zeroth order. If desired, other types of instruments may be used. Moreover, it should be understood that the overlay patterns 102 and 104 may be measured separately or at the same time. The difference between the diffraction for overlay pattern 102 and 104 is then computed (block 156).

The overlay patterns including the diffraction caused by the overlay patterns are modeled (blocks 158, 160), for example, with the top diffraction grating 108, 118 in the desired positions, i.e., with offsets +D and –D. The modeling may be performed using rigorous coupled wave analysis (RCWA), modal analysis, finite element, finite difference, and other computational electromagnetic techniques. The difference between the modeled diffraction for the two patterns is then computed (block 162). The difference between the measured diffraction and the modeled diffraction is compared (block 164) and if there is an acceptable fit (block 166), according to a predetermined threshold, the process is finished (block 168) with the modeled alignment target accurately describing the physical overlay target. Thus, the top diffraction gratings 108, 118 are in the desired positions, i.e., +D and –D and there is no overlay error.

If the fit is not acceptable (block 166), the process is returned to modeling the overlay patterns (blocks 158, 160) and diffraction with an adjustment to at least the overlay error using e.g., the Levenberg-Marquardt non-linear multivariate regression process. The regression analysis may also adjustment the, linewidth (top and bottom), layer thicknesses, sidewall angles of the grating lines, and pitch (both top and bottom). If desired, detailed line-profiles rather than simple sidewall angles may be used, however, the computation cost will be increased. The modeled diffraction for the overlay patterns is again calculated (162) and compared to the measured diffraction (block 164). If the fit is acceptable (block 166), the process is finished (block 168), with the overlay error known as it was used to model the overlay patterns. If the fit is not acceptable (block 166) the adjustable parameter is again adjusted and the process continues until an acceptable fit is found.

Alternatively, each location can be individually modeled until an acceptable fit is found. The average is then generated for the alignment deviation between the periodic pattern on the top and bottom elements for each modeled location.

Because modeling overlay patterns, e.g., using RCWA, can be time consuming, a library of modeled overlay patterns and the differences between the modeled diffraction may be generated prior to measurement of the alignment target 100. Thus, blocks 158, 160, and 162 of process 150 are performed to produce a library of calculated differences in modeled diffraction. The measured diffraction calculated in block 156 can then be compared to the library of modeled diffraction to quickly determine the overlay error.

Alternatively, the overlay patterns may be physically modeled and measured. Thus, the desired patterns are physically produced with a number of different overlay errors. The physically modeled overlay patterns can then measured to generate an accurate set of diffraction data to compare to the measured diffraction of the pattern under test.

In another embodiment, an image of the overlay patterns is generated to form moiré fringes. The edge or center of the bands in the moiré fringes may then be detected using a conventional edge detector. By comparing the relative positions of the bands in the moiré fringes with respect to each other, the alignment may then be determined. The amount of overlay error may be determined, e.g., by calculating the separation between the bands in the moiréfringe patterns.

As discussed above, another way of determining the alignment error e is by using additional measurement locations as reference locations to determine the factor φ. It should be understood that the reference locations may be located near the other measurement locations or if desired, the reference locations may be relatively distant from the measurement locations. For example, if desired, one set of reference locations that are located in one place on a substrate may be with multiple sets of measurement locations that are located in various places on the substrate.

Figure 1B:
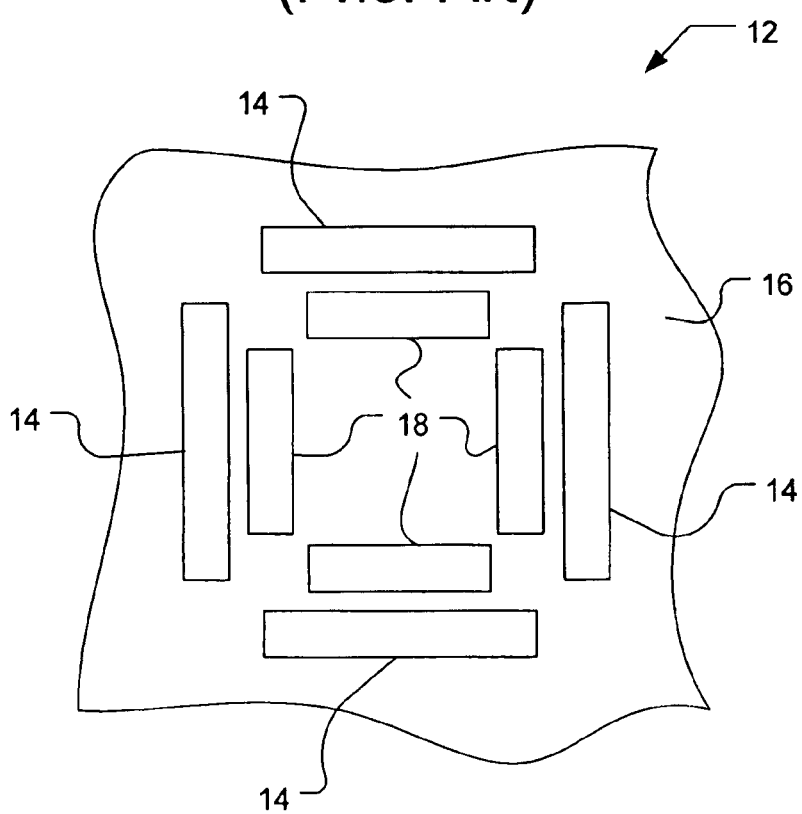
Figure 14:
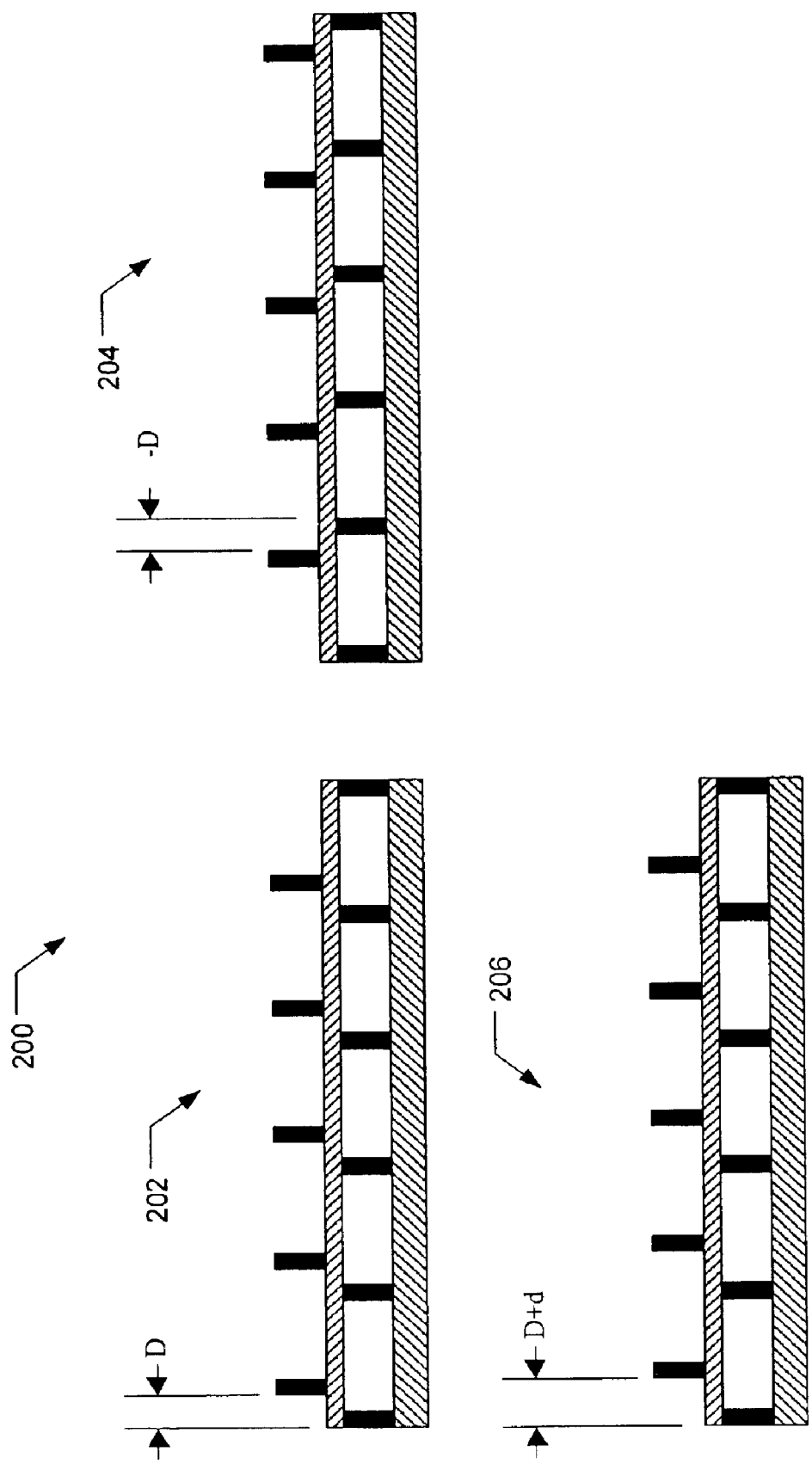
FIG. 14 shows an alignment target, in accordance with another embodiment of the present invention.

FIG. 14 shows an alignment target 200 in accordance with one embodiment of the present invention. Alignment target 200 is similar to alignment target 100, shown in FIG. 1, except three locations, referred to as overlay patterns, on the alignment target 200 are provided. Overlay patterns 202 and 204 are similar to the overlay patterns 102, 104 in alignment target 100. A designed in offset of +D and –D is used in overlay patterns 202 and 204. As shown in FIG. 14, however, alignment target 200 includes a third location, i.e., overlay pattern 206, that is similar to overlay pattern 202, i.e., with a designed in offset of +D, but overlay pattern 206 has an additional reference offset d. Thus, the total offset, i.e., designed in offset plus the reference offset, for overlay pattern 206 is D+d.

The reference offset d in overlay pattern 206 is advantageously used to calculate the overlay error and eliminates the need to model the overlay patterns. The reference offset d can be 1% to 15% of the pitch, e.g., 5% of the pitch, while the designed in offset D is, as described above, 5% to 40% of the pitch, and more particularly 25%. However, if too small, the reference offset d will be lost in the noise, while if too large, the reference offset may lose linearity. The reference offset d can be in the same or opposite direction of the designed in offset D. Of course, the precise magnitudes and directions of designed in offset D and reference offset d may be varied to suit the particular materials and dimensions of the overlay patterns, along with the wavelength or wavelengths of light used by the metrology equipment.

Thus, using alignment target 200, the diffractions of overlay patterns 202, 204, and 206 are measured, e.g. using the metrology instruments described in FIGS. 12A—12C. The amount of overlay error e may then be calculated as follows:

$$e = \frac{R1 - R2}{R3 - R1} \cdot \frac{d}{2} \qquad \text{eq. 5}$$

where R1, R2, R3 are the respective diffractions of overlay patterns 202, 204, and 206, and d is the reference offset between overlay patterns 202 and 206. Consequently, the overlay error e of alignment target 3 can be quickly measured and calculated using equation 5 without the need to model the overlay patterns. The calculated overlay error e is particularly linear when the result is within a range of approximately ±d.

In general, when a plurality of wavelengths are used, equation 5 must be solved for the entire spectra. As is well known in the art, this may be accomplished by optimizing equation 4, resulting in:

$$e = \frac{\sum_i \varphi_i \cdot f_i}{\sum_i \varphi_i^2} \qquad \text{eq. 6}$$

where f is (R1–R2)*d/2, and i is the number of the wavelength of the spectra. Thus, applying equation 6 to equation 5, the alignment error is determined as:

$$e = \frac{\sum_i (R_3 - R_1)_i \cdot \frac{(R_1 - R_2)_i \cdot D}{2}}{\sum_i (R_3 - R_1)_i^2} \qquad \text{eq. 7}$$

Figure 15:
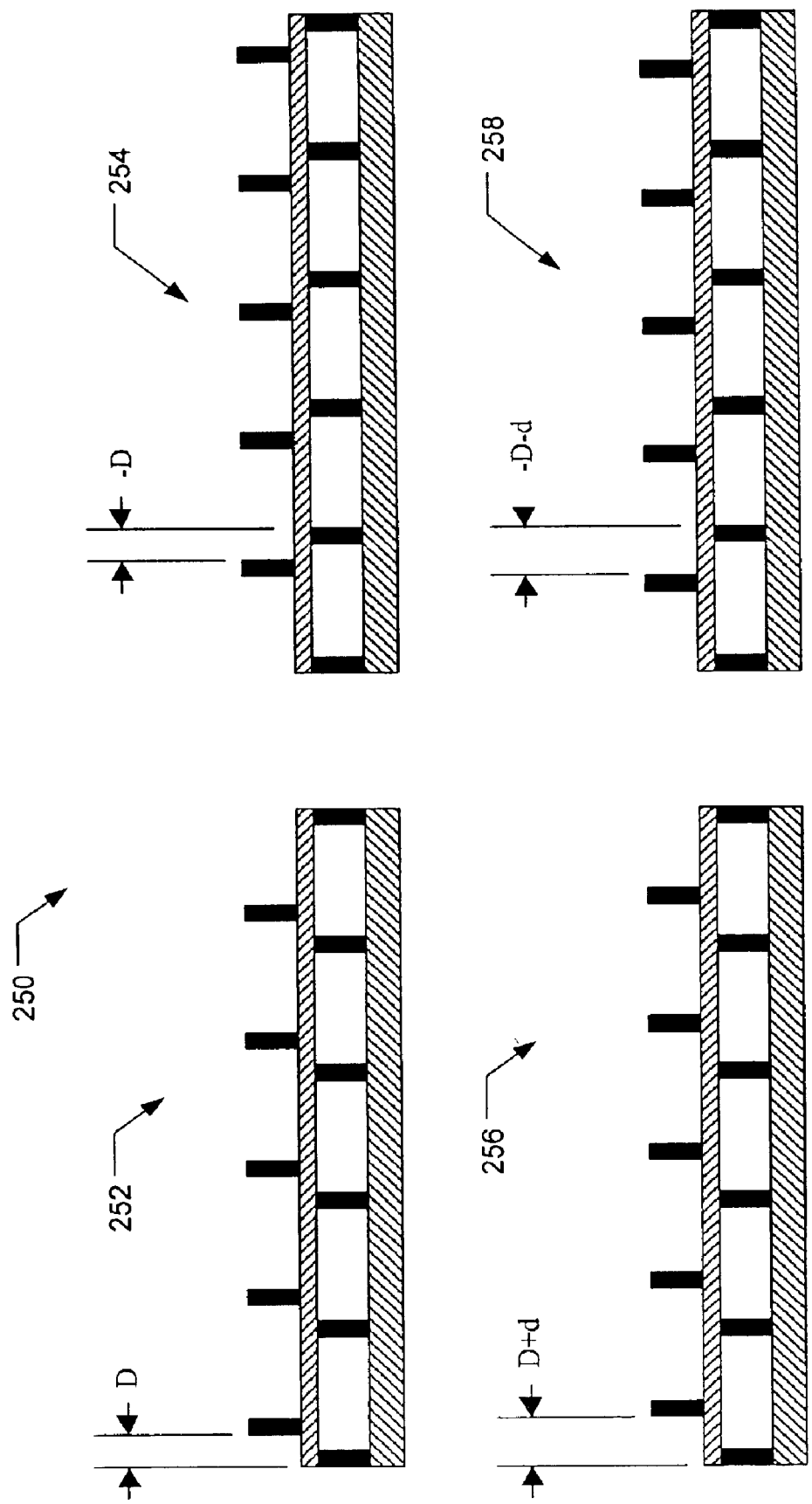
FIG. 15 shows an alignment target, in accordance with another embodiment of the present invention.

FIG. 15 shows an alignment target 250 in accordance with another embodiment of the present invention. Alignment target 250 is similar to alignment targets 100 and 200, shown in FIGS. 1 and 14, except that four locations, referred to as overlay patterns, are used in alignment target 250. Overlay patterns 252 and 254 include designed in offsets of +D and –D and are thus similar to the overlay patterns 102, 104 in alignment target 100 and overlay patterns 202 and 204. Alignment target 205 includes two additional overlay patterns 256, 258 each of which includes a reference offset of magnitude d. Overlay pattern 256 has a reference offset of +d, while overlay patterns 258 has a reference offset of –d. Thus, overlay pattern 258 is mirror image with overlay pattern 256, i.e., the patterns have offset that are the same total magnitude |D+d|, but are in opposite directions. Again, the magnitude of the reference offset d can be fairly small, ±1% to 15%, e.g., ±5%, of the pitch. Of course, the precise magnitude and direction of designed in offset D and reference offset d may be varied to suit the particular materials and dimensions of the overlay patterns, along with the wavelength or wavelengths of light used by the metrology equipment.

Using alignment target 250, the diffractions of overlay patterns 252, 254, 256, and 258 are measured, e.g. using the metrology instruments described in FIGS. 12A–12C. The amount of overlay error e may then be calculated as follows:

$$e = \frac{(R1 - R2) + (R3 - R4)}{(R3 - R1) + (R4 - R2)} \cdot \frac{d}{2} \qquad \text{eq. 8}$$

where R1, R2, R3, and R4 are the respective diffractions of overlay patterns 252, 254, 256, and 258 and d is the absolute value of the reference offset between overlay patterns 252 and 256 and between overlay patterns 254 and 258. Consequently, the overlay error e of alignment target 250 can be quickly measured and calculated using equation 8 without the need to model the overlay patterns. Moreover, because an additional mirror imaged overlay pattern 258 is included, non-linearities in the response are compensated for. Consequently, alignment target 250 is less susceptible to errors included by local variations in target parameters, such as sub-layer thickness. Moreover, the signal to noise ratio is improved with alignment target 250 because each measured R is used for both measurement and reference.

Figure 16:
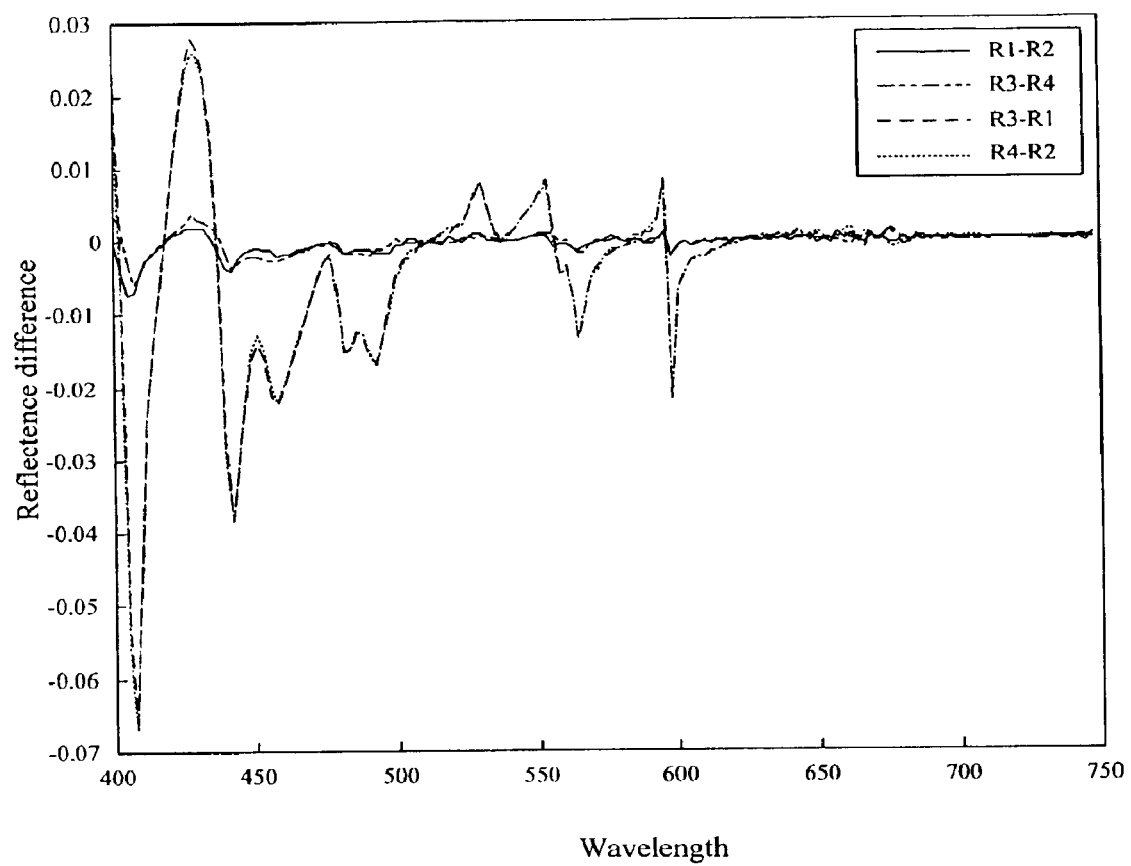
FIG. 16 is a graph showing the difference in the spectral reflectances of the overlay patterns in FIG. 15.

FIG. 16 is a graph showing the difference in the spectral reflectances R1, R2, R3, and R4, where there is an overlay error e of 1 nm and the designed in offset D is 90 nm, the reference offset d is 20 nm and the pitch is 400 nm. As can be seen in FIG. 16, the difference (R1-R2) and (R3-R4) is relatively small as that difference is equivalent to the overlay error, i.e., 1 nm. The difference (R3-R1) and (R4-R2), however, are larger as they are equivalent to the reference offset d of 20 nm.

Figure 17A:
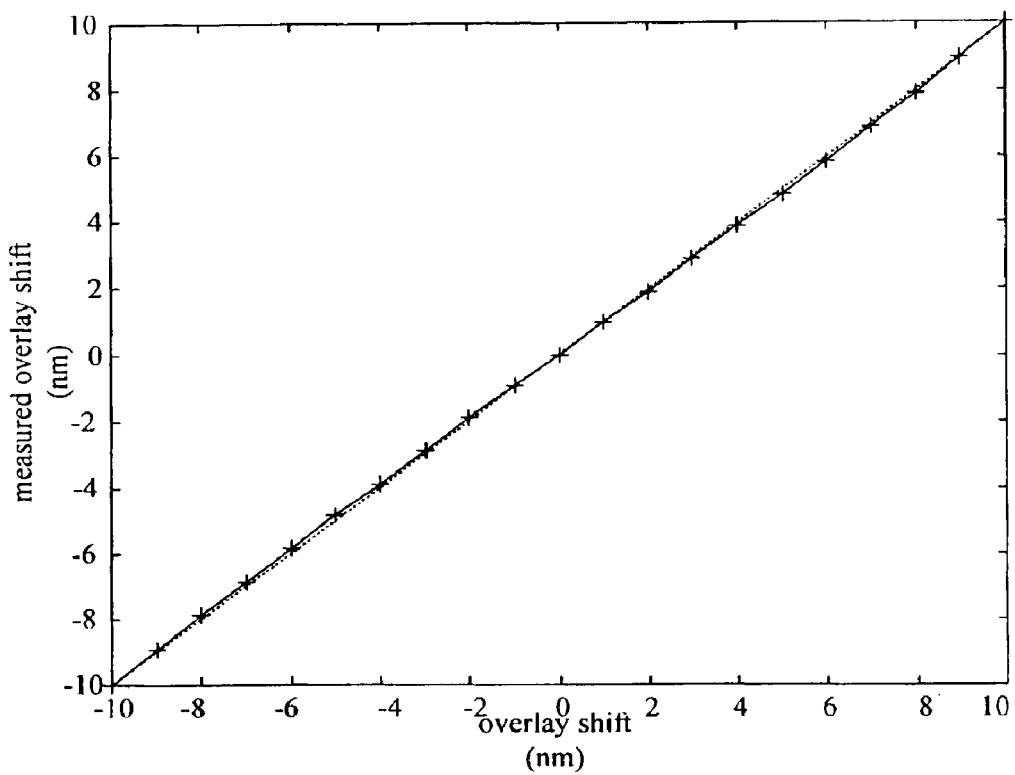
FIGS. 17A and 17B show the accuracy of the measurement using the alignment target of FIG. 15, wherein the actual overlay shift is along the X axis and the measured overlay shift along the Y axis.
Figure 17B:
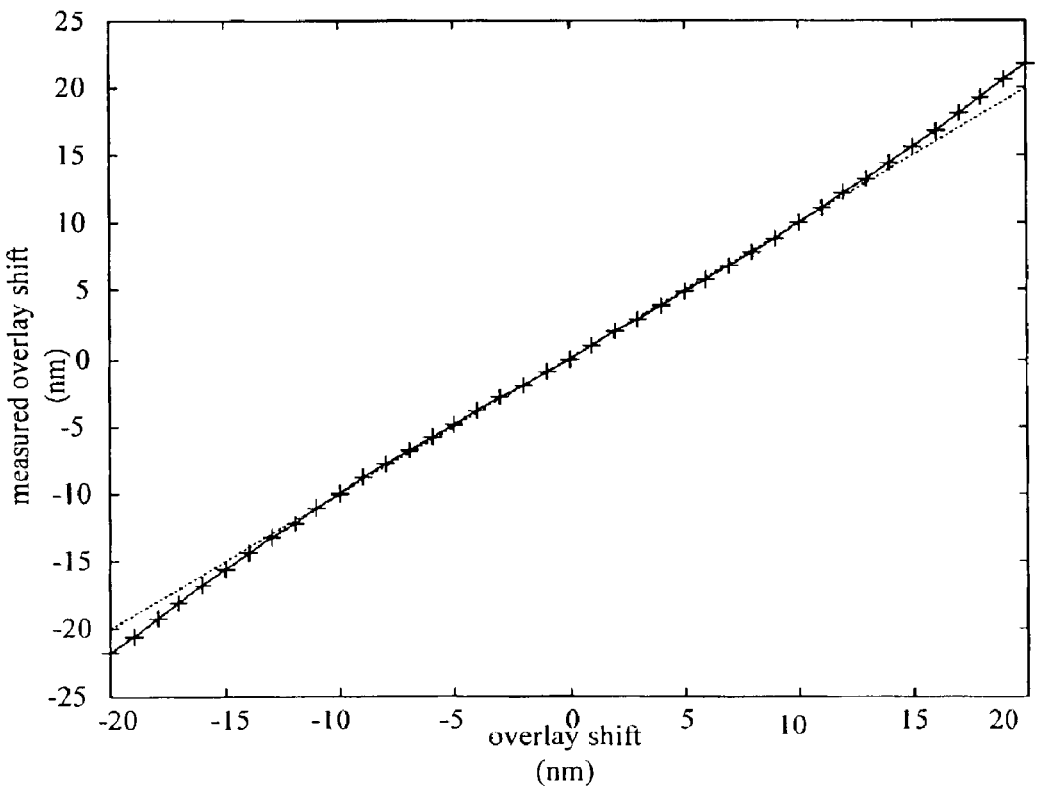

FIGS. 17A and 17B show the accuracy of the measurement without correction for non-linearity using the alignment target 250, where the actual overlay shift is along the X axis and the measured overlay shift is along the Y axis, the designed in offset D is 90 nm, the reference offset d is 20 nm and the pitch is 400 nm. The broken lines in FIGS. 17A and 17B show the ideal results, while the cross hatched lines show the measured results. As can be seen in FIG. 17A, from ±10 nm, the measured overlay shift is near ideal. The repeatability of the measured results, as calculated by MonteCarlo simulation, has 3 sigma=0.016 nm, with a maximum offset (between ±10 nm) of 0.143 nm and a maximum relative error of 3.8%.

FIG. 17B shows that from −20 nm to −10 nm and from +10 nm to +20 nm, small non-linearities appear in the measured overlay shift. These non-linearities may be corrected, e.g., using modeling techniques or by generating a polynomial correction factor. Outside the range of approximately ±20 nm in FIG. 17B, the non-linearities becomes large and correction becomes difficult. It should be understood that the range of linearity, correctable non-linearity, and uncorrectable non-linearity may vary and is dependent upon many factors, such as the size and pitch of the periodic patterns.

One technique for correction non-linearities uses modeling to generate a correction factor. For example, one method uses RCWA to calculate the alignment error using, e.g., equations 5 to 8, for a number of different alignment errors. Based on the calculation using RCWA (or other modeling technique), a calibration curve can be generated.

Figure 35:
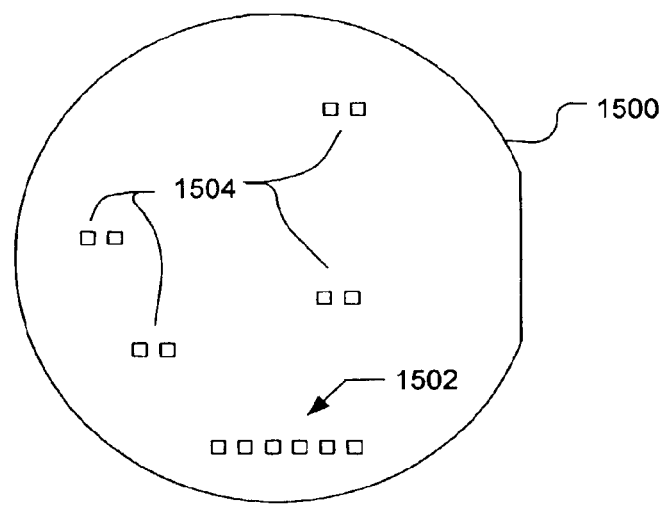
FIG. 35 shows a substrate with a number of reference pads in one location and measurement pads on other locations.

Alternatively, to correct non-linearities, a set of reference pads may be physically provided on each substrate to be measured. FIG. 35 shows a substrate 1500 with a number of reference pads 1502 in one location. Substrate 1500 also includes a number of measurement pads 1504 distributed in various places on substrate 1500. While six reference pads 1502 are shown in FIG. 35, more or fewer may be used. It should be understood that substrate 1500 is shown for exemplary purposes, and in practice the various reference pads and measurement pads may be placed in scribe lines between dies, in strategic locations within dies, or may be part of the circuit design within the die.

Figure 36:
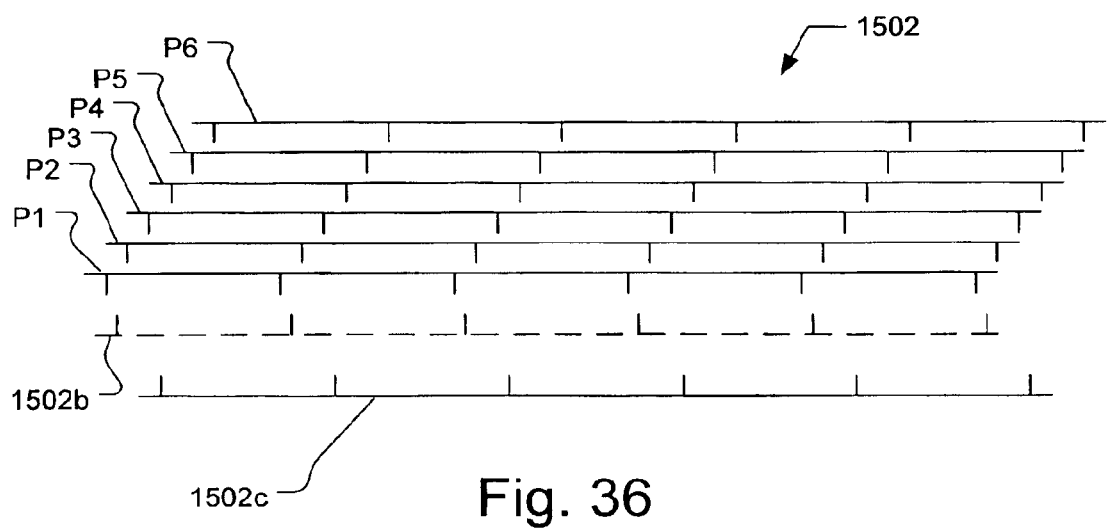
FIG. 36 shows a schematic view of the reference pads in FIG. 35.

FIG. 36 shows a schematic view of reference pads 1502, which have different designed in offsets from, e.g., 0 to 0.5 pitch between the top periodic pattern and the bottom periodic pattern 1502b, which is shown with a broken line to indicate the patterns ideal position, i.e., no alignment error. FIG. 36 shows only one bottom periodic pattern 1502b and has the top periodic patterns overlapping to illustrate the designated in offset. In practice, each reference pad 1502 will be separate. The designed in offset for the pads P1, P2, P3, . . . P6 may be, e.g., −10 nm, 10 nm, 30 nm, . . . 90 nm respectively. Of course, different ranges and a different number of reference pads, e.g., ten, may be used if desired.

To determine a correction factor for non-linearity, the alignment error e is determined using the reference pads 1502 using, e.g., RCWA or equations 5 to 8. The alignment error e is illustrated by the bottom diffraction pattern 1502c, which is shown with a solid line to indicate that that is its actual position.

Thus, the offset difference between pads P2 and P1, i.e., P2-P1 is 10 nm, and between pads P3 and P1, i.e., P3-P1, is 20 nm, etc. A calculated shift can then be calculated as shown in equation 5, for each offset difference. The departure from 1:1 as a function of shift can then be calculated as the calibration curve. In one embodiment, the reference pads may be cover a larger range, such as from −0.5 to 0.5 pitch to compensate for any alignment error present that exceeds the correctable non-linear range. Once the alignment error e is determined, the position of the bottom periodic pattern 1502c with respect to the top periodic patterns is known. For example, in FIG. 36 the alignment error e causes the bottom periodic pattern 1502c to be aligned between pads P3 and P4. By recalculating the alignment error e using pads centered around the periodic pattern 1502c, e.g., using pads 3 and 4, pads 2 and 5, and pads 1 and 6, the departure from a 1:1 correlation can be calculated, which is the correction factor to be used to correct for any non-linearities.

In addition, if desired, with judicious values for the designed in offsets of the reference pads 1502, the reference pads 1502 may be used as the reference measurement locations of, e.g., FIGS. 14 and 15.

Thus, as can be seen in FIGS. 17A and 17B, the present invention may be used to measure the alignment error down to a fraction of a nanometer. The current industry standard is approximately 15 nm. Thus, the present invention provides large improvement compared to current technology.

Figure 18:
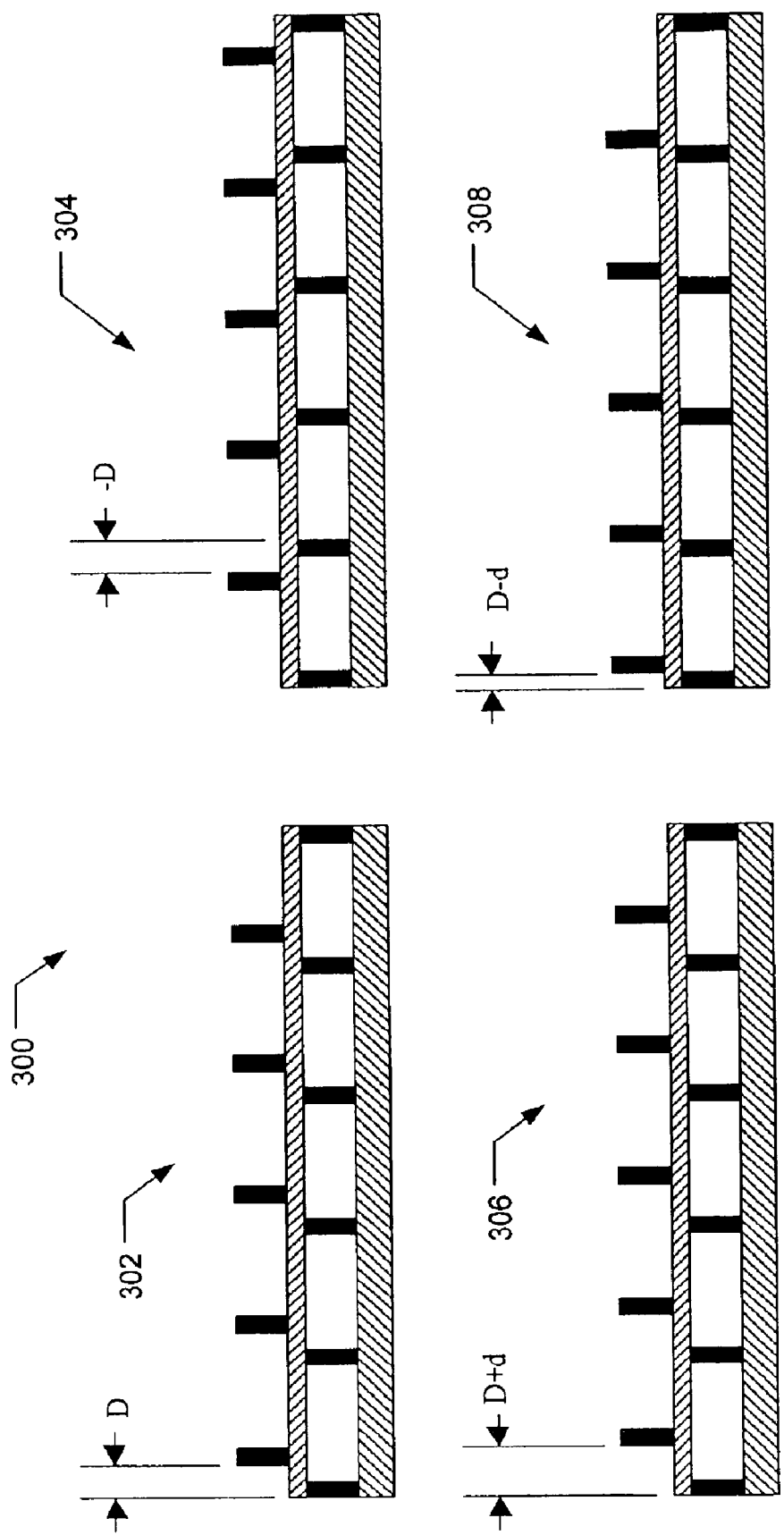
FIG. 18 shows an alignment target, in accordance with another embodiment of the present invention.

FIG. 18 shows an alignment target 300 in accordance with another embodiment of the present invention. Alignment target 300 includes four locations, e.g., overlay patterns 302, 304, 306, and 308, and is similar to alignment target 250, shown in FIGS. 15, except that the fourth overlay pattern 308 has a designed in offset +D and a reference offset −d. Thus, overlay pattern 308 is similar to overlay pattern 306, except the reference offset in overlay pattern 308 is opposite that found in overlay pattern 306.

Using alignment target 300, the diffraction of overlay patterns 302, 304, 306 and 308 are measured, e.g. using the metrology instruments described in FIGS. 12A–12C. The amount of overlay error e may then be calculated as follows:

$$e = \frac{R1 - R2}{(R3 - R1) - (R4 - R1)} \cdot d \qquad \text{eq. 9}$$

where R1, R2, R3, and R4 are the respective diffractions of overlay patterns 302, 304, 306, and 308 and d is the absolute value of the reference offset between overlay patterns 302 and 306 and between 302 and 308. Consequently, the overlay error e of alignment target 250 can be quickly measured and calculated using equation 9 without the need to model the overlay patterns.

FIG. 19 is another alignment target 400 that may be used in accordance with an embodiment of the present invention. Alignment target 400 includes a bottom periodic pattern, e.g., diffraction grating 402 and a top periodic pattern, e.g., diffraction grating 404. The bottom diffraction grating 402 has a pitch P1. The top diffraction grating 404 has a pitch P2 that is equal to pitch P1 plus an additional term δ, which is a small fraction of pitch P1, i.e., P2=P1+δ. The linear dimension L perpendicular to the grating lines of alignment target 400 should be sufficient to ensure that all phases between 0 to 360 degrees is included, i.e., $$L = \left(\frac{P1}{\delta} + 1\right) \cdot P1. \qquad \text{eq. 10}$$

Consequently, the overlay pattern of alignment target 400 is mirror imaged around a line 406 due to the variation in pitch. In other words, the alignment of the top diffraction pattern 404 with the bottom diffraction pattern 402 is designed to be mirror imaged at the same lateral distance on either side of line 406. Thus, similar to alignment target 400, if an overlay error e is inserted, the variation in alignment at the locations on the alignment target 400 at the same lateral distance on either side of line 406 will be 2e. FIG. 19 shows line 406 in the center of alignment target 400. It should be understood, however, that the length L of alignment target 400 need be longer than is necessary to include all phases between 0 and 360 degrees, in which case, the line 406 may not be located in the center of the lateral dimension of alignment target 400.

Any appropriate metrology instrument, such as those described in FIGS. 12A–12C, may be used to measure at least two locations on the alignment target 400. The diameter of the probe spot used to measure alignment target 400, however, should have a lateral dimension, i.e., in the direction perpendicular to the grating lines, that is sufficiently small that the variation in the lateral offset between the lines of the bottom diffraction grating 402 and the top diffraction grating 404 within the probe spot is small compared to pitch P1. The measurement of diffracted light, i.e., the $0^{th}$ order and/or any number of higher order diffracted beams, is made at least at two locations on the alignment target 400, where there is a designed in offset of approximately equal magnitude but in opposite directions. Thus, for example, if the length L of the pattern includes a 360 degree cycle of phases, the two locations on the alignment target 400 are measured at equal distances from the respective ends, or alternatively from the center of the pattern. Alternatively, a plurality of lateral positions along the alignment target 400 may be measured. If desired, a third location on the pattern may be measured as a reference offset to calculate the alignment error similar to that described above. Alternatively, multiple locations may be measured along the pattern.

The measured diffraction at the two locations is then compared, e.g., subtracted. Variations in the diffraction as a function of lateral position along the alignment target 400 are characteristic of the lateral offset error between the top diffraction grating 404 and the bottom diffraction grating 406.

In one embodiment, the alignment target 400 may be used as the reference pad 1502 shown in FIGS. 35 and 36. The designed in offset at any location on alignment target 400 is known as a function of distance of that location from the end of the alignment target. The alignment target 400 may be measured at various locations (or scanned) to obtain reference measurements at various designed in offsets.

FIG. 20 is another alignment target 450, similar to alignment target 400 shown in FIG. 19, but that includes two overlay patterns 452 and 462, in accordance with an embodiment of the present invention. Overlay pattern 452 includes a bottom periodic pattern, e.g., diffraction grating 454, and a top periodic pattern, e.g., diffraction grating 456. The bottom diffraction grating 454 has a pitch P1. The top diffraction grating 456, similar to alignment target 400 in FIG. 19, has a pitch P2 that is equal to pitch P1 plus an additional term δ, which is a small fraction of pitch P1, i.e., P2=P1+δ. The linear dimension L perpendicular to the grating lines of alignment target 450 for overlay pattern 452 should be sufficient to ensure that all phases between 0 and 360 degrees.

Overlay pattern 462 includes a bottom diffraction grating 464 and a top diffraction grating 466. The bottom diffraction grating 464 also has a pitch P1. The top diffraction grating 466 has a pitch P3 that is equal to pitch P1 minus the additional term δ, i.e., P3=P1−δ. The linear dimension L perpendicular to the grating lines of alignment target 450 for overlay pattern 462 should be sufficient to ensure that all phases between 0 and 360 degrees.

Similar to alignment target 400, any appropriate metrology instrument, such as those described in FIGS. 12A–12C, may be used to measure the alignment target 400, but the diameter of the probe spot should have a lateral dimension that is sufficiently small that the variation in the lateral offset between the lines of the bottom diffraction gratings 454, 464 and the top diffraction gratings 456, 466 within the probe spot is small compared to pitch P1. The diffraction from the overlay pattern 452 and overlay pattern 454 is measured, either simultaneously or separately. The resulting measured diffraction as a function of lateral position of overlay pattern 452 and 462 is then compared, e.g., subtracted to provide the lateral offset error.

In another embodiment, the pitches of one periodic pattern with respect to another may be integer multiples. Thus, the pitches for top and bottom periodic patterns or the pitches of adjacent locations may be integer multiples.

FIG. 21 is another alignment target 500, that includes overlay pattern 502 and overlay pattern 512, which is a mirror image of overlay pattern 502. Overlay pattern 502 includes a bottom diffraction grating 504 and a top diffraction grating 506. The bottom diffraction grating 504 has a pitch P1 and the top diffraction grating 506 has a pitch P2 that is equal to pitch P1 plus an additional term δ, which is a small fraction of pitch P1, i.e., P2=P1+δ. The linear dimension L perpendicular to the grating lines of alignment target 500 for overlay pattern 502 should be sufficient to ensure that all phases between 0 and 360 degrees. The second overlay pattern 512 of alignment target 500 includes a bottom diffraction grating 514 that has pitch P2 and a top diffraction grating 516 that has pitch P1. The measurement of the overlay error using alignment target 500 is similar to that described in reference to alignment target 450.

Additionally, if desired, moiré fringe patterns may be used to measure the alignment of the two elements. The alignment target includes periodic patterns with different periodicities to produce the moiré fringe patterns. In operation, the incident radiation reacts with the alignment target at least at two locations. After reacting with the alignment target, that radiation is detected. The moiré patterns produced at the different locations are imaged and compared to determine the amount of misalignment between the elements.

Figure 22A:
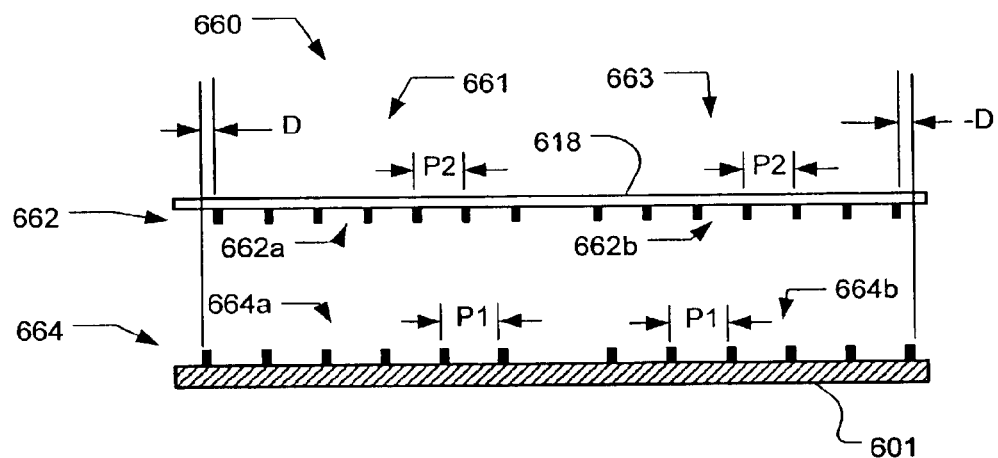
FIG. 22A shows a cross-sectional view of an alignment target that may be used to produce moiré fringe patterns.

FIG. 22A shows a cross-sectional view of an alignment target 660 that may be used to produce moiré fringe patterns. As discussed in reference to FIG. 2, alignment target 660 includes two locations, referred to as overlay patterns 661, 663, where there is a designed in offset of equal magnitude but in opposite directions. Alignment target 660 includes a periodic pattern on each element, e.g., a diffraction grating 662 on the reference mask 618 and diffraction grating 664 on the substrate 601 (which includes some layer on the substrate). The top diffraction gratings 662 may include two separate diffraction gratings 662a and 662b or may be a single continuous grating. The bottom diffraction gratings 664 may also include two separate diffraction gratings 664a and 664b or may be a single continuous diffraction grating. As shown in FIG. 22A, the top diffraction gratings 662a and 662b are on one element 618, while the bottom diffraction gratings 664a and 664b are on another element 601. The two elements 601 and 618 need not be touching as shown in FIG. 22A, but should be near to each other, e.g., approximately 10 μm.

When properly aligned, top diffraction grating 662a will be offset by an amount +D from the bottom diffraction grating 664a at one location, i.e., at the end of the periodic pattern, and the top diffraction grating 662b will be offset by an amount −D from the diffraction grating 664b at another location, i.e., at the other end of the periodic pattern. Additionally, bottom diffraction gratings 664a, 664b and top diffraction gratings 662a, 662b have difference pitches. For example, bottom diffraction gratings 664a, 664b have a pitch of P1, while the top diffraction gratings 662a, 662b have a pitch P2 that is equal to pitch P1 plus an additional term δ, i.e., P2=P1+δ. The difference in pitch may be, e.g., 10 percent, or any other appropriate amount. Consequently, when imaged overlay patterns 661 and 663 will produce moiré fringe patterns.

The use of moiré fringe patterns in metrology is described in U.S. Pat. No. 5,216,257, which is incorporated herein by reference. As described in U.S. Pat. No. 5,216,257, however, a single measurement from a top diffraction pattern and bottom diffraction pattern was used. U.S. Pat. No. 5,216,257 teaches that after deposition and development, the single resultant moiré fringe pattern can be observed and measured on the wafer structure. The overlay error can then be determined by the displacement of the centerline of the fringe from the centerline of the grating structure.

In accordance with the present invention, however, the measurement of the alignment between element 601 and element 618 using at least two moiré fringes produced by both overlay patterns 661, 663. The two moiré fringes are compared to each other to determine if the elements are in alignment. When there is no alignment error, the moiré fringes produced by overlay patterns 661 and 663 will be the same because the overlay patterns are symmetrical. However, if there is an alignment error, the error will create an asymmetry between overlay patterns 661 and 663. For example an alignment error +e will change the magnitude of the offset of overlay pattern 661 by |D+e|, while changing the magnitude of the offset of overlay pattern 663 by |D−e|. Thus, the moiré fringes produced by the asymmetrical overlay patterns will be different. By calculating the difference between the moiré fringes produced by overlay patterns 661 and 663, the presence and general magnitude of any alignment error may be quickly and accurately determined.

Figures 22B, 22C:
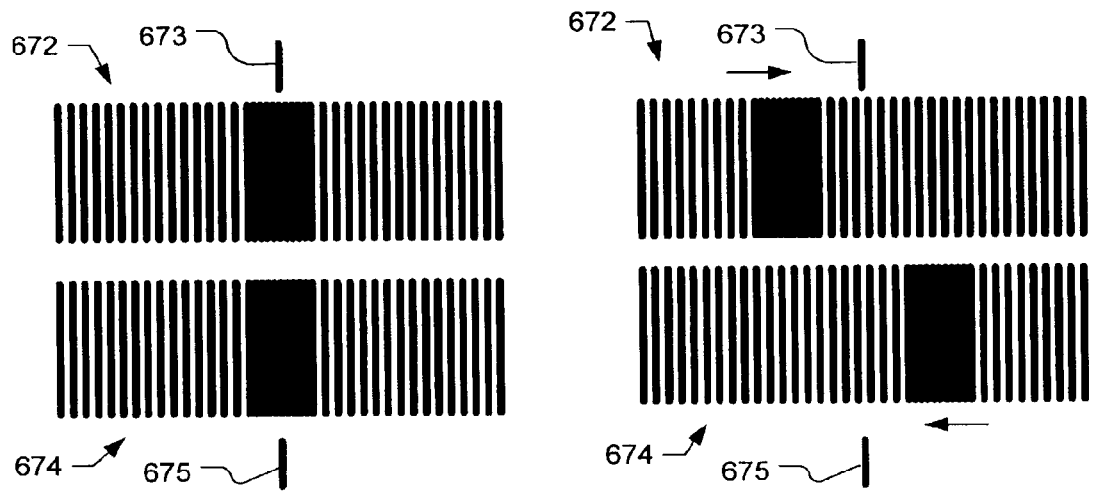
FIGS. 22B and 22C show examples of moiré fringes produced by overlay patterns in an alignment target when the elements are in and out of alignment, respectively.

FIG. 22B shows an example of moiré fringes 672, 674 produced by overlay patterns 661 and 663 when the elements 601 and 618 are in alignment. As can be seen, the bands the moiré fringes are aligned with each other. Alternatively, the bands may be viewed as being in the same relative position with respect to a reference point, e.g., center lines 673, 675. FIG. 22C shows an example of moiré fringes 672, 674 produced by overlay patterns 661 and 663 when the elements 601 and 618 are not in alignment. As can be seen, the bands in the moiré fringes 672, 674 are no longer aligned with respect to each other, or alternatively, the bands do not have the same relative position with respect to the reference point, e.g., center lines 673, 675. By measuring the separation between the bands, e.g., detecting the edge of the bands and determining the distance between the bands, the alignment error may be determined.

It should be understood that in accordance with the present invention, the position of the bands may be determined relative to each other or relative to some reference point. The reference point need not be a center line.

It should also be understood, that the alignment target may include additional locations, e.g., three or four overlay patterns as described above to calculate the amount of misalignment.

Figure 23A:
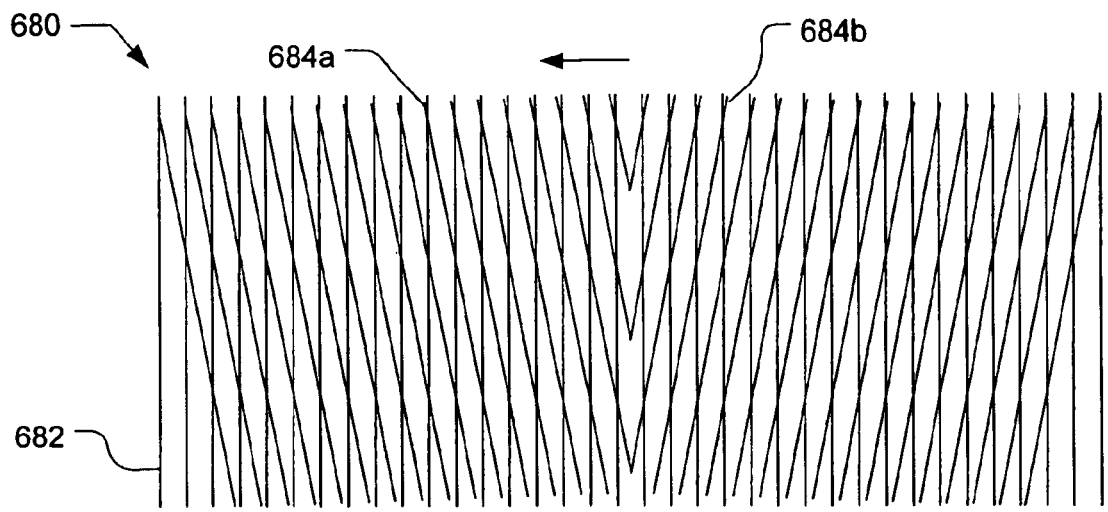
FIG. 23A shows a cross-sectional view of another alignment target that may be used to produce moiré fringe patterns.

FIG. 23A is another example of alignment target 680 that includes a designed in offset and that may be used to produce moiréfringe patterns. As shown in FIG. 23A, the top periodic patterns 684a and 684b are offset from the bottom periodic pattern 682 by an angle, i.e., the top periodic patterns 684a and 684b are rotated with respect to the bottom periodic pattern 682. The top periodic patterns 684a and 684b are rotated in opposite directions. As shown in FIG. 23A, the top periodic patterns 684a, 684b may be touching or if desired there may a separation between them.

Figure 23B:
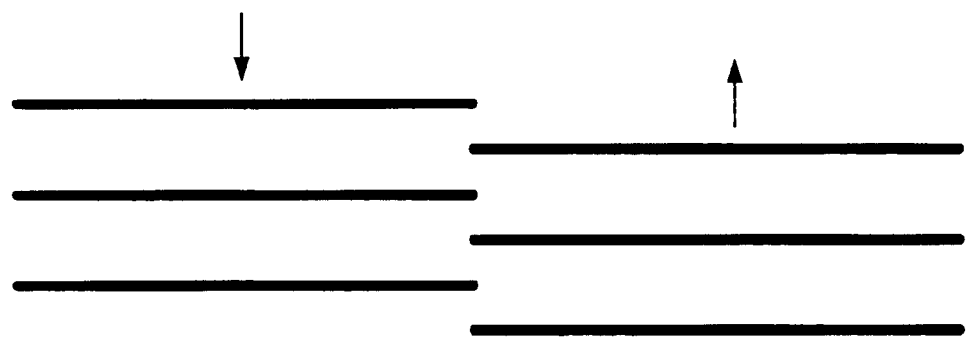
FIG. 23B illustrates the moiré fringes produced by the alignment target of FIG. 23A.

In operation, when the top periodic patterns 684a, 684b are properly aligned with the bottom periodic pattern 682, moiré fringe patterns are generated that are aligned. However, if there is an alignment offset between the top and bottom periodic patterns, the moiré fringe patterns will separate, as shown in FIG. 23B. For example, if the top periodic patterns 684a and 684b move to the left over bottom periodic pattern 682, as illustrated by the arrow in FIG. 23A, the moiré fringe patterns produced by the periodic patterns 684a and 682 will move down, while the moiré fringe patterns produced by the periodic patterns 684b and 682 will move up. When the moiré fringe patterns are aligned, the patterns are in proper alignment. Moreover, by measuring the separation between the moiré fringe patterns, the amount of the alignment error may be determined.

Figure 23C:
FIG. 23C illustrates the moiré fringes produced when there is a relative rotation between the top and bottom patterns in FIG. 23A.

In addition, alignment target 680 may be used to measure relative rotation of the top element with respect to the bottom element. As shown in FIG. 23C, if the top periodic patterns 684a and 684b rotated clockwise with respect to the bottom periodic pattern 682, the spacing between the moiré fringe bands on the left side, i.e., produced by periodic patterns 684a and 682 will decrease while the spacing between the bands on the right side, i.e., produced by periodic patterns 684b and 682, will increase. Alternatively, the size of the bands themselves may be seen increasing and decreasing on the left side and the right side respectively. Thus, by detecting the widths of the bands produced by the two locations and comparing the two locations, the amount of relative rotation may be determined.

In addition, it should be understood that two dimensional periodic patterns, referred to herein as bi-gratings, may be used with the present invention. FIG. 24 shows a top view of an alignment target 700 that is two bi-gratings 702, 704 that may be used in accordance with the present invention. Instead of a series of lines that extend in one direction, overlay pattern 700 includes a series of squares that extend in two directions. The solid squares in FIG. 24 are, e.g., the bottom diffraction bi-gratings, while the empty squares are the top diffraction bi-gratings. Overlay pattern 700, includes a designed in offset ±D1 in the X direction and a designed in offset ±D2 in the Y direction. The magnitude of offsets D1 and D2 may be the same or different. If desired, the bi-grating may be formed using other shapes besides squares, e.g., circles or polygons. If desired, bi-gratings may be used as the top periodic pattern, the bottom periodic pattern or both.

FIGS. 25A and 25B shows a top view of two exemplary arrangements of periodic patterns in an alignment target of the present invention. As can be seen in FIG. 25A, the periodic patterns for the X axis and the Y axis may all be linearly arranged. FIG. 25B shows the periodic patterns in a matrix arrangement. With the proper arrangements of circular apertures or slits, as described in reference to FIGS. 26A and 27A, all of the periodic patterns may be in FIGS. 25A and 25B may be simultaneously measured if desired.

In addition, it should be understood that the alignment target used in the present invention does not need to have a symmetrical designed in offset at the measurement locations. For example, the magnitude may vary and/or the direction of offset may be at an angle from one measurement location to the other.

Figure 28:
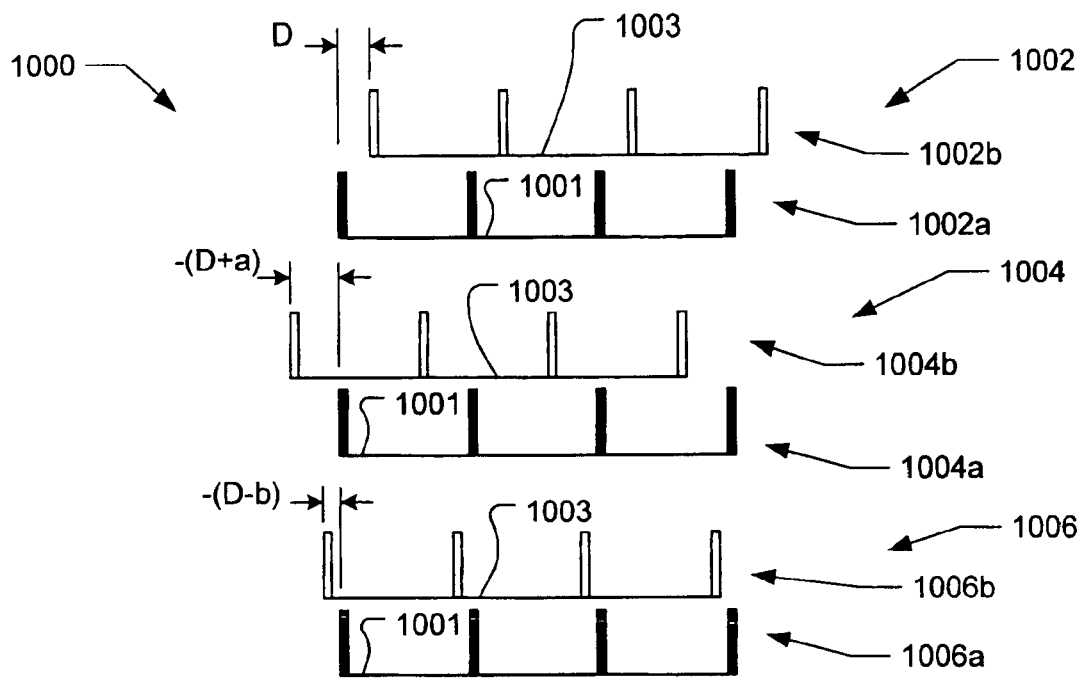
FIG. 28 shows another embodiment of an alignment target that has three measurement locations with designed in offsets of different magnitudes.

FIG. 28 shows another embodiment of an alignment target 1000 that has three measurement locations, referred to as overlay patterns 1002, 1004, and 1006. Each of the overlay patterns has a bottom periodic pattern on element 1001, e.g., diffraction gratings 1002*a*, 1004*a*, 1006*a* and a top periodic pattern on element 1003, e.g., diffraction gratings 1002*b*, 1004*b*, 1006*b*. Each of the measurement locations, e.g., overlay patterns 1002, 1004, 1006, on the alignment target 1000 have a designed in offset between the bottom periodic pattern and the top periodic pattern. However, as can be seen in FIG. 28, the designed in offsets at each location are not equal in magnitude. For example, overlay pattern 1002 has a designed in offset of +D, while overlay pattern 1004 has a designed in offset of −(D+a) and overlay pattern 1006 has a designed in offset of −(D−b), where a and b may or may not be the same. An alignment error in alignment target 1000 may then be determined by measuring each location, e.g., producing light that is incident on each location and detecting the light from each location after interacting with the location, and comparing the detecting light from each location. The alignment error e in alignment target 1000 may be calculated as follows:

$$e = (a+b) \cdot \frac{\left(R1 - \frac{(R2 \cdot b + R3 \cdot a)}{(a+b)}\right)}{(R2 - R3)} \qquad \text{eq. 11}$$

where R1, R2, and R3 are the reflectances from overlay patterns 1002, 1004, and 1006, respectively.

Figure 29A:
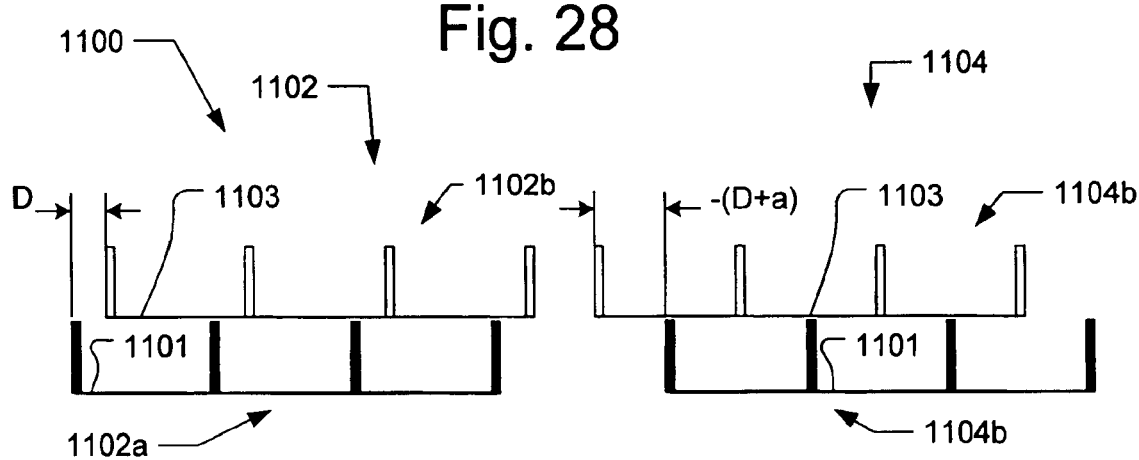
FIGS. 29A and 29B show another embodiment of an alignment target that has measurement locations with designed in offsets of different magnitudes.

FIG. 29A shows another embodiment of an alignment target 1100 that has measurement locations, referred to as overlay patterns 1102 and 1104. Again, each of the overlay patterns has a bottom periodic pattern on element 1101, e.g., diffraction gratings 1102*a* and 1104*a* and a top periodic pattern on element 1103, e.g., diffraction gratings 1102*b* and 1104*b*. Each of the measurement locations, i.e., overlay patterns 1102 and 1104, on the alignment target 1100 have a designed in offset between the bottom periodic pattern and the top periodic pattern. Overlay pattern 1102 has a designed in offset of +D while overlay pattern 1104 has a designed in offset of −(D+a), where a is a known amount. When the difference between the detected radiation, e.g., diffracted light, from the two overlay patterns 1102 and 1104, is at a minimum, the alignment error will be skewed by a/2. Thus, using a modeling technique, e.g., RCWA, or by adding reference locations, as described above, the alignment error may be determined and de-skewed by subtracting a/2. Alignment target 1100 is particularly useful in an alignment system, as once the difference between the detected radiation is minimized, the alignment system can simply move the two elements 1101 and 1103 a distance a/2 relative to each other to place the two elements in alignment. To determine the amount of the alignment error, a modeling process or a reference measurement location, as described above, may be used.

Figure 29B:
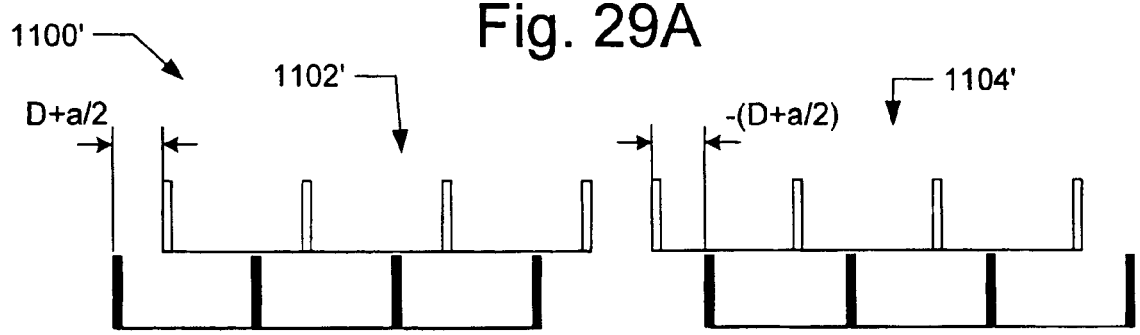

FIG. 29B shows alignment target 1100', which is equivalent to alignment target 1100 in FIG. 29A with a shift of a/2. Alignment target 1100' has symmetrical designed in offsets of +D+a/2 on overlay pattern 1102' and −(D+a/2) on overlay pattern 1104'. Thus, it can be seen that the asymmetric designed in offset is equivalent to the symmetric designed in offset. Consequently, any of the embodiments that may be used for symmetrical designed in offsets may also be used for asymmetrical designed in offsets, with an appropriate correction, e.g., a/2.

Thus, as can be seen, the magnitude of the designed in offset between the measurement locations on the alignment target need not be equal. In addition, if desired, the two measurement locations on the alignment target may include an arbitrary angle between the direction of the periodic patterns.

Figure 30A:
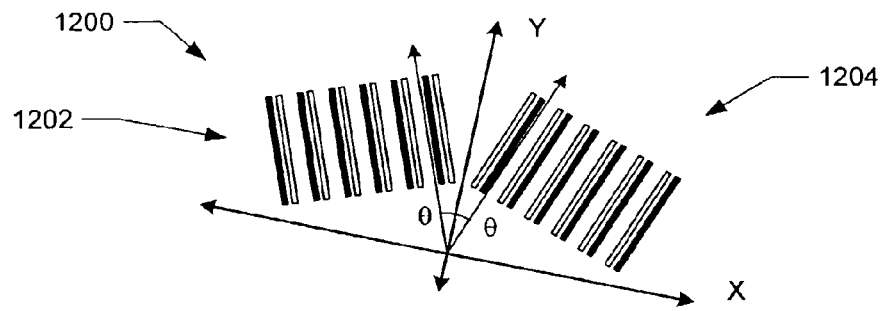
FIGS. 30A and 30B are top views showing an two alignment targets, which includes two measurement locations having designed in offsets in different directions.
Figure 30B:
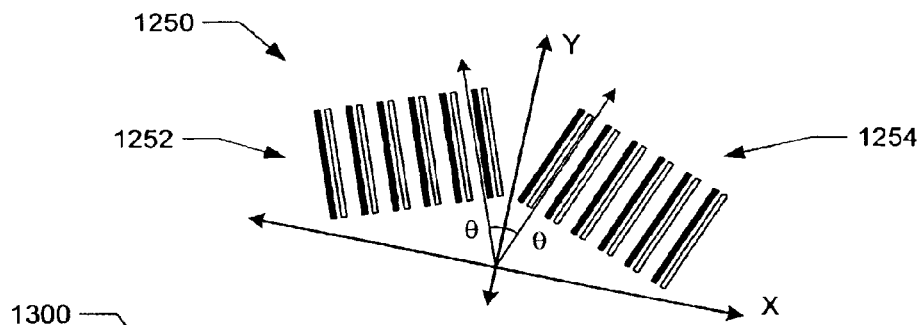

FIGS. 30A and 30B are top views showing alignment targets 1200 and 1250, which includes two measurement locations having designed in offsets. The two measurement locations are referred to as overlay patterns 1202, 1204 and 1252, 1254, where the bottom periodic patterns are shown as solid blocks and the top periodic patterns are shown as empty blocks. The X and Y axes are shown for reference in FIGS. 30A and 30B. As can be seen, the periodic patterns of overlay patterns 1202 and 1252 from an angle θ with the Y axis and periodic patterns of overlay patterns 1204 and 1254 form an angle −θ with the Y axis. Thus, overlay patterns 1202 and 1204 are arranged at an angle 2θ with respect to each other, as are overlay patterns 1252 and 1254. Consequently, the designed in offset at the two overlay patterns 1202 and 1204 in alignment target 1200 (and overlay patterns 1252 and 1254 in alignment target 1250) may have the same magnitude, e.g., D, but it is not in opposite directions. The direction of the designed in offsets in the overlay patterns are at an arbitrary angle with respect to each other. It should be understood that the angles used in alignment targets 1200 and 1250 may differ if desired.

Alignment target 1200 in FIG. 30A is sensitive to alignment error along the X axis but not the Y axis because of the arrangement of the bottom periodic patterns (shown as solid blocks) and the top periodic patterns (shown as empty blocks). In other words, if an alignment error occurs along the Y direction, both overlay patterns 1202 and 1204 will change in the same manner, and thus, alignment target 1200 is insensitive to the error. If however, an alignment error occurs along the X direction, the overlay patterns 1202 and 1204 will vary by different amounts. Thus, alignment target 1200 is sensitive to alignment errors in the X direction.

Alignment target 1250 in FIG. 30B, on the other hand, is sensitive to alignment error along the Y axis but not the X axis because of the arrangement of the bottom periodic patterns (shown as solid blocks) and the top periodic patterns (shown as empty blocks). As can be seen in FIG. 30B, if an alignment error occurs along the X direction, both overlay patterns 1252 and 1254 will change in the same manner, but if an alignment error occurs along the Y direction, the overlay patterns 1252 and 1254 will vary by different amounts. Thus, alignment target 1250 is sensitive to alignment errors in the Y direction and insensitive to alignment errors in the X direction.

Figure 31:
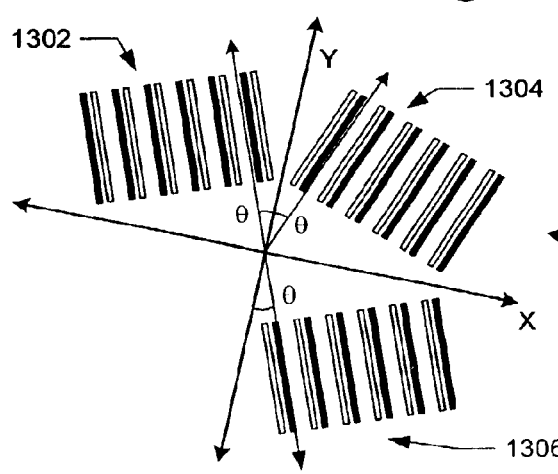
FIG. 31 is a top view showing an alignment target with three measurement locations, each at an angle with respect to one another.

FIG. 31 is a top view showing an alignment target 1300, which is similar to alignment targets 1200 and 1250 combined. Alignment target 1300 includes overlay patterns 1302, 1304, which are similar to overlay patterns 1202 and 1204. In addition, alignment target 1300 includes a third measurement location, referred to as overlay pattern 1306, where the bottom periodic patterns are shown as solid blocks and the top periodic patterns are shown as empty blocks. The periodic patterns of overlay pattern 1302 forms an angle θ with the Y axis and periodic patterns of overlay pattern 1204 forms an angle −θ with the Y axis. The periodic patterns of overlay pattern 1306 also forms an angle θ with the Y axis as shown in FIG. 31. As described above in reference to FIGS. 30A and 30B, overlay patterns 1302 and 1304 are sensitive to alignment error along the X axis, while overlay patterns 1304 and 1306 are sensitive to alignment error along the Y axis.

Figure 32:
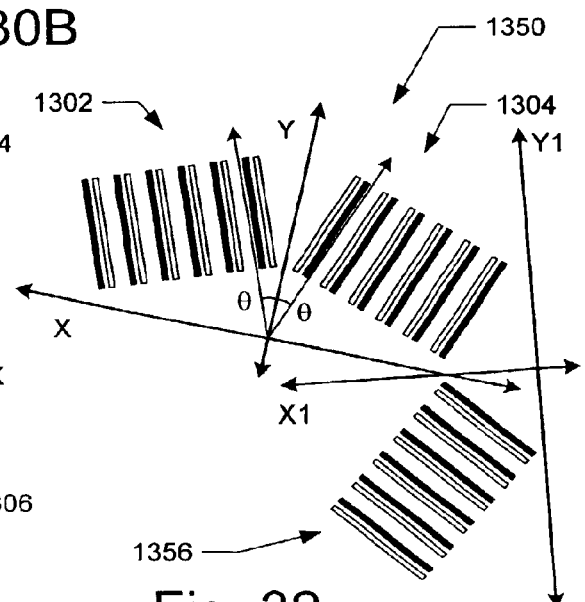
FIG. 32 shows an alignment target, similar to that shown in FIG. 31 but with a different coordinate systems.

FIG. 32 shows an alignment target 1350, similar to alignment target 1300, the designed elements being the same, except that overlay pattern 1304 and overlay pattern 1356 are sensitive in a direction along a different coordinate system. Thus, a coordinate system conversion must be performed to determine the alignment error in the Y direction.

Figure 33:
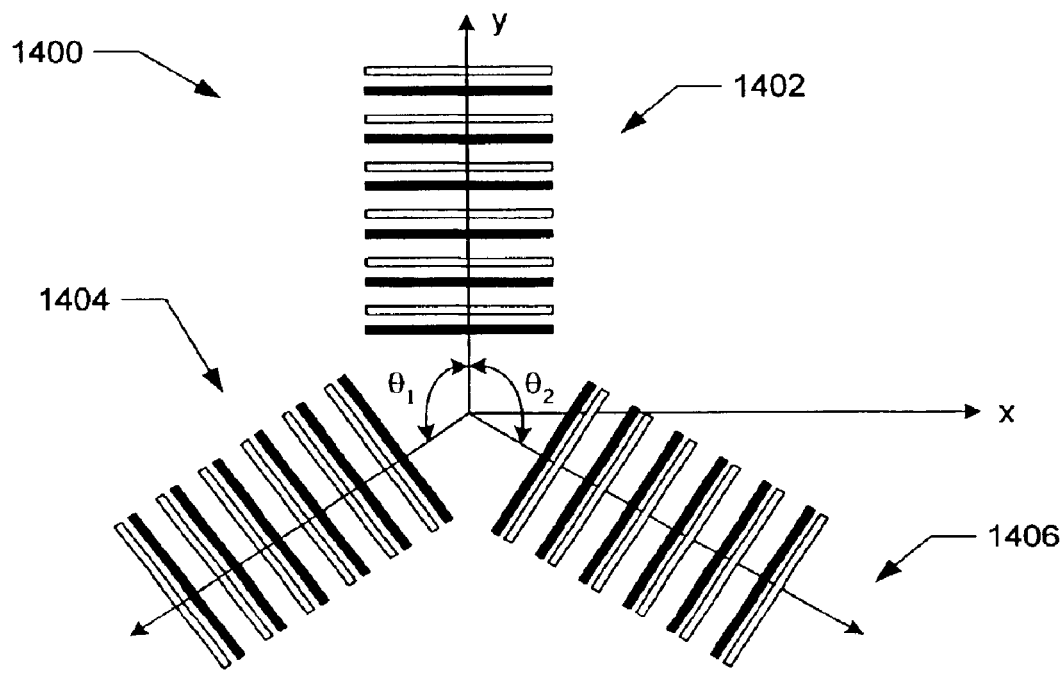
FIG. 33 is a top view showing an alignment target with three measurement locations, each at an angle with respect to one another.

FIG. 33 is a top view showing an alignment target 1400, which includes three measurement locations, referred to as overlay patterns 1402, 1404, and 1406, where the bottom periodic patterns are shown as solid blocks and the top periodic patterns are shown as empty blocks. As can be seen in FIG. 33, the overlay patterns 1402, 1404, and 1406 are at arbitrary angles with respect to one another. Moreover, the magnitude of the designed in offsets between the top periodic patterns and the bottom periodic patterns in the overlay patterns 1402, 1404, and 1406 may vary.

For example, designed in offsets of d1, d2, and d3 may be used for overlay patterns 1402, 1404, and 1406, respectively. Without losing generality, overlay pattern 1402 can be set along the y direction. Overlay pattern 1404 is separated from overlay pattern 1402 by an angle θ1, and overlay pattern 1406 is separated from overlay pattern 1404 by an angle θ2. Thus, with an alignment error of (x, y), the new offset for the three overlay patterns 1402, 1404, and 1406 are a1, a2, and a3, respectively. If normal incidence radiation of a careful arrangement of incidence angles, azimuthal angles, and polarization states is used, spectra from the three overlay patterns will become identical when a1=a2=a3. This occurs when the following conditions are satisfied:

$$x = \frac{(d1-d2)\cos(\theta 2) - (d1-d3)\cos(\theta 1) + (d2-d3)}{(\sin(\theta 1) - \sin(\theta 2)) - \sin(\theta 1 - \theta 2)} \quad \text{eq. 12}$$

$$y = \frac{(d1-d2)\sin(\theta 2) - (d1-d3)\sin(\theta 1)}{(\sin(\theta 1) - \sin(\theta 2)) - \sin(\theta 1 - \theta 2)}.$$

A special case is θ1=120°, θ2=−120°, and the conditions are reduced to:

$$x = \frac{d2-d3}{\sqrt{3}} \quad \text{eq. 13}$$

$$y = \frac{d2+d3-2d1}{3}.$$

Another special case is θ1=90°, θ2=−90°, and the conditions are reduced to:

$$x = \frac{d2-d3}{2} \quad \text{eq. 14}$$

$$y = \frac{d2+d3-2d1}{2}.$$

Thus, it can be seen that designed in offsets in the overlay patterns can have various magnitudes and angles with respect to each other.

Figure 34:
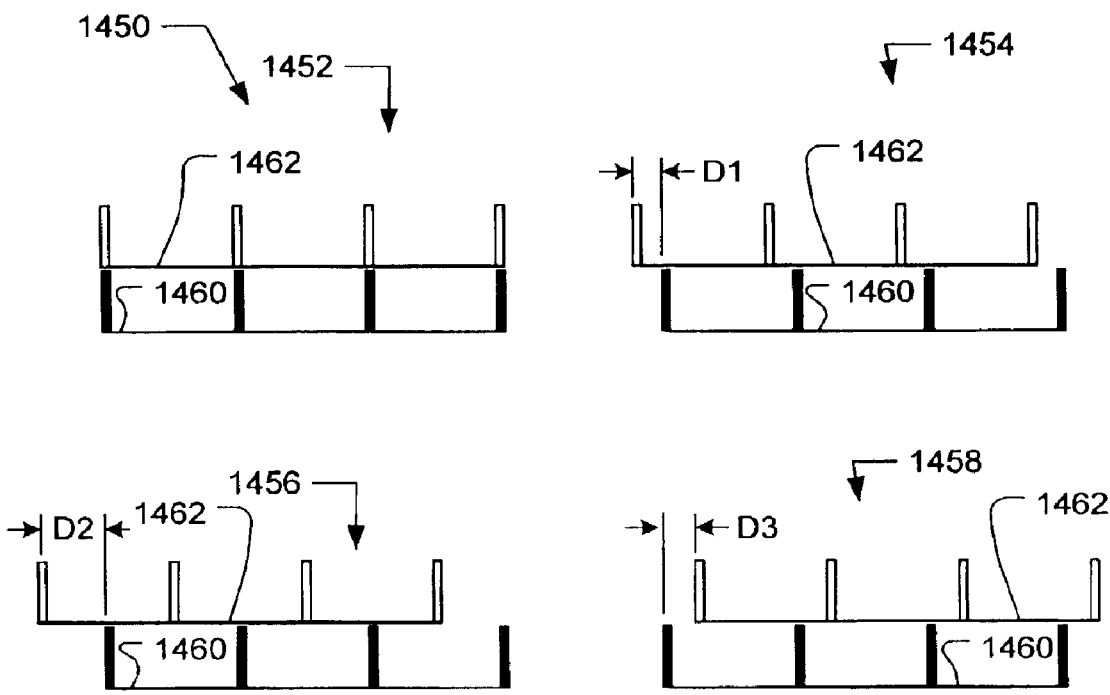
FIG. 34 shows another embodiment of an alignment target with four measurement locations, each with a different designed in offset.

FIG. 34 shows another embodiment of an alignment target 1450 with four measurement locations, referred to as overlay patterns 1452, 1454, 1456, and 1458, each of which has a periodic pattern on a first element 1460 and a periodic pattern on a second element 1462. The periodic patterns of overlay patterns 1452, 1454, 1456, and 1458 have designed in offsets of, e.g. zero, D1, D2, and D3, respectively. The alignment error between element 1460 and 1462 may be determined with alignment target 1450 solving for a polynomial.

$$R^{(0)}(\lambda)=R_0(\lambda)+b(\lambda)e+c(\lambda)e^2;$$
$$R^{(1)}(\lambda)=R_0(\lambda)+b(\lambda)(D1+e)+c(\lambda)(D1+e)^2;$$
$$R^{(2)}(\lambda)=R_0(\lambda)+b(\lambda)(D2+e)+c(\lambda)(D2+e)^2;$$
$$R^{(3)}(\lambda)=R_0(\lambda)+b(\lambda)(D3+e)+c(\lambda)(D3+e)^2 \quad \text{eq. 15}$$

where $R_0(\lambda)$, $b(\lambda)$ and $c(\lambda)$ are functions of wavelength λ and are constants for all the patterns, e is the alignment error, $R^{(0)}$, $R^{(1)}$, $R^{(2)}$, and $R^{(3)}$ are the spectra returned from each of the overlay pattern 1452, 1454, 1456, and 1458, respectively, for any given wavelength λ. There are four equations and four unknowns, e.g., $R_0(\lambda)$, $b(\lambda)$ and $c(\lambda)$ and alignment error e. Consequently, the polynomial equation may be solved to determine the alignment error e.

For example, the general non-linear least square fit (e.g., "Numerical recipes: The Art of Scientific Computing (FORTRAN Version)", William H. Press, Cambridge University Press 1989) can be applied to minimize the following merit function:

$$\chi^2(\lambda)=[R_0(\lambda)+b(\lambda)e+c(\lambda)c^2-R^{(0)}(\lambda)]^2+$$
$$[R_0(\lambda)+b(\lambda)(D1+e)+c(\lambda)(D1+e)^2-R^{(1)}(\lambda)]^2+$$
$$[R_0(\lambda)+b(\lambda)(D2+e)+c(\lambda)(D2+e)^2-R^{(2)}(\lambda)]^2+$$
$$[R_0(\lambda)+b(\lambda)(D3+e)+c(\lambda)(D3+e)^2-R^{(3)}(\lambda)]^2 \quad \text{eq. 16}$$

to extract alignment error e. The alignment error e from individual wavelengths may then be averaged to give the best results to reduce errors in the measurement.

Figure 37:
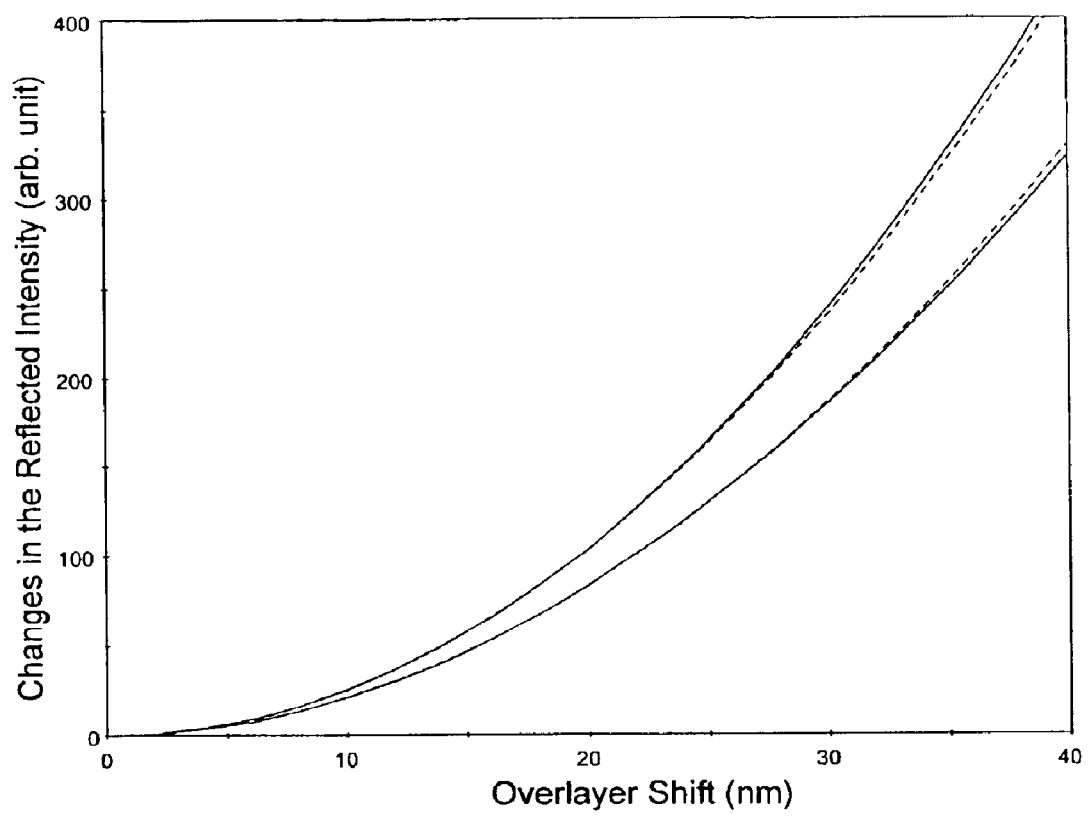
FIG. 37 shows the accuracy of the measurement using the alignment target of FIG. 34.

The change of R(λ) in equation 15 as a function of overlayer shift, including, e.g., the designed in offset and the alignment error, is shown in FIG. 37 for two selected wavelengths, 410 nm and 510 nm, as examples. The dashed lines are the fit using a second order polynomial. Thus, it can be seen that a second order polynomial is a very good approximation when the overlay shift is less than 30 nm for a 400 nm pitch pattern.

Equation 15 can be simplified by taking only the zero order and the first order terms in the polynomial:

$$R(\lambda)=R_0(\lambda)+b(\lambda)(\text{shift}) \quad \text{eq. 17}$$

where shift is the actual displacement between the top grating and the second grating layers, including, e.g., the designed in offset and the alignment error. When equation 17 is applied to patterns 202 (shift=D+e), 204 (shift=D−e), 206 (shift=D+d+e) in FIG. 14, equation 5 is obtained. When equation 17 is applied to patterns 252 (shift=D+c), 254 (shift=D−e), 256 (shift=D+d+e), and 258 (shift=D+d−e) in FIG. 15, equation 8 is obtained. When equation 17 is applied to 302 (shift=D+e), 304 (shift=D−e), 306 (shift=D+d+e), and 308 (shift=D−d+e) in FIG. 18, equation 9 can be derived.

In addition, equation 15 can also be simplified by taking only the zero order and the second order terms:

$$R(\lambda)=R_0(\lambda)+c(\lambda)(\text{shift})^2 \quad \text{eq. 18}$$

When equation 18 is applied to patterns 202 (shift=D+e), 204 (shift=D−e), 206 (shift=D+d+e) in FIG. 14, equation 5 changes to $$e = \frac{(R1-R2)(d^2+2Dd)}{4D(R3-R1)-2d(R1-R2)} \quad \text{eq. 19}$$

When equation 18 is applied to patterns 252 (shift=D+e), 254 (shift=D−e), 256 (shift=D+d+e), and 258 (shift=D+d−e) in FIG. 15, equation 8 remains the same because of the symmetry in the shift.

When equation 18 is applied to 302 (shift=D+e), 304 (shift=D−e), 306 (shift=D+d+e), and 308 (shift=D−d+e) in FIG. 18, equation 9 is changed to:

$$e = \frac{(R1-R2)d^2}{[(R3-R1)+(R4-R1)]2D} \qquad \text{eq. 20}$$

Thus, it can be seen that the use of the polynomial may be used to the determine alignment error e in an alignment target in accordance with the present invention.

Although the invention has been described with reference to particular embodiments, the description is only an example of the invention's application and should not be taken as a limitation. Various other adaptations and combinations of features of the embodiments disclosed are within the scope of the invention as defined by the following claims.

What is claimed is:

1. A method of determining the alignment of a first element with respect to a second element, said method comprising:

providing an alignment target on said first element and said second element, the alignment target having a first overlay pattern, a second overlay pattern, and a third overlay pattern, each overlay pattern including a periodic pattern on said first element and a periodic pattern on said second element, said first overlay pattern having a first designed in offset between the periodic pattern on said first and second elements, said first designed in offset having a first magnitude, said third overlay pattern having a third designed in offset between the periodic pattern of said first and second elements, said third designed in offset having a magnitude that is different than said first magnitude;

illuminating said first overlay pattern, said second overlay pattern, and said third overlay pattern on said alignment target with incident radiation that reacts with said alignment target;

detecting the radiation that is diffracted from said first overlay pattern, said second overlay pattern, and said third overlay pattern; and calculating the difference between the diffracted radiation from said first overlay pattern and the diffracted radiation from said second overlay pattern to produce a first measured difference;

calculating the difference between the diffracted radiation from said first overlay pattern and the diffracted radiation from said third overlay pattern to produce a second measured difference, and determining the approximate alignment error based on said first measured difference and said second measured difference.

2. The method of claim 1, wherein said periodic patterns are diffraction gratings.

3. The method of claim 1, wherein at least one of said periodic patterns has periodicities in two directions.

4. The method of claim 1, wherein said first element is first pattern produced on a first layer on a substrate and said second element is a second pattern produced on said first layer on said substrate.

5. The method of claim 1, wherein at least one of said periodic patterns on said first element and said second element of said first overlay pattern, said second overlay pattern, and said third overlay pattern are continuous periodic patterns.

6. The method of claim 1, wherein detecting the radiation comprises:

receiving light diffracted by said first overlay pattern, said second overlay pattern, and said third overlay pattern on two dimensional array detector that receives said diffracted light with the spectra dispersed along one dimension of said detector and the spectra associated with different locations on said alignment target separated along the direction perpendicular to the direction of the spectral dispersion.

7. The method of claim 1, wherein said second overlay pattern has a second designed in offset of a second magnitude.

8. The method of claim 7, wherein said first magnitude is the same as said second magnitude, wherein said first overlay pattern has a designed in offset in a first direction and said second overlay pattern has a designed in offset in a second direction opposite said first direction.

9. The method of claim 7, wherein said first magnitude and said second magnitude are different, wherein said first overlay pattern has a designed in offset in a first direction and said second overlay pattern has a designed in offset in a second direction that is non-parallel with said first direction.

10. The method of claim 7, wherein said first designed in offset having a first magnitude is in a first direction, said second designed in offset between the periodic pattern on said first and second elements is in a second direction opposite said first direction, and third designed in offset has a third magnitude in said first direction, said third magnitude being equal to said first magnitude plus a first reference offset.

11. The method of claim 10, wherein said alignment target includes a fourth overlay pattern including a periodic pattern on said first element and a periodic pattern on said second element, said fourth overlay pattern having a fourth designed in offset between the periodic pattern on said first and second elements, said fourth designed in offset having said third magnitude in said second direction.

12. The method of claim 10, wherein said alignment target includes a fourth overlay pattern including a periodic pattern on said first element and a periodic pattern on said second element, said fourth overlay pattern having a fourth designed in offset between the periodic pattern on said first and second elements, said fourth designed in offset having a fourth magnitude.

13. The method of claim 12, wherein said fourth magnitude is equal to said first magnitude minus a second reference offset and wherein:

detecting radiation comprises detecting light diffracted by said first overlay pattern, said second overlay pattern, said third overlay pattern, and said fourth overlay pattern; and said method further comprising:

calculating the difference between the diffracted light from said first overlay pattern and the diffracted light from said fourth overlay pattern to produce a third measured difference.

14. The method of claim 13, wherein the first reference offset is equal to the second reference offset, the method further comprising determining the approximate alignment error based on the ratio of said first measured difference and the sum of said second measured difference and said third measured difference.

15. The method of claim 12, wherein said fourth magnitude is equal to said second magnitude and a second reference offset in said second direction and wherein:

detecting radiation comprises detecting light diffracted by said first overlay pattern, said second overlay pattern, said third overlay pattern, and said fourth overlay pattern; and said method further comprising:
- calculating the difference between the diffracted light from said third overlay pattern and the diffracted light from said fourth overlay pattern to produce a third measured difference;
- calculating the difference between the diffracted light from said fourth overlay pattern and the diffracted light from said second overlay pattern to produce a fourth measured difference; and
- determining the approximate alignment error based on the first measured difference, the second measured difference, the third measured difference and the fourth measured difference.

16. The method of claim 15, wherein the first magnitude is equal to the second magnitude and said first reference offset is equal to said second reference offset and wherein determining the approximate alignment error is based on the ratio of the sum of said first measured difference summed with said third measured difference and the sum of said second measured difference with said fourth measured difference and multiplying said ratio by one half of said first reference offset.

17. The method of claim 1, wherein said radiation is light that is diffracted from said first overlay pattern, said second overlay pattern, and said third overlay pattern.

18. The method of claim 17, said method further comprising:
- modeling at least two of said first overlay pattern, said second overlay pattern, and said third overlay pattern of said alignment target including modeling the diffracted light;
- calculating the difference between the modeled diffracted light from said first overlay pattern and said second overlay pattern to produce a modeled difference;
- comparing said first measured difference with said modeled difference to determine if said measured difference and said modeled difference have an acceptable fit.

19. The method of claim 18, said method further comprising:
- remodeling at least two said first overlay pattern, said second overlay pattern, and said third overlay pattern of said alignment target with a different alignment offset including remodeling diffracted light;
- calculating the difference between the remodeled diffracted light from said at least two of said first overlay pattern, said second overlay pattern, and said third overlay pattern to produce a remodeled difference;
- comparing said measured difference with said remodeled difference, to determine if said measured difference and said remodeled difference have an acceptable fit; and
- repeating the acts of remodeling, calculating the remodeled difference, and comparing until an acceptable fit is found.

20. The method of claim 18, wherein at least one of the model of the locations and the modeled difference is stored in a library.

21. A method of determining the alignment of a first element with respect to a second element, said method comprising:
- providing an alignment target on said first element and said second element, the alignment target having at least one periodic pattern on said first element and at least one periodic pattern on said second element, said alignment target having at least two locations at least one of which having a designed in offset between said at least one periodic pattern on said first element and said at least one periodic pattern on said second element;
- illuminating said at least two locations on said alignment target with incident radiation that reacts with said alignment target, wherein said radiation is light that is diffracted diffracted from said at least two locations;
- detecting the radiation from said at least two locations after reacting with said alignment target; and
- calculating the difference between the light diffracted from one location and the light diffracted from a second location;
- modeling said two locations of said alignment target including modeling the light diffracted from said two locations;
- comparing said modeled light from said two locations with the measured light from said two locations;
- determining if said modeled light is an acceptable fit for said measured light for each location;
- remodeling either location until said modeled light is an acceptable fit for said measured light for each location; and
- averaging the modeled offset for the periodic patterns on said first element and said second element for each of said modeled location to determine the alignment of said first element with respect to said second element.

22. A method of determining the alignment of a first element with respect to a second element, said method comprising:
- providing an alignment target on said first element and said second element, the alignment target having a first overlay pattern, a second overlay pattern, and a third overlay pattern, each overlay pattern including a periodic pattern on said first element and a periodic pattern on said second element, said first overlay pattern having a first designed in offset between the periodic pattern on said first and second elements, said first designed in offset having a first magnitude, said third overlay pattern having a third designed in offset between the periodic pattern of said first and second elements, said third designed in offset having a magnitude that is different than said first magnitude;
- illuminating said first overlay pattern, said second overlay pattern, and said third overlay pattern on said alignment target with incident radiation that reacts with said alignment target;
- detecting the radiation that is different from said first overlay pattern, said second overlay pattern, and said third overlay pattern; and
- calculating the difference between the diffracted radiation from said first overlay pattern and the diffracted radiation from said second overlay pattern to produce a first measured difference;
- calculating the difference between the diffracted radiation from said first overlay pattern and the diffracted radiation from said third overlay pattern to produce a second measured difference; and
- determining the approximate alignment error based on said first measured difference and said second measured difference, wherein determining the approximate alignment error is based on the ratio of said first measured difference and said second measured difference.

23. The method of claim 22, wherein determining the approximate alignment error comprises calculating the product of said ratio and one half of said first magnitude to determine the approximate alignment error.

24. A method of determining the alignment of a first element with respect to a second element, said method comprising:

illuminating at least three locations of an alignment target on said first element and said second element, wherein said at least three locations are a first overlay pattern and a second overlay pattern and a third overlay pattern, each overlay pattern including a periodic pattern on said first element and a periodic pattern on said second embodiment that have the same pitch, at least two of said at least three locations of said alignment target having a designed in offset between the periodic pattern on said first element and said periodic pattern on said second element;

detecting light diffracted from said at least three locations;

comparing the detected light diffracted from said at least three locations by calculating the difference between the light diffracted from a first location and the light diffracted from a second location to produce a first measured difference and calculating the difference between the light diffracted from said first location and the light from a third location to produce a second measured difference; and using said first measured difference with said second measured difference to determine the approximate alignment error between said first element and said second element.

25. The method of claim 24, wherein said periodic patterns are diffraction gratings.

26. The method of claim 24, wherein at least one of said periodic patterns has periodicities in two directions.

27. The method of claim 24, wherein detecting light diffracted from said at least three locations comprises:

receiving light diffracted by said at least three locations on a two dimensional array detector that receives said diffracted light with the spectra dispersed along one dimension of said detector and the spectra associated with different locations on said alignment target separated along the direction perpendicular to the direction of the spectral dispersion.

28. The method of claim 24, wherein a first of said at least three locations has a designed in offset of a first magnitude and a second of said at least three locations has a designed in offset of a second magnitude and a third of said at least three locations has a designed in offset of a third magnitude.

29. The method of claim 28, wherein said first magnitude is the same as said second magnitude, wherein said first of said at least locations has a designed in offset in a first direction and said second of said at least three locations has a designed in offset in a second direction opposite said first direction.

30. The method of claim 28, wherein said first magnitude and said second magnitude are different, wherein said first of said at least three locations has a designed in offset in a first direction and second of said at least three locations has a designed in offset in a second direction that is non-parallel with said first direction.

31. The method of claim 24, wherein said first overlay pattern having a first designed in offset between the periodic pattern on said first and second elements, said first designed in offset having a first magnitude in a first direction, said second overlay pattern having a second designed in offset between the periodic pattern on said first and second elements, said third overlay pattern having a third designed in offset between the periodic pattern on said first and second elements, said third designed in offset having a second magnitude in said first direction, said second magnitude being equal to said first magnitude plus a reference offset.

32. The method of claim 31, wherein said second designed in offset is of said first magnitude in a second direction opposite said first direction and wherein determining the approximate alignment error comprises calculating the ratio of said first measured difference and said second measured difference and calculating the product of said ratio and one half of said first magnitude.

33. The method of claim 31, wherein said alignment target includes a fourth overlay pattern including a periodic pattern on said first element and a periodic pattern on said second element, said fourth overlay pattern having a fourth designed in offset between the periodic pattern on said first and second elements, said fourth designed in offset having a third magnitude in said first direction, said third magnitude being equal to said first magnitude minus said reference offset.

34. The method of claim 33, wherein said second designed in offset is of said first magnitude in a second direction opposite said first direction and wherein detecting light diffracted from said at least three locations further comprises detecting light diffracted by said fourth overlay pattern, said method further comprising:

calculating the difference between the diffracted light from said first overlay pattern and the diffracted light from said fourth overlay pattern to produce a third measured difference; and determining the approximate alignment error based on the ratio of said first measured difference and the sum of said second measured difference and said third measured difference multiplied by said first magnitude.

35. The method of claim 31, wherein said alignment target includes a fourth overlay pattern including a periodic pattern on said first element and a periodic pattern on said second element, said fourth overlay pattern having a fourth designed in offset between the periodic pattern on said first and second elements, said fourth designed in offset having said second magnitude in said second direction.

36. The method of claim 35, wherein said second designed in offset is of said first magnitude in a second direction opposite said first direction and wherein detecting light diffracted from said at least three locations further comprises detecting light diffracted by said fourth overlay pattern, said method further comprising:

calculating the difference between the diffracted light from said third overlay pattern and the diffracted light from said fourth overlay pattern to produce a third measured difference;

calculating the difference between the diffracted light from said fourth overlay pattern and the diffracted light from said second overlay pattern to produce a fourth measured difference; and determining the approximate alignment error based on the ratio of the sum of said first measured difference summed with said third measured difference and the sum of said second measured difference with said fourth measured difference multiplied, and multiplying said ratio by one half of said reference offset.

37. A apparatus for determining the alignment of a first element with a second element by way of an alignment target having at least one periodic pattern on said first element and at least one periodic pattern on said second element, said alignment target including at least three locations at least two of which having a designed in offset between said at least one periodic pattern on said first element and said at least one periodic pattern on said second element such that when said first element and said second element are aligned there is an offset of different magnitudes between said at least one periodic pattern on said first element and said at least one periodic pattern on said second element at the two locations having a designed in offset, said apparatus comprising:

a radiation source for producing radiation to be incident on said at least three locations of said alignment target;

a detector for detecting radiation after it interacts with said at least three locations of said alignment target; and a computer and a computer-usable medium having computer-readable program code embodied therein for causing said computer to calculate the difference between the detected radiation from said at least three locations by:

calculating the difference between the detected radiation from a first location and detected radiation from a second location to produce a first measured difference;

calculating the difference between the detected radiation from said first location and the detected radiation from a third location to produce a second measured difference; and using said first measured difference and said second measured difference to determine if the first element and the second element are aligned.

38. The apparatus of claim 37, wherein said first element is a first layer on a substrate and said second element is a second layer on said substrate.

39. The apparatus of claim 37, wherein said first element is a first pattern produced on a first layer on a substrate and said second element is a second pattern produced on said first layer on said substrate.

40. The apparatus of claim 37, wherein each location includes a diffraction grating on said first element and a diffraction grating on said second element, the diffraction gratings of said at least three locations being oriented in the same direction.

41. The apparatus of claim 40, wherein said computer-readable program code embodied in said computer-usable medium causes said computer to perform the steps of comparing the calculated difference with a library of differences of detected radiation to determine alignment error.

42. The apparatus of claim 37, wherein said first location and said second location have a designed in offset of a first magnitude in opposite directions, said at least one periodic pattern at said third location having a designed in offset of a second magnitude in the same direction as said first location, said second magnitude being equal to said first magnitude plus a reference offset.

43. The apparatus of claim 42, wherein said computer-readable program code embodied in said computer-usable medium causes said computer to:

determining the approximate alignment error based on the ratio of said first measured difference and said second measured difference multiplied by one half of the reference offset.

44. The apparatus of claim 42, wherein said at least one periodic pattern at said first, said second, and said third locations are diffraction gratings, wherein said alignment target includes a fourth location including a diffraction grating on said first element and a diffraction grating on said second element, the diffraction gratings being oriented in the same direction as the diffraction gratings of said first, second, and third locations, said fourth location having a designed in offset of a third magnitude in the same direction as said first location, said third magnitude being equal to said first magnitude minus said reference offset.

45. The apparatus of claim 44, wherein said computer-readable program code embodied in said computer-usable medium causes said computer to:

calculating the difference between the detected radiation from said first location and the detected radiation from said fourth location to produce a third measured difference; and determining the approximate alignment error based on the ratio of said first measured difference and the sum of said second measured difference on said third measured difference multiplied by said reference offset.

46. The apparatus of claim 42, wherein said at least one periodic pattern at said first, said second, and said third locations are diffraction gratings, wherein said alignment target includes a fourth location including a diffraction grating on said first element and a diffraction grating on said second element, the diffraction gratings being oriented in the same direction as the diffraction gratings of said first, second, and third locations, said fourth having a designed in offset of said second magnitude in the same direction as said second location.

47. The apparatus of claim 46, wherein said computer-readable program code embodied in said computer-usable causes said computer to:

calculating the difference between the detected radiation from said third location and the detected radiation from said fourth location to produce a third measured difference;

calculating the difference between the detected radiation from said fourth location and the detected radiation from said second location to produce a fourth measured difference; and determining the approximate alignment error based on the ratio of the sum of said first measured difference summed with said third measured difference and the sum of said second measured difference with said fourth measured difference multiplied, and multiplying said ratio by one half of said reference offset.

48. An apparatus for determining the alignment of a first element with a second element by way of an alignment target having at least one periodic pattern on said first element and at least one periodic pattern on said second element, said alignment target including at least three locations at least two of which having a designed in offset between said at least one periodic pattern on said first element and said at least one periodic pattern on said second element such that when said first element and said second element are aligned there is an offset of different magnitudes between said at least one periodic pattern on said first element and said at least one periodic pattern on said second element at the two locations having a designed in offset, said apparatus comprising a radiation source for producing radiation to be incident on said at least three locations of said alignment target, wherein said radiation source produces light that is simultaneously incident on said at least three locations of said alignment target;

an imaging spectrometer grating that receives diffracted light from said at three locations and focuses said diffraction light;

a detector for detecting said focused diffracted light from said imaging spectrometer, wherein said light detector is a two dimensional array detector that receives said diffracted light with the spectra dispersed along one dimension of said detector and the spectra associated with different locations of said alignment target separated along the direction perpendicular to the direction of the spectral dispersion; and a computer and a computer-usable medium having computer-readable program code embodied therein for causing said computer to calculate the difference between the detected radiation from said at least three locations by:
- calculating the difference between the detected radiation from a first location and detected radiation from a second location to produce a first measured difference;
- calculating the difference between the detected radiation from said first location and the detected radiation from a third location to produce a second measured difference; and
- using said first measured difference and said second measured difference to determine if the first element and the second element are aligned.

49. A method of determining the alignment of a first element with respect to a second element, said method comprising:

providing an alignment target on said first element and said second element, said alignment target having at least four locations, wherein said at least four locations are a first overlay pattern, a second overlay pattern, a third overlay pattern, and a fourth overlay pattern, each overlay pattern including a periodic pattern on said first element and a periodic pattern on said second element that have the same pitch and a plurality of which have a designed in offset between the periodic pattern on said first element and said periodic pattern on said second element;

illuminating said at least four locations on said alignment target with incident radiation that reacts with said alignment target;

detecting the radiation from said at least four locations after reacting with said alignment target; and solving a polynomial equation using the detected radiation to determine the alignment of said first element with respect to said second element.

* * * * *